(12) United States Patent  (10) Patent No.: US 8,278,187 B2
Hanaoka  (45) Date of Patent: Oct. 2, 2012

(54) METHOD FOR REPROCESSING SEMICONDUCTOR SUBSTRATE BY STEPWISE ETCHING WITH AT LEAST TWO ETCHING TREATMENTS

(75) Inventor: Kazuya Hanaoka, Fujisawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 176 days.

(21) Appl. No.: 12/797,650

(22) Filed: Jun. 10, 2010

(65) Prior Publication Data
US 2010/0330777 A1 Dec. 30, 2010

(30) Foreign Application Priority Data
Jun. 24, 2009 (JP) .................................. 2009-149409
Aug. 18, 2009 (JP) .................................. 2009-189103

(51) Int. Cl.
*H01L 21/30* (2006.01)
*H01L 21/302* (2006.01)

(52) U.S. Cl. ........ 438/455; 438/406; 438/473; 438/704; 438/749; 438/977; 257/E21.122; 257/E21.319; 257/E21.568

(58) Field of Classification Search .................. 438/406, 438/455, 457–459, 473–476, 704, 749, 753, 438/756–757, 977; 257/E21.122, E21.319, 257/E21.568
See application file for complete search history.

(56) References Cited

U.S. PATENT DOCUMENTS 4,517,106 A * 5/1985 Hopkins et al. .............. 252/79.4
4,731,516 A 3/1988 Noguchi et al.
5,969,398 A 10/1999 Murakami
6,010,579 A 1/2000 Henley et al.
6,110,845 A 8/2000 Seguchi et al.
6,245,645 B1 6/2001 Mitani et al.
6,335,231 B1 1/2002 Yamazaki et al.
(Continued)

FOREIGN PATENT DOCUMENTS
JP 2000-223682 8/2000
(Continued)

OTHER PUBLICATIONS

Kriegler et al., "The Effect of HCl and $Cl_2$ on the Thermal Oxidation of Silicon," J. Electorchem. Soc.: Solid-State Science and Technology, Mar. 1972, 119 (3), pp. 388-392.
(Continued)

*Primary Examiner* — Thanh V Pham
(74) *Attorney, Agent, or Firm* — Eric J. Robinson; Robinson Intellectual Property Law Office, P.C.

(57) ABSTRACT

Disclosed is a method for reprocessing a semiconductor substrate which is by-produced in manufacturing a silicon-on-insulator substrate. The method includes: forming an embrittlement layer in a single crystal semiconductor substrate; bonding the single crystal semiconductor substrate with a base substrate having an insulating surface; and separating the single crystal semiconductor substrate along the embrittlement layer to give a silicon-on-insulator substrate and a semiconductor substrate to be reprocessed. The above steps provide, in the peripheral portion on the semiconductor substrate, a projection comprising the embrittlement layer and a single crystal semiconductor layer over the embrittlement layer. The method is characterized by an etching step to selectively remove the projection without etching a portion where the projection is absent, which allows the semiconductor substrate to be reused for the production of another silicon-on-insulator substrate.

14 Claims, 50 Drawing Sheets

U.S. PATENT DOCUMENTS

| | | |
|---|---|---|
| 6,380,046 B1 | 4/2002 | Yamazaki |
| 6,426,270 B1 | 7/2002 | Sakaguchi et al. |
| 6,521,492 B2 | 2/2003 | Miyasaka et al. |
| 6,548,382 B1 | 4/2003 | Henley et al. |
| 6,596,610 B1 | 7/2003 | Kuwabara et al. |
| 6,716,722 B1 * | 4/2004 | Furihata et al. ............... 438/459 |
| 6,875,633 B2 | 4/2005 | Fukunaga |
| 6,927,148 B2 | 8/2005 | Ito |
| 7,064,049 B2 | 6/2006 | Ito et al. |
| 7,119,365 B2 | 10/2006 | Takafuji et al. |
| 7,442,623 B2 | 10/2008 | Endo et al. |
| 2001/0046746 A1 | 11/2001 | Yokokawa et al. |
| 2002/0157790 A1 | 10/2002 | Abe et al. |
| 2005/0070073 A1 | 3/2005 | Al-Bayati et al. |
| 2005/0079712 A1 | 4/2005 | Tong et al. |
| 2006/0099776 A1 | 5/2006 | Dupont |
| 2006/0099791 A1 | 5/2006 | Mitani et al. |
| 2006/0148208 A1 | 7/2006 | Popov et al. |
| 2006/0177993 A1 | 8/2006 | Endo et al. |
| 2007/0141803 A1 | 6/2007 | Boussagol et al. |
| 2007/0148912 A1 | 6/2007 | Morita et al. |
| 2007/0148914 A1 | 6/2007 | Morita et al. |
| 2007/0281172 A1 | 12/2007 | Couillard et al. |
| 2007/0281399 A1 | 12/2007 | Cites et al. |
| 2008/0153272 A1 | 6/2008 | Akiyama et al. |
| 2008/0233725 A1 | 9/2008 | Forbes |
| 2008/0280420 A1 | 11/2008 | Yamazaki |
| 2009/0081848 A1 | 3/2009 | Erokhin et al. |
| 2009/0093102 A1 | 4/2009 | Moriwaka |
| 2009/0098704 A1 | 4/2009 | Ohnuma et al. |
| 2009/0280621 A1 * | 11/2009 | Endo et al. .................... 438/458 |
| 2010/0022070 A1 | 1/2010 | Imahayashi |

FOREIGN PATENT DOCUMENTS

| | | |
|---|---|---|
| JP | 2001-155978 | 6/2001 |
| JP | 2004-087606 | 3/2004 |
| JP | 3932369 | 6/2007 |

OTHER PUBLICATIONS

Vossen et al., "Thin film processes II," Academic Press, pp. 317-323, 1991.

Lu et al., "Ion-cut silicon-on-insulator fabrication with plasma immersion ion implantation," Appl. Phys. Lett., Nov. 10, 1997, 71 (19), pp. 2767-2769,

* cited by examiner (A1)

(A2)

(B1)

(B2)

(C1)

(C2)

width of semiconductor substrate (mm)

width of semiconductor substrate (mm)

width of semiconductor substrate (mm)

width of semiconductor substrate (mm)

(A1)   (A2)

(B1)   (B2)

(C1)   (C2)

(A1)  (A2)

(B1)  (B2)

(C1)  (C2)

(A1)  (A2)

(B1)  (B2)

(C1)  (C2)

(A1)  (A2)

(B1)  (B2)

(C1)  (C2)

(A1)

(A2)

(B1)

(B2)

(C1)

(C2)

(A1)              (A2)

(B1)              (B2)

(C1)              (C2)

(A1)  (A2)

(B1)  (B2)

(C1)  (C2)

(A1)

(A2)

(B1)

(B2)

(C1)

(C2)

(A1)

(A2)

(B1)

(B2)

(C1)

(C2)

(A1)

(A2)

(B1)

(B2)

(C1)

(C2)

METHOD FOR REPROCESSING SEMICONDUCTOR SUBSTRATE BY STEPWISE ETCHING WITH AT LEAST TWO ETCHING TREATMENTS

BACKGROUND OF THE INVENTION

1. Field of the Invention

The present invention relates to a method for reprocessing a semiconductor substrate by-produced in manufacture of an SOI (silicon on insulator) substrate, and a method for manufacturing an SOI substrate.

2. Description of the Related Art

In recent years, integrated circuits using an SOI (silicon on insulator) substrate that includes a thin single crystal semiconductor layer formed on an insulating surface have been developed instead of those using a bulk silicon wafer. The characteristics of the thin single crystal silicon film formed on the insulating surface make it possible to completely separate transistors in the integrated circuit from each other. In addition, fully-depleted transistors can be obtained, thereby realizing a semiconductor integrated circuit with high added value such as high integration, high-speed driving, and low power consumption.

One of the known methods for manufacturing an SOI substrate is Smart Cut (registered trademark). The use of Smart Cut allows an SOI substrate having a single crystal silicon film to be manufactured not only on a silicon substrate but also on an insulating substrate such as a glass substrate (for example, see Patent Document 1). An SOI substrate having a single crystal silicon thin film formed on a glass substrate using Smart Cut is generally manufactured as follows. First, a silicon dioxide film is formed on a surface of a single crystal silicon wafer. Next, hydrogen ions are implanted into the single crystal silicon wafer to form a hydrogen ion-implanted layer at a predetermined depth in the single crystal silicon wafer. Then, the single crystal silicon wafer into which the hydrogen ions are implanted is bonded to a glass substrate with the silicon dioxide film interposed therebetween. After that, a heat treatment is performed, whereby a thin film of the single crystal silicon wafer into which the hydrogen ions are implanted is separated with the hydrogen ion-implanted layer serving as a cleavage plane. Thus, a single crystal silicon thin film can be formed on the bonded glass substrate. Smart Cut is also referred to as a hydrogen ion implantation separation method.

REFERENCE

[Patent Document]
[Patent Document 1] Japanese Published Patent Application No. 2004-87606

SUMMARY OF THE INVENTION

When an SOI substrate is manufactured by Smart Cut, a semiconductor substrate (a bond substrate) is boned to a base substrate and then the semiconductor substrate is separated, whereby a thin semiconductor film is formed on the base substrate. Most part of the semiconductor substrate which is bonded is separated from the base substrate. However, by performing a reprocessing treatment on the semiconductor substrate separated from the base substrate (a semiconductor substrate after separation), the semiconductor substrate after separation can be reused as a semiconductor substrate used for manufacturing an SOI substrate. By repeating the above steps, a plurality of semiconductor films for SOI substrates can be formed using one semiconductor substrate, resulting in cost reduction and high production efficiency of the SOI substrate.

When a semiconductor substrate such as a commercially available single crystal silicon wafer is polished, a portion called edge roll off (ERO), which has a thickness smaller than that of the center portion of the substrate, occurs in the peripheral portion of the substrate. This makes it difficult to bond the peripheral portion of the semiconductor substrate to a base substrate.

Thus, a semiconductor layer and an insulating film that should be bonded to the base substrate remain as a projection in the peripheral portion of the semiconductor substrate after separation.

The projection in the peripheral portion of the semiconductor substrate can be removed by chemical mechanical polishing (CMP) so that the semiconductor substrate is planarized. However, since the CMP is a method of mechanically polishing the surface of the substrate, complete removal of the projection in the peripheral portion of the semiconductor substrate after separation causes a problem of an increase in the thickness of a polished portion of the semiconductor substrate. That is, the thickness of a removed portion of the semiconductor substrate is increased in a reprocessing treatment process, which limits the number of times of reusing the semiconductor substrate, and thus leads to an increase in manufacturing cost of the SOI substrate.

In view of the above problems, an object of one embodiment of the present invention is to provide a method for reprocessing a semiconductor substrate from which a semiconductor film has been separated, by which a reprocessed semiconductor substrate capable of being used for manufacturing an SOI substrate is obtained with a smaller thickness of a removed portion of the semiconductor substrate after separation and the number of times of reusing the semiconductor substrate is increased.

In the method for reprocessing a semiconductor substrate of one embodiment of the present invention, an insulating film remaining in the peripheral portion of a semiconductor substrate after separation is removed by a first etching treatment, and an embrittlement layer and a semiconductor layer remaining in the peripheral portion of the semiconductor substrate after separation are selectively removed by a second etching treatment using as an etchant a mixed solution containing a substance functioning as an oxidizer for oxidizing a semiconductor of the semiconductor substrate, a substance dissolving an oxide of the semiconductor, and a substance functioning as a decelerator of the oxidization of the semiconductor and the dissolution of the oxide of the semiconductor.

One embodiment of the invention disclosed in this specification is a method for reprocessing a semiconductor substrate after separation that is by-produced when a base substrate is bonded to a semiconductor substrate which is irradiated with plural kinds of hydrogen ions and a semiconductor film separated from the semiconductor substrate is formed on the base substrate. An embrittlement layer, a semiconductor layer, and an insulating film remain in the peripheral portion of the semiconductor substrate after separation. The remaining insulating film is removed by a first etching treatment. The remaining embrittlement layer and semiconductor layer are removed by a second etching treatment using as an etchant a mixed solution containing a substance functioning as an oxidizer for oxidizing a semiconductor substrate, a substance dissolving an oxide of the semiconductor, and a substance functioning as a decelerator of the oxidization of the semiconductor and the dissolution of the oxide of the semiconductor.

Another embodiment of the invention disclosed in this specification is a method for reprocessing a semiconductor substrate after separation that is by-produced when a base substrate is bonded to a semiconductor substrate which is irradiated with plural kinds of hydrogen ions and a semiconductor film separated from the semiconductor substrate is formed on the base substrate. An embrittlement layer, a semiconductor layer, and an insulating film remain in the peripheral portion of the semiconductor substrate after separation. The remaining insulating film is removed by a first etching treatment. The remaining embrittlement layer and semiconductor layer are removed by a second etching treatment in which a mixed solution containing a substance functioning as an oxidizer for oxidizing a semiconductor of the semiconductor substrate, a substance dissolving an oxide of the semiconductor, and a substance functioning as a decelerator of the oxidization of the semiconductor and the dissolution of the oxide of the semiconductor is penetrated into the embrittlement layer and the semiconductor layer.

In the above structure, the semiconductor substrate may be further subjected to a planarization treatment after the second etching treatment. The planarization treatment can be performed by a polishing treatment or a laser irradiation treatment. The polishing treatment and the laser irradiation treatment may be performed in combination, and there is no limitation on the order of the treatment steps.

For example, the etchant used in the second etching treatment can be a mixed solution which contains: nitric acid as the substance functioning as an oxidizer for oxidizing the semiconductor; hydrofluoric acid as the substance dissolving an oxide of the semiconductor; and acetic acid as the substance functioning as a decelerator of the oxidization of the semiconductor and the dissolution of the oxide of the semiconductor. In that case, it is preferable that the mixed solution has a composition which is obtained by adjusting the volume of 50 wt % hydrofluoric acid to more than 0.01 times and less than 0.3 times as large as that of 97.7 wt % acetic acid and further adjusting the volume of 70 wt % nitric acid to more than 0.01 times and less than one time as large as that of 97.7 wt % acetic acid and to more than 0.1 times and less than 100 times as large as that of 50 wt % hydrofluoric acid.

In addition, in the above structure, the plural kinds of hydrogen ions preferably contain $H_3^+$ ions.

Another embodiment of the invention disclosed in this specification is a method for manufacturing an SOI substrate in which an insulating film is formed over a semiconductor substrate, an embrittlement layer is formed by irradiation with a plural kinds of hydrogen ions containing at least an $H_3^+$ ion from a surface of the semiconductor substrate, the semiconductor substrate is bonded to a base substrate with the insulating film interposed therebetween, and the semiconductor substrate is divided along the embrittlement layer into a semiconductor film formed on the base substrate with the insulating film interposed therebetween and a semiconductor substrate from which the semiconductor film is removed. An embrittlement layer, a semiconductor layer, and an insulating film remain in the peripheral portion of the semiconductor substrate after separation. The remaining insulating film is removed by a first etching treatment. The remaining embrittlement layer and semiconductor layer are removed by a second etching treatment using as an etchant a mixed solution containing a substance functioning as an oxidizer for oxidizing a semiconductor of the semiconductor substrate, a substance dissolving an oxide of the semiconductor, and a substance functioning as a decelerator of the oxidization of the semiconductor and dissolution of the oxide of the semiconductor. The semiconductor substrate after separation is polished to form a reprocessed semiconductor substrate, and the reprocessed semiconductor substrate is reused as a semiconductor substrate.

In the above structures, the etchant used in the second etching treatment can be a mixed solution which contains: nitric acid as the substance functioning as an oxidizer for oxidizing the semiconductor; hydrofluoric acid as the substance dissolving the oxide of the semiconductor; and acetic acid as the substance functioning as the decelerator of the oxidization of the semiconductor and the dissolution of the oxide of the semiconductor. In that case, it is preferable that the mixed solution has a composition which is obtained by adjusting the volume of 50 wt % hydrofluoric acid to more than 0.01 times and less than 0.3 times as large as that of 97.7 wt % acetic acid and further adjusting the volume of 70 wt % nitric acid to more than 0.01 times and less than one time as large as that of 97.7 wt % acetic acid and to more than 0.1 times and less than 100 times as large as that of 50 wt % hydrofluoric acid.

In addition, in the above structure, the plural kinds of hydrogen ions preferably contain $H_3^+$ ions.

According to one embodiment of the present invention, the embrittlement layer and the semiconductor layer remaining in the peripheral portion of the semiconductor substrate after separation can be selectively removed, resulting in a reduction in the thickness of a removed portion of the semiconductor substrate after separation, and an increase in the number of times of reusing the semiconductor substrate.

DETAILED DESCRIPTION OF THE INVENTION

Figure 1A:
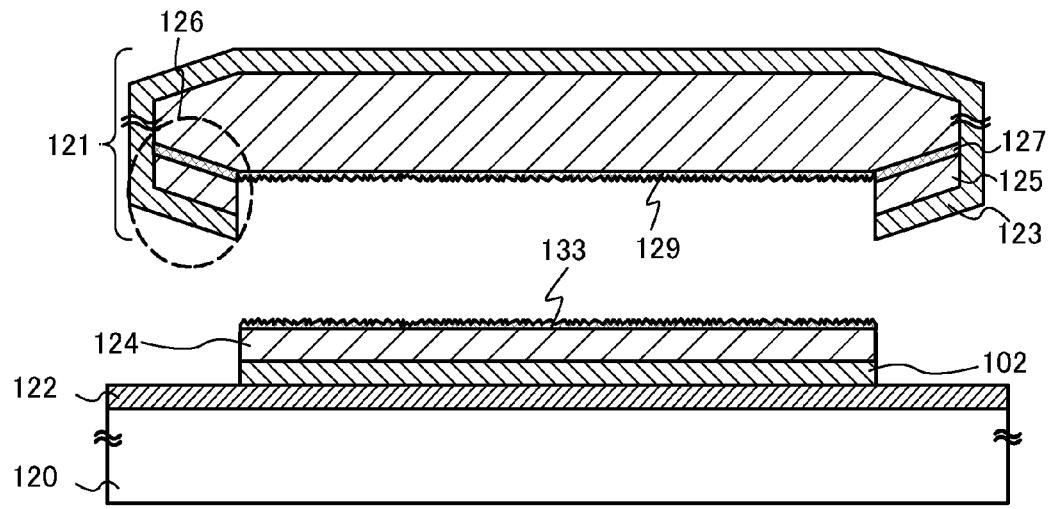
FIGS. 1A to 1D illustrate a method for reprocessing a semiconductor substrate after separation according to one embodiment of the present invention.

Embodiments and examples of the present invention will be described below with reference to the accompanying drawings. It is easily understood by those skilled in the art that modes and details disclosed herein can be modified in various ways without departing from the spirit and the scope of the present invention. Accordingly, the present invention is not to be taken as being limited to the described content of the embodiments and examples included herein. Note that in the drawings of this specification, the identical portions or portions having a similar function are denoted by the identical reference numerals, and description thereon may be omitted.

Embodiment 1

In this embodiment, a method for reprocessing a semiconductor substrate after separation which is by-produced in manufacture of an SOI substrate will be described with reference to FIGS. 1A to 1D.

An SOI substrate is manufactured as follows: a semiconductor substrate (a bond substrate) is bonded to a base substrate, and a heat treatment is performed so that a semiconductor film is separated from the semiconductor substrate and formed on the base substrate. At this time, the semiconductor substrate after separation from which the semiconductor film has been separated can be reused as a semiconductor substrate used for manufacturing an SOI substrate by the following reprocessing treatment.

First, a process of by-producing a semiconductor substrate after separation will be described. FIG. 1A illustrates a semiconductor substrate divided into a semiconductor substrate 121 after separation and a semiconductor film 124 attached to a base substrate 120. After the semiconductor substrate is bonded to the base substrate 120, a heat treatment is performed so that microvoids in an embrittlement layer in the semiconductor substrate are coupled and increased in volume, and thus the semiconductor substrate is divided into the semiconductor film 124 attached to the base substrate 120 and the semiconductor substrate 121 after separation. A separation surface 129 formed on the semiconductor substrate 121 after separation and a separation surface 133 formed on the semiconductor film 124 are part of the embrittlement layer in the semiconductor substrate.

A commercially available semiconductor substrate can be used as the semiconductor substrate forming the semiconductor substrate 121 after separation and the semiconductor film 124. For example, a single crystal semiconductor substrate or a polycrystalline semiconductor substrate such as a silicon substrate can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. The peripheral portion of the commercially available silicon substrate includes a chamfer portion for preventing chipping or cracking. Note that the shape of the semiconductor substrate is not limited to a circle, and a silicon substrate processed into a rectangular shape or the like can also be used.

As shown in FIG. 1A, an insulating film may be formed over the whole surface of the semiconductor substrate. In this case, the insulating film is divided into an insulating film 123 covering the semiconductor substrate 121 after separation and an insulating film 102 provided under the semiconductor film 124 after the separation of the semiconductor substrate. The insulating film may be a single-layer or multi-layer film of a silicon oxide film, a silicon nitride film, a silicon oxynitride film, a silicon nitride oxide film, or the like. It is particularly preferable that the insulating film be made of an oxide film obtained by thermal oxidation of the semiconductor substrate.

Here, the embrittlement layer in the semiconductor substrate can be formed by irradiation with plural kinds of ions containing at least an $H_3^+$ ion which is generated from a hydrogen gas with use of an ion doping apparatus. The proportion of $H_3^+$ with respect to the total amount of the ion species ($H^+$, $H_2^+$, $H_3^+$) generated from the hydrogen gas is preferably 50% or more, more preferably 80% or more. Note that irradiation of ions with the same mass/charge ratio enables the reduction of variation in depth of the region to which the ions are added. Note that the ion irradiation for forming the embrittlement layer is described in detail in Embodiment 3 below.

The semiconductor film 124 is formed over the base substrate 120 with the insulating film 102 interposed therebetween. This is because the insulating film 102 is formed to cover the semiconductor substrate before the semiconductor substrate is bonded to the base substrate 120. The insulating film is not necessarily formed. Such a method for manufacturing an SOI substrate will be described in detail in Embodiment 3.

Figure 1B:
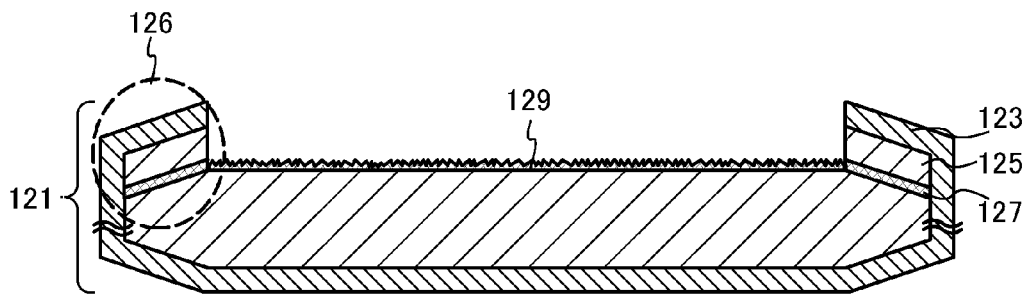

The semiconductor substrate 121 after separation is illustrated in FIG. 1B. A projection 126 is formed in the peripheral portion of the semiconductor substrate 121 after separation. The projection 126 is formed on part of the semiconductor substrate, which is not bonded to the base substrate 120 due to low adhesiveness of the peripheral portion of the semiconductor substrate. This is caused by a chamfer portion in the peripheral portion of the semiconductor substrate, or an area called edge roll off in the peripheral portion of the semiconductor substrate which has a thickness smaller than that of the center portion of the substrate and is not sufficiently even.

The projection 126 includes an embrittlement layer 127, a semiconductor layer 125, and the insulating film 123 that remain in order from the semiconductor substrate side. The semiconductor layer 125 and the embrittlement layer 127 contain crystal defects caused by the above ion irradiation. Crystal defects are also formed in the separation surface 129 of the semiconductor substrate 121 after separation, leading to unevenness of the separation surface 129.

Figure 1C:
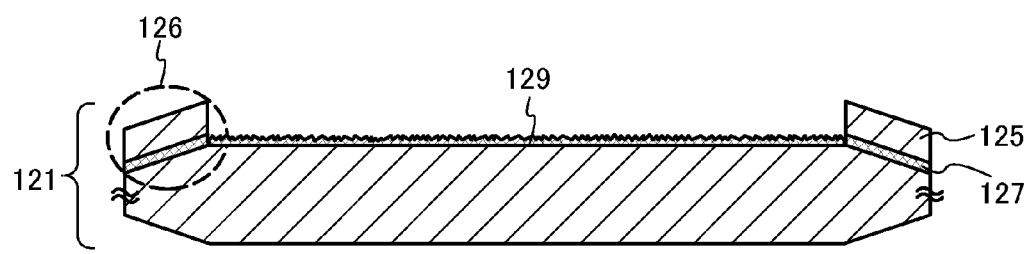

Next, as illustrated in FIG. 1C, a first etching treatment is performed so that the insulating film 123 on the semiconductor substrate 121 after separation is removed. The insulating film 123 can be removed by a wet etching treatment using a solution containing hydrofluoric acid as an etchant. As the solution containing hydrofluoric acid, it is preferable to use a mixed solution containing hydrofluoric acid, ammonium fluoride, and a surfactant (e.g., manufactured by Stella Chemifa Corporation, product name: LAL500). This wet etching treatment is preferably performed for 120 seconds to 1200 seconds, for example, about 600 seconds. The removal of the insulating film 123 by the first etching treatment allows reducing the thickness of the removed portion of the semiconductor substrate 121 after separation in the subsequent second etching treatment, and shortening time of the wet etching treatment. Since the wet etching treatment is performed in such a manner that the semiconductor substrate 121 after separation is soaked in a solution in a treatment tank, a plurality of semiconductor substrates 121 after separation can be processed at a time by batch treatment. Accordingly, the semiconductor substrate can be reprocessed effectively.

The first etching treatment for removing the insulating film 123 may be a dry etching method as long as the insulating film 123 can be removed. Alternatively, the wet etching treatment may be performed in combination with a dry etching method. Examples of the dry etching method include parallel plate RIE (reactive ion etching) and ICP (inductively coupled plasma) etching. The etching conditions (e.g., the amount of electric power applied to a coiled electrode, the amount of electric power applied to an electrode on the substrate side, and the electrode temperature on the substrate side) are adjusted as appropriate.

Figure 1D:
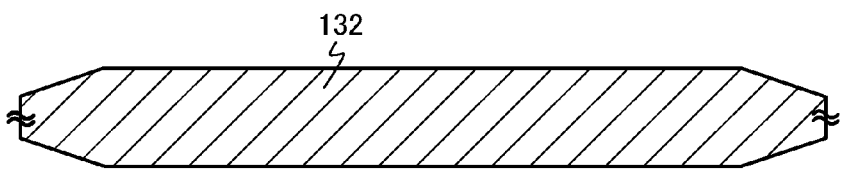

Finally, as illustrated in FIG. 1D, a second etching treatment is performed so that the semiconductor layer 125 and the embrittlement layer 127 included in the projection 126 of the semiconductor substrate 121 after separation are selectively removed to form a reprocessed semiconductor substrate 132. At this time, the separation surface 129 is planarized. The semiconductor layer 125 and the embrittlement layer 127 can be removed by a wet etching treatment using as an etchant a mixed solution containing a substance functioning as an oxidizer for oxidizing the semiconductor of the semiconductor substrate, a substance dissolving the oxide of the semiconductor, and a substance functioning as a decelerator of the oxidization of the semiconductor and the dissolution of the oxide of the semiconductor. The second etching treatment is preferably performed for about one minute to ten minutes, for example, about two minutes to four minutes. The solution is preferably at a temperature of about 10° C. to 30° C., for example, room temperature.

It is preferable to use nitric acid as the substance functioning as an oxidizer for oxidizing the semiconductor. It is preferable to use hydrofluoric acid as the substance dissolving the oxide of the semiconductor. It is preferable to use acetic acid as the substance functioning as the decelerator of the oxidization of the semiconductor and the dissolution of the oxide of the semiconductor. Specifically, it is preferable to use as the etchant a mixed solution having a composition which is obtained by adjusting the volume of 70 wt % nitric acid to more than 0.01 times and less than one time as large as that of 97.7 wt % acetic acid and to more than 0.1 times and less than 100 times as large as that of 50 wt % hydrofluoric acid and further adjusting the volume of 50 wt % hydrofluoric acid to more than 0.01 times and less than 0.3 times as large as that of 97.7 wt % acetic acid. More preferably, the etchant preferably possesses a composition obtained by adjusting the volume of 70 wt % nitric acid to more than or equal to 0.2 times and less than or equal to 0.5 times as large as that of 97.7 wt % acetic acid and more than or equal to one time and less than or equal to 10 times as large as that of 50 wt % hydrofluoric acid and further adjusting the volume of 50 wt % hydrofluoric acid to more than or equal to 0.1 times and less than or equal to 0.2 times as large as that of 97.7 wt % acetic acid. For example, the volume ratio between 50 wt % hydrofluoric acid, 70 wt % nitric acid, and 97.7 wt % acetic acid is preferably 1:3:10, 1:2:10, 1.5:3:10, 2:2:10, 1:10:20, or 1:1:10.

The mixed solution used as the etchant for the second etching treatment can easily penetrate into the semiconductor layer 125 and the embrittlement layer 127 included in the projection 126, because the crystal defects and microvoids caused by the ion irradiation are formed therein. Accordingly, not only the surface of the semiconductor layer 125 but also the inside of the semiconductor layer 125 and the embrittlement layer 127 can be subjected to the wet etching treatment. The wet etching treatment often proceeds in such a manner that a deep hole is formed in a direction perpendicular to the plane surface of the substrate and then the hole is expanded. Thus, the wet etching treatment is performed on the semiconductor layer 125 and the embrittlement layer 127 at a higher etching rate than on the other part of the semiconductor substrate 121 after separation which does not include the projection 126.

That is, the semiconductor layer 125 and the embrittlement layer 127 can be removed by the wet etching treatment using as an etchant the mixed solution containing the substance functioning as the oxidizer for oxidizing the semiconductor of the semiconductor substrate, the substance dissolving the oxide of the semiconductor, and the substance functioning as the decelerator of the oxidization of the semiconductor and the dissolution of the oxide of the semiconductor. Here, the crystal defects caused by the ion irradiation allow the semiconductor layer 125 and the embrittlement layer 127 to be readily etched. Simultaneously, the separation surface 129 is also readily etched due to the crystal defects therein. However, after removing the separation surface 129, the semiconductor layer 125, and the embrittlement layer 127, a surface of the reprocessed semiconductor substrate 132 containing a few crystal defects, which is located thereunder, is exposed, resulting in reduction in the etching rate. As a result, the projection 126 is selectively etched, and the portion of the semiconductor substrate 121 after separation other than the projection 126 can be prevented from being reduced in thickness in the reprocessing treatment compared with the projection 126, which results in a reduction in the thickness of the removed portion of the reprocessed semiconductor substrate 132 and contributes to an increase in the number of times of reusing the semiconductor substrate. In addition, in the wet etching treatment, a plurality of semiconductor substrates 121 after separation can be easily processed at the same time by batch treatment; therefore, the semiconductor substrate can be reprocessed effectively. Furthermore, the second etching treatment can be performed in a relatively short time, which makes the reprocessing treatment efficient.

Note that the separation surface 129 remains after the second etching treatment in some cases. In that case, the separation surface 129 is preferably removed by a polishing treatment or the like described in Embodiment 2.

After the second etching treatment, the semiconductor substrate may be subjected to the above polishing treatment or a planarizing treatment such as a laser irradiation treatment. There is no limitation on the number of times of the polishing treatment and the laser irradiation treatment, and the polishing treatment and the laser irradiation treatment may be performed in combination. There is also no limitation on the order of the treatment steps, and the steps may be performed in an appropriate order. The light irradiation treatment may be performed with lamp light instead of laser light.

Through the above steps, the semiconductor substrate 121 after separation is reprocessed into the reprocessed semiconductor substrate 132.

As shown in this embodiment, after the insulating film is removed by the first etching treatment, the embrittlement layer and the semiconductor layer remaining in the peripheral portion of the semiconductor substrate after separation can be selectively removed by the second etching treatment using the mixed solution containing the substance functioning as the oxidizer for oxidizing the semiconductor, the substance dissolving the oxide of the semiconductor, and the substance functioning as the decelerator of the oxidization of the semiconductor and dissolution of the oxide of the semiconductor. Thus, the removed portion of the reprocessed semiconductor substrate can be reduced in thickness, and one semiconductor substrate can be reused more times.

Note that the structure described in this embodiment can be combined with any of the structures described in other embodiments as appropriate.

Embodiment 2

In this embodiment, a method for reprocessing a semiconductor substrate after separation, which is different from that in Embodiment 1, is described with reference to FIGS. 2A to 2C.

Figure 2A:
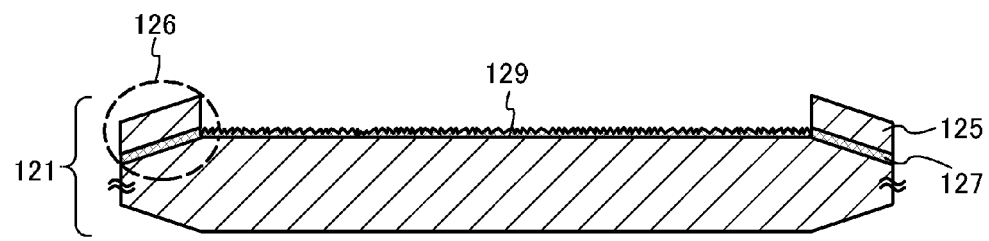
FIGS. 2A to 2C illustrate a method for reprocessing a semiconductor substrate after separation according to one embodiment of the present invention.
Figure 2B:
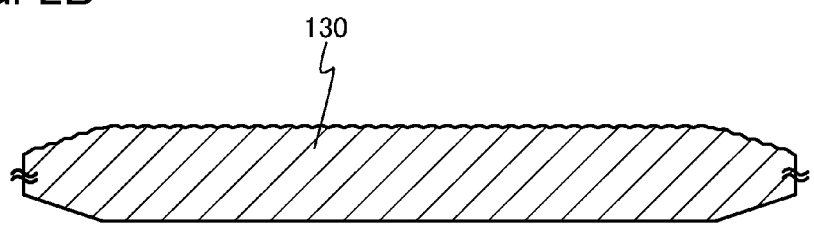
Figure 2C:
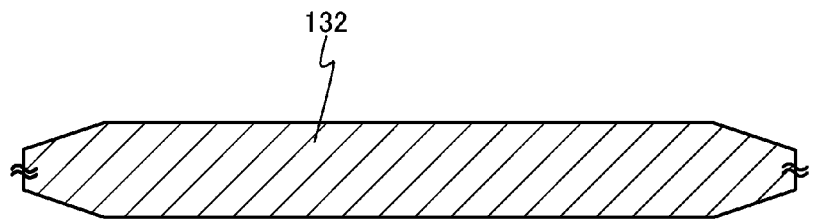

First, a first etching treatment illustrated in FIG. 2A is performed in a manner similar to that in Embodiment 1, so that a reprocessing treatment is performed up to removal of an insulating film 123 on a semiconductor substrate 121 after separation. Next, a second etching treatment is performed also in a manner similar to that in Embodiment 1. Here, in the case where a semiconductor substrate 130 after separation is not sufficiently plane as illustrated in FIG. 2B, a planarization treatment is performed on the semiconductor substrate 130 after separation as described in this embodiment, so that a reprocessed semiconductor substrate 132 is formed. In addition, also in the case where a separation surface 129 is not sufficiently removed through the second etching treatment, the planarization treatment is preferably performed to remove the remaining separation surface 129.

The planarization treatment can be performed by polishing or laser irradiation. The polishing treatment or laser irradiation may be performed plural times or in combination. There is no limitation on the order of treatment steps; they may be selected as appropriate. A light irradiation treatment may be performed using a lamp light instead of the laser beam. In this embodiment, the planarization treatment is performed by polishing as an example.

The semiconductor substrate 121 after separation is preferably polished by a chemical mechanical polishing (CMP) method. Here, the CMP method is a method of planarizing a surface of an object to be processed by a combination of chemical and mechanical actions using the surface as a reference. In general, the CMP method is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The polishing by the CMP method may be performed once or plural times. When the polishing is performed plural times, first polishing is preferably performed with a high polishing rate followed by final polishing with a low polishing rate. At the first polishing, a polyurethane polishing cloth is preferably used, and the grain diameter of the slurry is preferably 120 nm to 180 nm, for example, approximately 150 nm. At the final polishing, a suede polishing cloth is preferably used, and the grain diameter of the slurry is preferably 45 nm to 75 nm, for example, approximately 60 nm. In this manner, polishing is performed on the semiconductor substrate 130 after separation, thereby forming the reprocessed semiconductor substrate 132 which is planarized and made to have a mirror surface with an average surface roughness of approximately 0.2 nm to 0.5 nm. In addition, by combining polishing with different polishing rates, the semiconductor substrate 130 after separation can be planarized and made to have a mirror surface in a short time.

Thus, by polishing by the CMP method after a semiconductor layer 125 and an embrittlement layer 127 are removed from the semiconductor substrate 121 after separation through the first etching treatment and the second etching treatment, the reprocessed semiconductor substrate 132 can have a highly planar surface.

Note that the structure described in this embodiment can be combined with any of the structures described in other embodiments as appropriate.

Embodiment 3

In a method for manufacturing an SOI substrate of this embodiment, a semiconductor substrate which is a bond substrate is bonded to a base substrate, and an SOI substrate including a semiconductor film separated from the semiconductor substrate is manufactured. The semiconductor substrate after separation from which the semiconductor film has been separated is subjected to a reprocessing treatment and reused as a bond substrate. One method for manufacturing an SOI substrate of one embodiment of the present invention is described below with reference to FIGS. 3A to 3C, FIGS. 4A to 4C, FIGS. 5A to 5C, and FIG. 6.

First, a process of forming an embrittlement layer 104 in a semiconductor substrate 100 to prepare for bonding the semiconductor substrate 100 to a base substrate 120 is described. The following process corresponds to Process A (a bond substrate process) in FIG. 6.

Figure 3A:
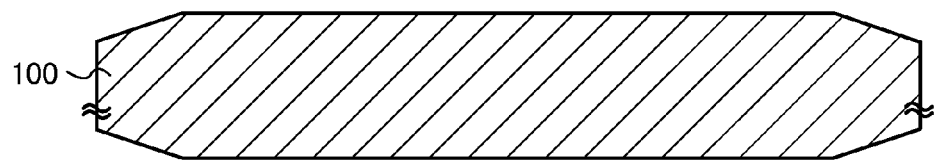
FIGS. 3A to 3C illustrate a method for manufacturing an SOI substrate according to one embodiment of the present invention.
Figure 6:
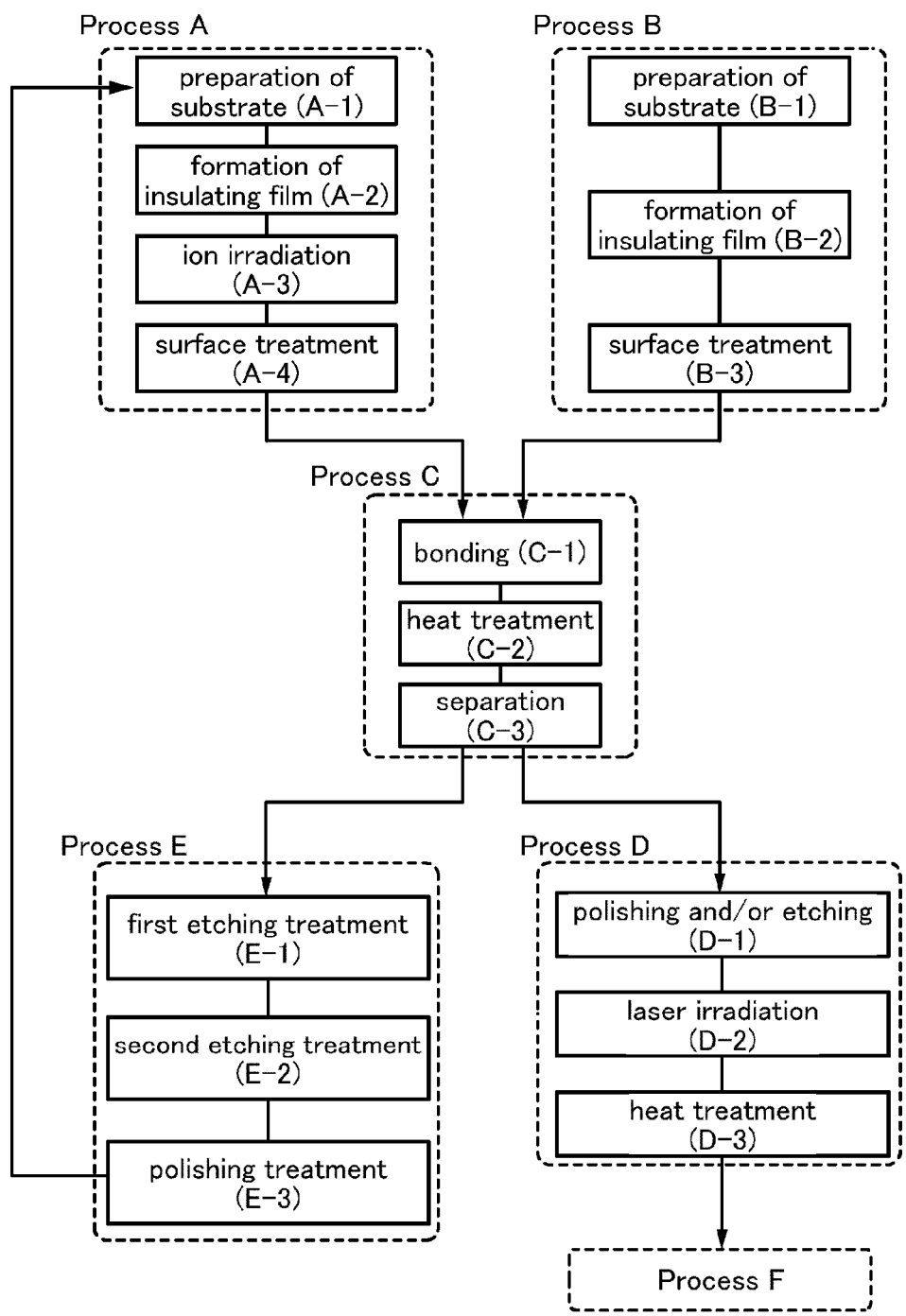
FIG. 6 illustrates a process flow of manufacturing an SOI substrate according to one embodiment of the present invention.

First, the semiconductor substrate 100 illustrated in FIG. 3A is prepared (this step corresponds to Step A-1 in FIG. 6). As the semiconductor substrate 100, a commercially available semiconductor substrate can be used; for example, a single crystal semiconductor substrate or a polycrystalline semiconductor substrate of silicon or the like can be used. Typical examples of the commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Further, in a peripheral portion of a commercially-available silicon substrate, there is a chamfer portion for preventing chipping or cracking as illustrated in FIG. 3A. Note that the shape is not limited to the circular shape, and a silicon substrate which is processed into a rectangular shape or the like can also be used. The case in which a rectangular single crystal silicon substrate is used as the semiconductor substrate 100 is described below.

Note that the surface of the semiconductor substrate 100 is preferably cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), or the like, as appropriate. Further, diluted hydrofluoric acid and ozone water may be discharged alternately to clean the surface of the semiconductor substrate 100.

Figure 3B:
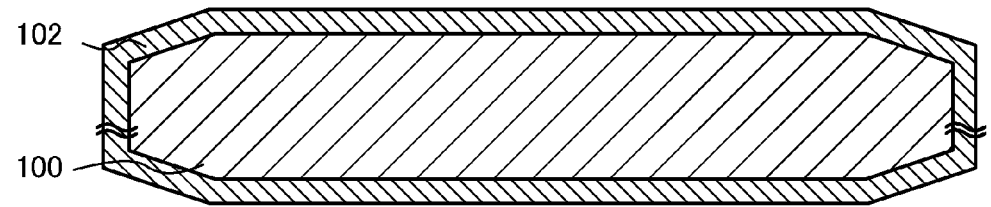

Next, as illustrated in FIG. 3B, after the surface of the semiconductor substrate 100 is cleaned, an insulating film 102 is formed on the semiconductor substrate 100 (this step corresponds to Step A-2 in FIG. 6). The insulating film 102 may be either a single insulating film or a stack layer including a plurality of insulating films. For example, in this embodiment, silicon oxide is used for the insulating film 102. As a film which forms the insulating film 102, an insulating film which contains silicon as a component, such as a silicon oxide film, a silicon nitride film, a silicon oxynitride film, or a silicon nitride oxide film, can be used.

Note that in this specification, a "silicon oxynitride film" means a film that contains more oxygen atoms than nitrogen atoms, and shows oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and shows oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively, when they are measured by RBS and HFS. Note that percentages of nitrogen, oxygen, silicon, and hydrogen fall within the ranges given above when the total number of atoms contained in the silicon oxynitride film or the silicon nitride oxide film is defined as 100 atomic %.

In the case of using silicon oxide for the insulating film 102, the insulating film 102 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 102 may be densified by an oxygen plasma treatment.

The organosilane gas which can be used to deposit silicon oxide by the CVD methods can be exemplified by a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$).

Alternatively, the insulating film 102 can be formed by oxidizing the semiconductor substrate 100. A thermal oxidation treatment for forming the oxide film may be any of dry oxidation and wet oxidation, and may be performed in an oxidizing atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used. Note that the insulating film is formed to cover the semiconductor substrate 100 in FIG. 3B; however, this embodiment is not limited to this structure. In the case where the insulating film 102 is formed by a CVD method or the like on the semiconductor substrate 100, the insulating film 102 may be formed on only one of the surfaces of the semiconductor substrate 100.

For example, a heat treatment is carried out in an atmosphere containing HCl at a ratio of 0.5 vol % to 10 vol % (preferably, 3 vol %) with respect to oxygen at a temperature higher than or equal to 700° C. and lower than or equal to 1100° C. For example, the heat treatment may be performed at approximately 950° C. Treatment time may be 0.1 to 6 hours, preferably, 0.5 to 1 hour. The thickness of the oxide film to be formed can be set in the range of 10 nm to 1100 nm (preferably 50 nm to 150 nm), for example, 100 nm.

By this thermal oxidation treatment in the atmosphere containing a halogen-containing gas, the oxide film can be made to contain a halogen element. By containing the halogen element at a concentration of $1 \times 10^{17}$ atoms/cm$^3$ to $1 \times 10^{21}$ atoms/cm$^3$, the halogen in the oxide film efficiently captures heavy metal that is an extrinsic impurity (for example, Fe, Cr, Ni, Mo, and the like), so that contamination of the semiconductor film to be formed later can be prevented.

Further, the insulating film 102 containing a halogen such as chlorine can serve to getter impurities (e.g., movable ions such as Na ion) which adversely affect the semiconductor substrate 100. Specifically, by a heat treatment which is performed after the insulating film 102 is formed, impurities contained in the semiconductor substrate 100 are separated out to the insulating film 102, reacted with the halogen atom (e.g. a chlorine atom), and captured. Accordingly, the impurities captured in the insulating film 102 can be fixed and prevented from contaminating the semiconductor substrate 100. Further, when the insulating film 102 is bonded to a glass substrate, the insulating film 102 can function as a film for fixing impurities such as Na contained in glass.

In particular, the inclusion of a halogen such as chlorine in the insulating film 102 by a heat treatment under an atmosphere containing a halogen is effective in removing contamination of the semiconductor substrate when cleaning of the semiconductor substrate 100 is insufficient or when the semiconductor substrate 100 is repeatedly subjected to reprocessing treatments and used.

Moreover, the halogen element contained in the oxidation treatment terminates bond defects on the surface of the semiconductor substrate 100; as a result, the local level density of an interface between the oxide film and the semiconductor substrate 100 can be reduced.

The halogen contained in the insulating film 102 makes distortions in the insulating film 102. As a result, moisture absorption rate in the insulating film 102 is improved and diffusion rate of moisture is increased. That is, when moisture is present on a surface of the insulating film 102, the moisture present on the surface of the insulating film 102 can be rapidly absorbed and diffused into the insulating film 102.

In the case of using, as a base substrate, a glass substrate which contains impurities which decrease reliability of a semiconductor device, such as an alkali metal or an alkaline earth metal, the insulating film 102 preferably includes at least one or more films which can prevent the impurities in the base substrate from diffusing into the semiconductor film of the SOI substrate. Examples of such a film include a silicon nitride film, a silicon nitride oxide film, and the like. With such a film included in the insulating film 102, the insulating film 102 can function as a barrier film.

In the case of using silicon nitride for the insulating film 102, the insulating film 102 can be formed using a mixed gas of silane and ammonium by a vapor deposition method such as plasma CVD. In addition, in the case of using silicon nitride oxide for the insulating film 102, the insulating film 102 can be formed using a mixed gas of silane and ammonium or a mixed gas of silane and dinitrogen monoxide by a vapor deposition method such as a plasma CVD method.

For example, in the case of forming a barrier film having a single-layer structure as the insulating film 102, the insulating film 102 can be a silicon nitride film or a silicon nitride oxide film with a thickness greater than or equal to 15 nm and less than or equal to 300 nm.

In the case of forming a two-layer barrier film as the insulating film 102, the upper layer is formed using an insulating film with a high barrier property. The upper layer of the insulating film can be formed using, for example, a silicon nitride film or a silicon nitride oxide film having a thickness of 15 nm to 300 nm inclusive. These films have a high blocking effect for preventing impurity diffusion, but their internal stress is also high. Therefore, as an insulating film of a lower layer that is in contact with the semiconductor substrate 100, it is preferable to select a film that has an effect of relieving the stress of an insulating film of the upper layer. As the insulating film with an effect of relieving the stress of the upper insulating film, a silicon oxide film, a silicon oxynitride film, a thermal oxide film formed by thermally oxidizing the semiconductor substrate 100, and the like are given. The thickness of the lower insulating film can be from 5 nm to 200 nm inclusive.

For example, in order for the insulating film 102 to function as a blocking film, the insulating film 102 may be formed by a combination of a silicon oxide film and a silicon nitride film, a silicon oxynitride film and a silicon nitride film, a silicon oxide film and a silicon nitride oxide film, a silicon oxynitride film and a silicon nitride oxide film, or the like.

Figure 3C:
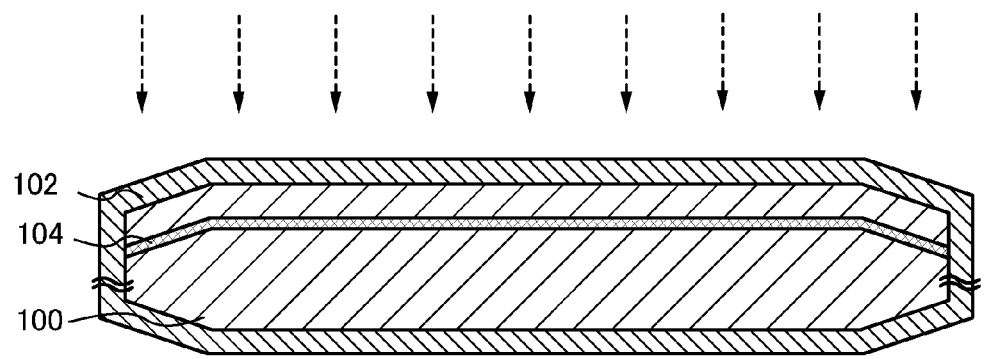

Next, as illustrated in FIG. 3C, the semiconductor substrate 100 is irradiated with an ion beam containing ions accelerated by an electric field through the insulating film 102, as indicated by arrows. Thus, the embrittlement layer 104 having microvoids is formed in a region at a predetermined depth from the surface of the semiconductor substrate 100 (this step corresponds to Step A-3 in FIG. 6). The depth at which the embrittlement layer 104 is formed can be adjusted by the acceleration energy of the ion beam and the incident angle of the ion beam. The acceleration energy can be adjusted by an acceleration voltage, dosage, or the like. The embrittlement layer 104 is formed in a region at the same depth or substantially the same depth as the average penetration depth of the ions. Therefore, the thickness of a semiconductor film 124 which is separated from the semiconductor substrate 100 later is determined by the depth at which the ions are added. The depth at which the embrittlement layer 104 is formed can be set in the range of, for example, greater than or equal to 100 nm and less than or equal to 500 nm, preferably greater than or equal to 50 nm and less than or equal to 200 nm; for example, the depth is preferably about 100 nm from the surface of the semiconductor substrate 100. Note that irradiation with ions is performed after formation of the insulating film 102 in this embodiment; however, the present invention is not limited to this order, and the irradiation with ions may be performed before the formation of the insulating film 102.

The embrittlement layer 104 can be formed by an ion doping treatment. The ion doping treatment can be performed with an ion doping apparatus. A typical ion doping apparatus is a non-mass-separation apparatus with which an object placed in a chamber is irradiated with all ion species generated by excitation of a process gas into plasma. The non-mass-separation apparatus is an apparatus with which an object is irradiated with all ion species without mass separation of ion species in plasma. In contrast, an ion implantation treatment is performed with an ion implantation apparatus, which is a mass-separation apparatus. An ion implantation apparatus is an apparatus with which an object is irradiated with an ion species having a specific mass after mass separation of ion species in plasma.

Main components of an ion doping apparatus are the following: a chamber in which an object is placed; an ion source for generating desired ions; and an acceleration mechanism for acceleration of ions for irradiation therewith. The ion source includes a gas supply device for supplying a source gas to generate desired ion species, an electrode for exciting the source gas to generate plasma, and the like. As the electrode for generating plasma, a capacitively-coupled high-frequency discharge electrode, a filament electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated from the ion source are accelerated. Note that components of the ion doping apparatus are not limited to the components described above and an as-needed mechanism may be provided.

In this embodiment, ions generated from a hydrogen gas are added to the semiconductor substrate 100 with an ion doping apparatus. A hydrogen-containing gas is supplied as a plasma source gas. For example, $H_2$ is supplied. A hydrogen gas is excited to generate plasma; ions contained in plasma are accelerated without mass separation; and the semiconductor substrate 100 is irradiated with the accelerated ions.

In an ion doping apparatus, the proportion of $H_3^+$ to the total amount of ion species ($H^+$, $H_2^+$, and $H_3^+$) that are generated from a hydrogen gas is set to 50% or higher. Preferably, the proportion of $H_3^+$ is set to 80% or higher. Because the mass-separation is not carried out in the ion doping apparatus, the proportion of one kind to plural kinds of hydrogen ions that are generated in plasma is preferably controlled to be 50% or higher, more preferably, 80% or higher. Note that irradiation of ions with the same mass/charge ratio enables the reduction of variation in depth of the region to which the ions are added.

In order to form the embrittlement layer 104 at a short distance from the surface, the acceleration voltage for the ion beam needs to be low. However, by an increase in the percentage of $H_3^+$ ions in plasma, hydrogen ions can be efficiently added to the semiconductor substrate 100. Because the mass of an $H_3^+$ ion is three times as large as that of an $H^+$ ion, when one hydrogen atom is added to a depth, the acceleration voltage for an $H_3^+$ ion can be three times as high as that of an $H^+$ ion. From the above reason, the takt time in the ion irradiation step can be shortened, and productivity and throughput can be improved.

Ion doping apparatuses are inexpensive and excellent for use in a large-area treatment. Therefore, by irradiation with $H_3^+$ using such an ion doping apparatus, significantly large effects such as an improvement in semiconductor characteristics of the SOI substrate, an increase in area of the base substrate, a reduction in manufacturing costs of the SOI substrate, and an improvement in productivity can be obtained. Further, in the case where an ion doping apparatus is used, heavy metals may also be introduced at the time of the ion irradiation; however, by irradiation with ions through the insulating film 102 containing chlorine atoms, the semiconductor substrate 100 can be prevented from being contaminated due to these heavy metals.

The step of irradiating the semiconductor substrate 100 with the accelerated ion beam and forming the embrittlement layer 104 can also be performed with an ion implantation apparatus. The ion implantation apparatus is a mass-separation apparatus with which an object that is disposed in a chamber is irradiated with a specific ion species through mass separation of a plurality of ion species that are generated by plasma excitation of a source gas. Thus, in the case of using an ion implantation apparatus, $H^+$ ions and $H_2^+$ ions that are generated by excitation of a hydrogen gas or $PH_3$ are subjected to mass separation, and either $H^+$ ions or $H_2^+$ ions are accelerated, with which the semiconductor substrate 100 is irradiated. In this manner, the embrittlement layer 104 can also be formed with the ion implantation apparatus.

Next, the semiconductor substrate 100 over which the insulating film 102 is formed is cleaned. This cleaning step can be performed by ultrasonic cleaning with the use of pure water or by two-fluid jet cleaning with the use of pure water and nitrogen. The ultrasonic cleaning is preferably megahertz ultrasonic cleaning (megasonic cleaning). After the ultrasonic cleaning or the two-fluid jet cleaning, the semiconductor substrate 100 may be further cleaned with ozone water. By the cleaning with ozone water, removal of organic substances and surface activation for improving the hydrophilicity of a surface of the insulating film 102 can be performed.

The surface activation of the insulating film 102 can be performed by irradiation with an atomic beam or an ion beam, an ultraviolet treatment, an ozone treatment, a plasma treatment, a plasma treatment by application of a bias voltage, or a radical treatment instead of cleaning with ozone water (this step corresponds to Step A-4 in FIG. 6). In the case of using an atomic beam or an ion beam, an inert gas neutral atom beam or an inert gas ion beam of argon or the like can be used.

Here, an example of an ozone treatment is described. For example, the ozone treatment can be performed on a surface of an object by irradiation with ultraviolet (UV) light in an atmosphere containing oxygen. The ozone treatment in which irradiation with ultraviolet light is performed under an atmosphere containing oxygen is also called a UV ozone treatment, an ultraviolet ozone treatment, or the like. In an atmosphere containing oxygen, irradiation with light having a wavelength of less than 200 nm and light having a wavelength of greater than or equal to 200 nm among ultraviolet region is performed, whereby ozone can be generated and singlet oxygen can be generated by ozone. Irradiation with light having a wavelength of less than 180 nm among ultraviolet region is performed, whereby ozone can be generated and singlet oxygen can be generated by ozone.

Examples of reactions which occur by performing irradiation with ultraviolet light having a wavelength of less than 200 nm and ultraviolet light having a wavelength of greater than or equal to 200 nm in an atmosphere containing oxygen are described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the reaction formula (1), by irradiation with ultraviolet light (hv) having a wavelength ($\lambda_1$ nm) of lower than 200 nm in an atmosphere containing oxygen ($O_2$), oxygen atoms in a ground state ($O(^3P)$) are generated. Then, in the reaction formula (2), the oxygen atom in a ground state ($O(^3P)$) and oxygen ($O_2$) react with each other; accordingly, ozone ($O_3$) is generated. Then, in the reaction formula (3), irradiation with ultraviolet light having a wavelength ($\lambda_2$ nm) of greater than or equal to 200 nm in an atmosphere containing generated ozone ($O_3$) is performed to generate singlet oxygen $O(^1D)$ in an excited state. In an atmosphere containing oxygen, irradiation with ultraviolet light having a wavelength of less than 200 nm among ultraviolet light is performed to generate ozone while irradiation with ultraviolet light having a wavelength of greater than or equal to 200 nm among ultraviolet light is performed to generate singlet oxygen by decomposing ozone. The ozone treatment described above, for example, can be performed by irradiation using a low-pressure mercury lamp ($\lambda_1 = 185$ nm, $\lambda_2 = 254$ nm) in an atmosphere containing oxygen.

In addition, examples of reactions which occur by performing irradiation with ultraviolet light having a wavelength of less than 180 nm in an atmosphere containing oxygen are described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with ultraviolet light having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), an oxygen atom ($O(^3P)$) in a ground state and oxygen ($O_2$) are reacted with each other to generate ozone ($O_3$). In the reaction formula (6), irradiation with ultraviolet light having a wavelength ($\lambda_3$ nm) of less than 180 nm in an atmosphere containing generated ozone ($O_3$) is performed to generate singlet oxygen in an excited state and oxygen. In an atmosphere containing oxygen, irradiation with ultraviolet light having a wavelength of less than 180 nm among ultraviolet light is performed to generate ozone and to generate singlet oxygen by decomposing ozone or oxygen. The ozone treatment described above, for example, can be performed by irradiation using a Xe excimer UV lamp ($\lambda_3 = 172$ nm) in an atmosphere containing oxygen.

Chemical bonding of an organic substance attached to a surface of an object is cleaved by ultraviolet light having a wavelength of less than 200 nm, and the organic substance attached to the surface of the object or the organic substance whose chemical bonding is cleaved can be removed by oxidative decomposition with ozone or singlet oxygen generated by ozone. By performing the ozone treatment as described above, a hydrophilicity and purity of the surface of the object can be increased, and strong bonding with the base substrate can be achieved.

In an atmosphere containing oxygen, ozone is generated by performing irradiation with ultraviolet light. Ozone is effective in removal of the organic substance attached to the surface of the object. In addition, singlet oxygen is also effective in removal of the organic substance attached to the surface of the object as much as or more than ozone. Ozone and singlet oxygen are examples of oxygen in an active state, and collectively called active oxygen. As described with the above reaction formulae and the like, since there are reactions where ozone is generated in generating singlet oxygen or singlet oxygen is generated by ozone, here, such reactions including a reaction where singlet oxygen contributes are called an ozone treatment for convenience.

Next, a process of preparing for bonding the base substrate 120 to the semiconductor substrate 100 is described. The following process corresponds to Process B (glass substrate process) in FIG. 6.

First, the base substrate 120 is prepared (this step corresponds to Step B-1 in FIG. 6). Specific examples of the base substrate 120 include a variety of glass substrates used in the electronics industry, such as substrates of aluminosilicate glass, barium borosilicate glass, and aluminoborosilicate glass; a quartz substrate; a ceramic substrate; and a sapphire substrate. In addition, as the base substrate 120, a single crystal semiconductor substrate (for example, a single crystal silicon substrate) or a polycrystalline semiconductor substrate (for example, a polycrystalline silicon substrate) may be used. A polycrystalline silicon substrate has advantages of being less expensive than a single crystal silicon substrate and having higher heat resistance than a glass substrate. Further, when an alkali-free glass substrate is used as the base substrate 120, impurity contamination of semiconductor devices can be suppressed.

As the base substrate 120, a mother glass substrate which has been developed for manufacturing liquid crystal panels is preferably used. As such a mother glass substrate, substrates having the following sizes are known: the third generation (550 mm×650 mm), the 3.5-th generation (600 mm×720 mm), the fourth generation (680 mm×880 mm, or 730 mm×920 mm), the fifth generation (1100 mm×1300 mm), the sixth generation (1500 mm×1850 mm), the seventh generation (1870 mm×2200 mm), the eighth generation (2200 mm×2400 mm), the ninth generation (2400 mm×2800 mm), the tenth generation (2850 mm×3050 mm), and the like. By manufacturing an SOI substrate with the use of a large-sized mother glass substrate as the base substrate 120, the SOI substrate can have a large area. Increasing the SOI substrate in area allows many chips such as ICs or LSIs to be manufactured all at once, and thus the number of chips manufactured from one substrate is increased; therefore, productivity can be dramatically increased.

Further, an insulating film 122 is preferably formed over the base substrate 120 (this step corresponds to Step B-2 in FIG. 6). Note that the insulating film 122 is not necessarily formed on the surface of the base substrate 120. However, by forming, as the insulating film 122, a silicon nitride film, a silicon nitride oxide film, an aluminum nitride film, an aluminum nitride oxide film, or the like on the surface of the base substrate 120, impurities such as an alkali metal or an alkaline earth metal in the base substrate 120 can be prevented from entering the semiconductor substrate 100.

Since the insulating film 122 is used as a bonding layer, a surface of the insulating film 122 is preferably planarized in order to avoid defective bonding. Specifically, the insulating film 122 is formed to have an average surface roughness (Ra) of 0.50 nm or less and a root-mean-square roughness (Rms) of 0.60 nm or less, more preferably, an average surface roughness of 0.35 nm or less and a root-mean-square roughness of 0.45 nm or less. The thickness is preferably in the range of 10 nm to 200 nm inclusive, more preferably, 50 nm to 100 nm inclusive.

A surface of the base substrate 120 is cleaned before the bonding. The surface of the base substrate 120 can be cleaned with hydrochloric acid and hydrogen peroxide water or by megahertz ultrasonic cleaning, two-fluid jet cleaning, or cleaning with ozone water. Similarly to the insulating film 102, preferably after an surface activation treatment such as irradiation with an atomic beam or an ion beam, an ultraviolet treatment, an ozone treatment, a plasma treatment, a plasma treatment by application of a bias voltage, or a radical treatment is performed on the surface of the insulating film 122, bonding is performed (this step corresponds to Step B-3 in FIG. 6).

Next, described is a process in which the semiconductor substrate 100 is bonded to the base substrate 120 and then separated into the semiconductor film 124 bonded to the base substrate 120 which is to be an SOI substrate and a semiconductor substrate 121 after separation which is subjected to a reprocessing treatment and reused. The following process corresponds to Process C (a bonding process) in FIG. 6.

Figure 4A:
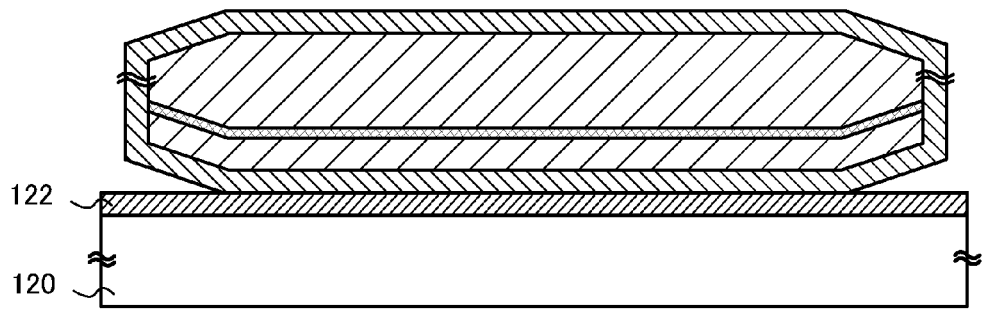
FIGS. 4A to 4C illustrate the method for manufacturing an SOI substrate according to one embodiment of the present invention.

Next, as illustrated in FIG. 4A, the semiconductor substrate 100 and the base substrate 120 are bonded to each other with the insulating film 102 and the insulating film 122 interposed therebetween so that the insulating film 102 on the embrittlement layer 104 side faces the base substrate 120 side (this step corresponds to Step C-1 in FIG. 6).

The bonding can be performed by applying pressure of about 0.1 $N/cm^2$ to 500 $N/cm^2$, preferably about 1 $N/cm^2$ to 20 $N/cm^2$ to one part at an end of the base substrate 120. The bonding between the insulating film 102 and the base substrate 120 starts from the portion of the base substrate 120 at which the pressure is applied and proceeds spontaneously throughout the interface therebetween, and thus one base substrate 120 and the semiconductor substrate 100 are bonded to each other.

However, as in this embodiment, in the case where there is a chamfer portion in a peripheral portion of the semiconductor substrate 100, the base substrate 120 and the semiconductor substrate 100 are not in contact with each other in the chamber portion.

When the semiconductor substrate 100 is manufactured, a CMP method or the like is used as finishing polishing. In the CMP method, a slurry (an abrasive) penetrates between the semiconductor substrate 100 and an abrasive cloth and passes between the semiconductor substrate 100 and the abrasive cloth by centrifugal force; thus, the semiconductor substrate 100 is polished. However, when an amount of the slurry which penetrates therebetween is small at this time, a peripheral portion of the semiconductor substrate 100 is polished faster than the center portion of the semiconductor substrate 100, so that a region where the substrate has a smaller thickness and has lower planarity than the center portion, which is referred to as edge roll-off (ERO), is formed. Also in the case where there is no chamfer portion at an end portion of the semiconductor substrate 100, due to the ERO region in the peripheral portion of the semiconductor substrate 100, the base substrate 120 and the semiconductor substrate 100 cannot be bonded to each other in the peripheral portion of the semiconductor substrate 100 in some cases.

In addition, when the semiconductor substrate 100 has a damaged portion in the peripheral portion, the base substrate 120 and the semiconductor substrate 100 cannot be bonded to each other in the peripheral portion of the semiconductor substrate 100 in some cases.

The bonding is performed by van der Waals force, so that the bonding is strong even if the bonding is performed at room temperature. By applying pressure to the semiconductor substrate 100 and the base substrate 120, the semiconductor substrate 100 and the base substrate 120 can be strongly bonded to each other by hydrogen bond. Note that because the above-described bonding can be performed at a low temperature, various substrates can be used as the base substrate 120 as described above.

In the case where a plurality of semiconductor substrates 100 are bonded to the base substrate, it is preferable to apply pressure not to one of the semiconductor substrates 100 but to each of the semiconductor substrates 100.

After the semiconductor substrate 100 is bonded to the base substrate 120, a heat treatment for increasing the bond strength at the bonding interface between the insulating film 102 and the insulating film 122 is preferably performed (this step corresponds to Step C-2 in FIG. 6). This heat treatment is performed at a temperature at which the embrittlement layer 104 does not crack; specifically, the temperature is in the range of from 200° C. to 450° C. inclusive. By bonding the semiconductor substrate 100 to the base substrate 120 while the heat treatment within this temperature range is performed, the bonding between the insulating film 102 and the insulating film 122 can be strengthened. The heat treatment for increasing the bond strength at the bonding interface is preferably performed successively in an apparatus or a place where the bonding is performed. In succession to the heat treatment for increasing the bonding force at the bonding interface, another heat treatment for separating the semiconductor substrate 100 along the embrittlement layer 104 may be performed.

Note that when a particle or the like is attached to the bonding surface in bonding the semiconductor substrate 100 and the base substrate 120, the portion where a particle or the like is attached is not bonded. In order to avoid attachment of a particle to the bonding surface, the semiconductor substrate 100 and the base substrate 120 are preferably bonded in an airtight treatment chamber. At the time of bonding the semiconductor substrate 100 and the base substrate 120, the process chamber may have a pressure lower than an atmospheric pressure such as a pressure of about $5.0 \times 10^{-3}$ Pa. The atmosphere of the bonding process also may be cleaned.

Figure 4B:
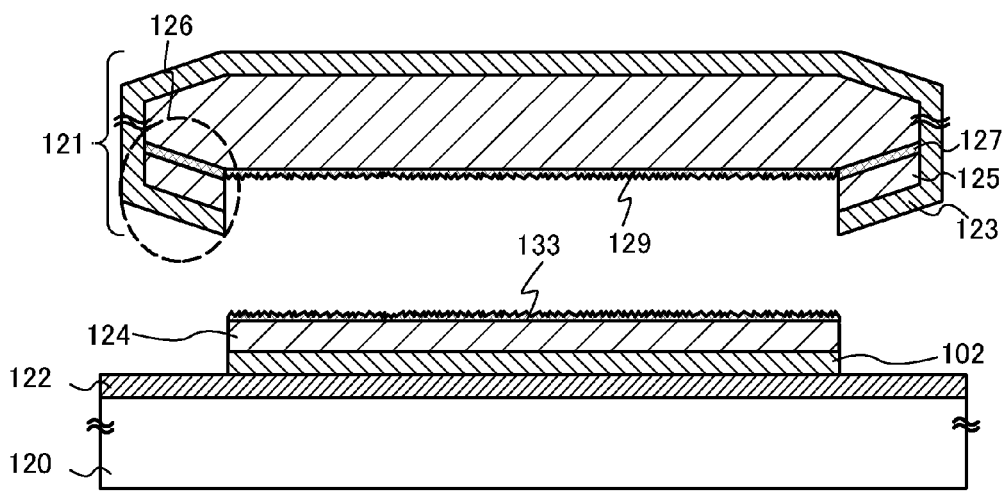

Next, as illustrated in FIG. 4B, by a heat treatment, microvoids increase in volume. As a result, the semiconductor film 124 is separated from the semiconductor substrate 100 at the embrittlement layer 104 (this step corresponds to Step C-3 in FIG. 6). Because part of the insulating film 102 is bonded to the base substrate 120, the semiconductor film 124 which is separated from the semiconductor substrate 100 is fixed to the base substrate 120. In addition, a separation surface 133 is formed on the semiconductor film 124 by separation along the embrittlement layer 104. Because the separation surface 133 is part of the embrittlement layer 104 before the separation of the semiconductor substrate 100, the separation surface 133 has a large amount of hydrogen and crystal defects formed by the separation of the semiconductor substrate 100. The heat treatment for separating the semiconductor film 124 from the semiconductor substrate 100 is performed at a temperature below the strain point of the base substrate 120. Note that the semiconductor substrate 100 from which the semiconductor film 124 is separated is called a semiconductor substrate 121 after separation.

For this heat treatment, a rapid thermal annealing (RTA) apparatus, a resistive heating furnace, or a microwave heating apparatus can be used. For the RTA apparatus, a gas rapid thermal annealing (GRTA) apparatus or a lamp rapid thermal annealing (LRTA) apparatus can be used.

In the case of using a GRTA apparatus, the heating temperature can be set in a range of 550° C. to 650° C. inclusive, and the treatment time can be set in a range of 0.5 minute to 60 minutes inclusive. In the case of using a resistance heating apparatus, the heat temperature can be set in a range of from 200° C. to 650° C. inclusive and the treatment time can be set in a range of from 2 hours to 4 hours inclusive.

The above-described heat treatment may be performed by dielectric heating with a high-frequency wave such as a microwave. The heat treatment using the dielectric heating can be performed by irradiating the semiconductor substrate 100 with high frequency waves in the range of 300 MHz to 3 THz which is generated at a high-frequency generator. Specifically, for example, irradiation with a microwave with a frequency of 2.45 GHz can be performed at 900 W for 14 minutes to expand microvoids and combine the microvoids in the embrittlement layer, so that the semiconductor substrate 100 can be separated at last.

In addition, similarly to the separation surface 133 on the semiconductor film 124, a separation surface 129 on the semiconductor substrate 121 after separation is part of the embrittlement layer 104 before the separation of the semiconductor substrate 100; accordingly, the separation surface 129 has a large amount of hydrogen and crystal defects formed by the separation of the semiconductor substrate 100.

The peripheral portion of the semiconductor substrate 100 is not bonded to the base substrate 120 in many cases due to the chamfer portion, the ERO region, a damaged portion, or the like. When the semiconductor film 124 is separated from the semiconductor substrate 100 in such a state, the peripheral portion of the semiconductor substrate 100 which is not attached to the base substrate 120 remains on the semiconductor substrate 100, and thus a projection 126 is formed at the peripheral portion of the semiconductor substrate 121 after separation. The projection 126 has a remaining embrittlement layer 127, a remaining semiconductor layer 125, and a remaining insulating film 123. The semiconductor film 124 which is smaller than the semiconductor substrate 100 is bonded to the base substrate 120.

Note that in Embodiment 1 or 2, the semiconductor substrate 121 after separation may be formed by following the steps up to Step C described in this embodiment.

Next, described is a process of removing the separation surface 133 and planarizing the surface of the semiconductor film 124 which is bonded to the base substrate 120 to recover crystallinity. The following process corresponds to Step D (a finishing process of an SOI substrate) in FIG. 6.

Figure 4C:
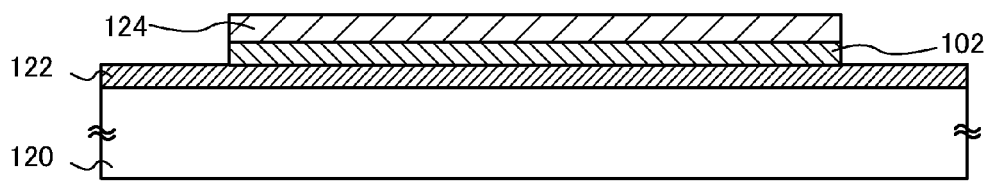

The separation surface 133 on the semiconductor film 124 which is attached to the base substrate 120 has a crystal defect and the planarity is diminished due to formation of the embrittlement layer 104 and separation of the semiconductor substrate 100 along the embrittlement layer 104. Therefore, as illustrated in FIG. 4C, the separation surface 133 may be removed by polishing and a surface of the semiconductor film 124 may be planarized (this step corresponds to Step D-1 in FIG. 6). Although not necessarily essential, the planarization makes it possible to improve characteristics of the interface between the semiconductor film and a gate insulating film that is to be formed later. Specifically, polishing can be performed by a chemical mechanical polishing method (a CMP method), a liquid jet polishing method, or the like. Here, simultaneously with the removal of the separation surface 133, the semiconductor film 124 is polished to be a thin film in some cases.

Alternatively, the separation surface 133 may be removed by a etching treatment so that the semiconductor film 124 is planarized. The etching treatment may be performed using a dry etching method, for example, reactive ion etching (RIE), inductively coupled plasma (ICP) etching, electron cyclotron resonance (ECR) etching, parallel-plate (capacitively coupled type) etching, magnetron plasma etching, dual-frequency plasma etching, helicon wave plasma etching, or the like. Note that both the above polishing and etching treatments may be employed so that the separation surface 133 is removed and the surface of the semiconductor film 124 is planarized.

Furthermore, by the polishing and etching treatments, in addition to the planarization of a surface of the semiconductor film 124, the semiconductor film 124 can be made to such a thin film that is suitable for a semiconductor element which is fabricated later.

Laser irradiation may be performed on the separation surface 133 and the semiconductor film 124 in order to reduce the crystal defects and improve the planarity (this step corresponds to Step D-2 in FIG. 6).

In the case where the separation surface 133 is removed and the surface of the semiconductor film 124 is planarized by dry etching before the laser irradiation, damages such as crystal defects might occur at the surface of the semiconductor film 124 due to the dry etching. However, the laser irradiation can also repair the damages caused by the dry etching.

Since an increase in temperature of the base substrate 120 can be suppressed in this laser irradiation step, a substrate having low heat resistance can be used as the base substrate 120. It is preferable that the separation surface 133 be completely melted and the semiconductor film 124 be partly melted by the laser irradiation. This is because when the semiconductor film 124 is completely melted, the recrystallization of the semiconductor film 124 is accompanied with disordered nucleation of the semiconductor film 124 in a liquid phase and crystallinity of the semiconductor film 124 is lowered. By partly melting the semiconductor film 124, so-called longitudinal growth in which crystal growth proceeds from an unmelted solid portion occurs in the semiconductor film 124. Due to the recrystallization by the longitudinal growth, crystal defects of the semiconductor film 124 are decreased and crystallinity thereof is recovered. The state in which the semiconductor film 124 is completely melted means the state in which the semiconductor film 124 is melted to be in a liquid state to the interface with the insulating film 102. On the other hand, the state where the semiconductor layer 124 is partly melted means that an upper part thereof is melted and is in a liquid phase and a lower part thereof is in a solid phase.

Next, after the laser irradiation, the surface of the semiconductor film 124 may be etched. When the surface of the semiconductor film 124 is etched after the laser irradiation, the separation surface 133 on the semiconductor film 124 is not necessarily etched before the laser irradiation. Moreover, when the separation surface 133 on the semiconductor film 124 is etched before the laser irradiation, the surface of the semiconductor film 124 is not necessarily etched after the laser irradiation. Alternatively, the etching may be performed both before and after the laser irradiation.

By the above-described etching treatment, the surface of the semiconductor film 124 is planarized, and the semiconductor film 124 can be reduced in thickness so as to be suitable for the semiconductor element that is formed later.

After the laser irradiation, the semiconductor film 124 is preferably subjected to a heat treatment at higher than or equal to 500° C. and lower than or equal to 650° C. (this step corresponds to Step D-3 in FIG. 6). By this heat treatment, the defects of the semiconductor film 124 which are not repaired by the laser irradiation can be eliminated and distortion of the semiconductor film 124 can be alleviated. For this heat treatment, a rapid thermal annealing (RTA) apparatus, a resistive heating furnace, or a microwave heating apparatus can be used. For the RTA apparatus, a gas rapid thermal annealing (GRTA) apparatus or a lamp rapid thermal annealing (LRTA) apparatus can be used. For example, when a resistance heating furnace is used, the heat treatment may be performed at 600° C. for 4 hours. The thus manufactured SOI substrate is illustrated in FIG. 4C.

An example in which a semiconductor device is manufactured by using the thus manufactured SOI substrate is described with reference to FIG. 7. Note that a process described below corresponds to Process F (a device process) in FIG. 6.

Figure 7:
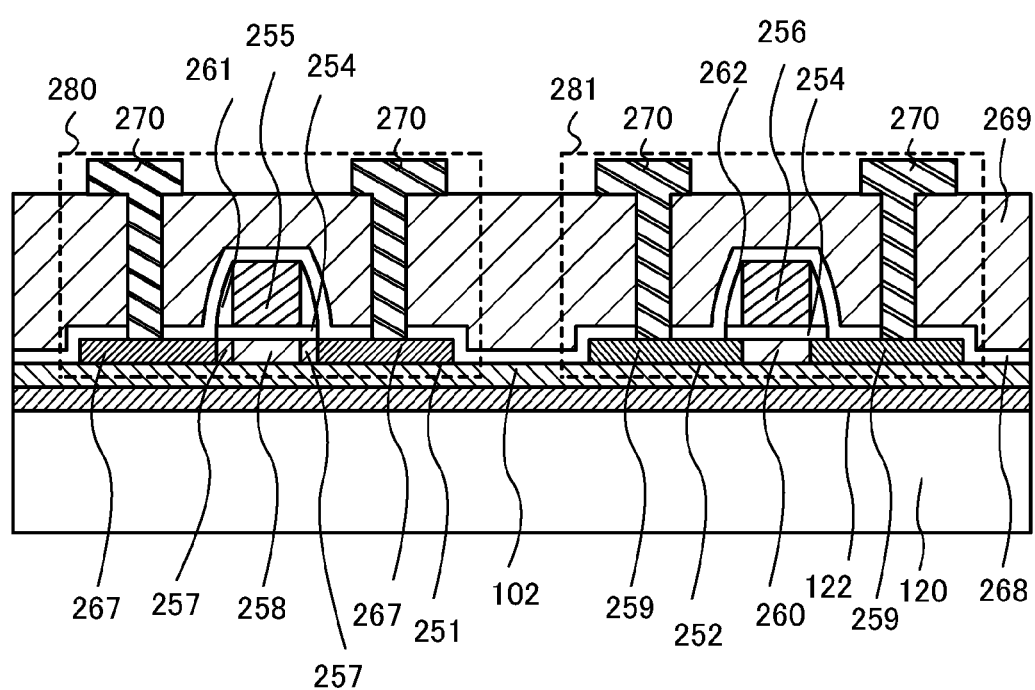
FIG. 7 illustrates a semiconductor device using an SOI substrate according to one embodiment of the present invention.

FIG. 7 illustrates an example of a semiconductor device including a transistor 280 which is an n-channel thin film transistor, and a transistor 281 which is a p-channel thin film transistor. A variety of semiconductor devices can be manufactured by combining a plurality of thin film transistors (TFTs).

The SOI substrate manufactured by the method described in this embodiment is used, and the transistors 280 and 281 are formed over the base substrate 120 with insulating films 102 and 122 interposed therebetween.

Next, a method for manufacturing the semiconductor device illustrated in FIG. 7 is described.

As described above in this embodiment, the SOI substrate including a semiconductor film over the base substrate 120 with the insulating films 102 and 122 interposed therebetween is manufactured.

The semiconductor film is separated into each element by etching to form island-shaped semiconductor films 251 and 252 as illustrated in FIG. 7. The semiconductor film 251 is included in an n-channel TFT, and the semiconductor film 252 is included in a p-channel TFT.

An insulating film 254 is formed over the semiconductor films 251 and 252. Then, a gate electrode 255 is formed over the semiconductor film 251 with the insulating film 254 interposed therebetween, and a gate electrode 256 is formed over the semiconductor film 252 with the insulating film 254 interposed therebetween.

Before the semiconductor film is etched, an impurity element which serves as an acceptor, such as boron, aluminum, or gallium, or an impurity element which serves as a donor, such as phosphorus or arsenic, is preferably added into the semiconductor film in the SOI substrate so that the threshold voltage of the TFTs is controlled. For example, an impurity element which serves as an acceptor is added into a region where an n-channel TFT is to be formed, and an impurity element which serves as a donor is added to a region where a p-channel TFT is to be formed.

Next, n-type low-concentration impurity regions 257 are formed in the semiconductor film 251, and p-type high-concentration impurity regions 259 are formed in the semiconductor film 252. Specifically, first, the n-type low-concentration impurity regions 257 are formed in the semiconductor film 251. For this purpose, the semiconductor film 252 where the p-channel TFT is formed is covered with a resist mask, and an impurity element is added into the semiconductor film 251. As the impurity element, phosphorus or arsenic may be added. When an impurity element is added by an ion doping method or an ion implantation method, the gate electrode 255 serves as a mask, and the n-type low-concentration impurity regions 257 are formed in the semiconductor film 251 in a self-aligned manner. A region of the semiconductor film 251 which overlaps with the gate electrode 255 serves as a channel formation region 258.

Next, after the mask which covers the semiconductor film 252 is removed, the semiconductor film 251 where the n-channel TFT is formed is covered with a resist mask. Next, an impurity element is added into the semiconductor film 252 by an ion doping method or an ion implantation method. As the impurity element, boron, aluminum, gallium, or the like can be added. At the step of adding an impurity element, the gate electrode 256 serves as a mask and the p-type high-concentration impurity regions 259 are formed in the semiconductor film 252 in a self-aligned manner. The high-concentration impurity regions 259 function as a source region and a drain region. A region of the semiconductor film 252 which overlaps with the gate electrode 256 serves as a channel formation region 260. Here, the method is described in which the p-type high-concentration impurity regions 259 are formed after the n-type low-concentration impurity regions 257 are formed; however, the p-type high-concentration impurity regions 259 can be formed first.

Next, after the resist which covers the semiconductor film 251 is removed, an insulating film having a single layer structure of a nitrogen compound such as silicon nitride or an oxide such as silicon oxide or a stacked layer structure thereof is formed by a plasma CVD method or the like. This insulating film is anisotropically etched in a perpendicular direction, whereby sidewall insulating films 261 and 262 are formed in contact with side surfaces of the gate electrodes 255 and 256 respectively. By this anisotropic etching, the insulating film 254 is also etched.

Next, the semiconductor film 252 is covered with a resist. In order to form high-concentration impurity regions serving as a source region and a drain region in the semiconductor film 251, an impurity element is added into the semiconductor film 251 at high dose by an ion implantation method or an ion doping method. The gate electrode 255 and the sidewall insulating film 261 serve as masks, and n-type high-concentration impurity regions 267 are formed. Next, a heat treatment for activating the impurity elements is performed.

After the heat treatment for activation, an insulating film 268 containing hydrogen is formed. After the insulating film 268 is formed, the heat treatment is performed at a temperature of from 350° C. to 450° C., by which hydrogen contained in the insulating film 268 is diffused into the semiconductor films 251 and 252. The insulating film 268 can be formed by deposition of silicon nitride or silicon nitride oxide by a plasma CVD method at a process temperature of 350° C. or lower. The supply of hydrogen to the semiconductor films 251 and 252 makes it possible to efficiently compensate defects which are to be trapping centers in the semiconductor films 251 and 252 and at an interface with the insulating film 254.

After that, an interlayer insulating film 269 is formed. The interlayer insulating film 269 can be formed using a film having a single layer structure or a stacked layer structure selected from insulating films formed using inorganic materials, such as a silicon oxide film and a borophosphosilicate glass (BPSG) film, and organic resin films formed using polyimide, an acrylic resin, and the like. After contact holes are formed in the interlayer insulating film 269, wirings 270 are formed. The wirings 270 can be formed with a conductive film with a three-layer structure in which a low-resistance metal film such as an aluminum film or an aluminum-alloy film is sandwiched between barrier metal films. The barrier metal films can be formed using metal films which contain molybdenum, chromium, titanium, and/or the like.

Through the steps described above, a semiconductor device having the n-channel TFT and the p-channel TFT can be manufactured. In a manufacturing process of an SOI substrate used for a semiconductor device in this embodiment, a reprocessing treatment of a semiconductor substrate after separation is performed, whereby a plurality of semiconductor films are formed using one semiconductor substrate; therefore, a reduction in manufacturing cost and improvement in productivity can be achieved.

Although a semiconductor device and a method for manufacturing the semiconductor device is described with reference to FIG. 7, a high added value semiconductor device can be manufactured by forming a variety of circuit elements such as a capacitor and a resistor together with the TFT.

The SOI substrate described in this embodiment can be used in manufacturing any kind of semiconductor devices including microprocessors, integrated circuits such as image processing circuits, RF tags for transmitting and receiving data with an interrogator without contact, semiconductor display devices, and the like. The semiconductor display device includes in its category, a liquid crystal display device, a light-emitting device provided with a light-emitting element typified by an organic light-emitting diode (an OLED) in each pixel, a digital micromirror device (a DMD), a plasma display panel (a PDP), a field emission display (an FED), and the like, and also includes another semiconductor display device having a circuit element using a semiconductor film in a driver circuit.

Next, a process of performing the reprocessing treatment on the semiconductor substrate 121 after separation to repeatedly use the semiconductor substrate 121 after separation as a reprocessed semiconductor substrate is described. The following process corresponds to Process E (a bond substrate reprocessing treatment process) in FIG. 6.

Figure 5A:
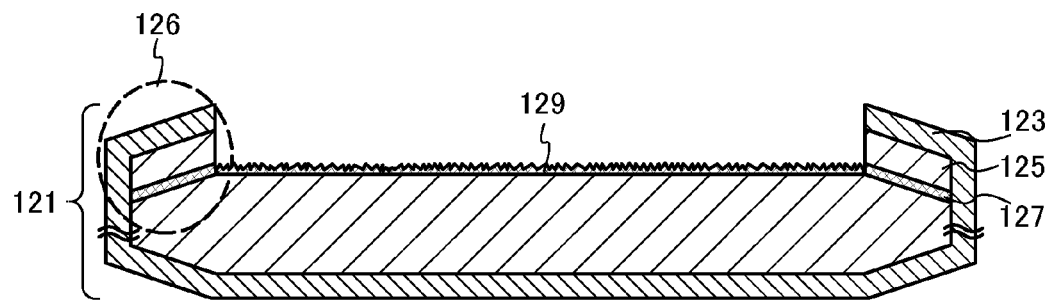
FIGS. 5A to 5C illustrate the method for manufacturing an SOI substrate according to one embodiment of the present invention.

First, the semiconductor substrate 121 after separation illustrated in FIG. 5A is taken out from apparatuses used for the heat treatment. The projection 126 is formed in the peripheral portion of the semiconductor substrate 121 after separation. The projection 126 has the remaining embrittlement layer 127, the remaining semiconductor layer 125, and the remaining insulating film 123 in this order from the semiconductor substrate side. There are crystal defects in the semiconductor layer 125 and the embrittlement layer 127 due to the above-described ion irradiation. In addition, there are crystal defects also on the separation surface 129 of the semiconductor substrate 121 after separation, and the planarity is diminished.

Figure 5B:
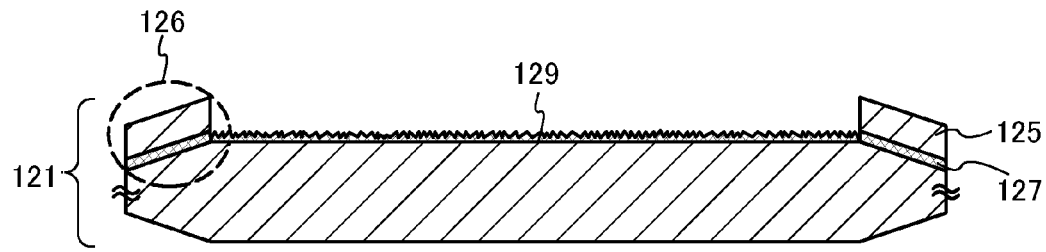

Next, as illustrated in FIG. 5B, a first etching treatment is performed so that the insulating film 123 on the semiconductor substrate 121 after separation is removed (this step corresponds to Step E-1 in FIG. 6). In this embodiment, the first etching treatment is performed by wet etching as an example, but dry etching may also be performed as long as the insulating film 123 can be removed. The insulating film 123 can be removed by a wet etching treatment using a solution containing hydrofluoric acid as an etchant. As a solution containing hydrofluoric acid, a mixed solution containing hydrofluoric acid, ammonium fluoride, and a surfactant (e.g. manufactured by Stella Chemifa Corporation, product name: LAL500) is preferably used. This first etching treatment is preferably performed for 120 seconds to 1200 seconds, for example, about 600 seconds. Further, the wet etching treatment is performed in such a manner that the semiconductor substrate 121 after separation is soaked in a solution in a treatment tank; therefore, a plurality of the semiconductor substrates 121 after separation can be processed collectively. The removal of the insulating film 123 by the wet etching treatment allows reducing the thickness of a removed portion of the semiconductor substrate 121 after separation in the subsequent second etching treatment, and shortening wet etching time. Since the wet etching treatment is performed in such a manner that the semiconductor substrate 121 after separation is soaked in a solution in a treatment tank, a plurality of semiconductor substrates 121 after separation can be processed at a time by batch treatment. Accordingly, the semiconductor substrate can be reprocessed effectively.

Figure 5C:
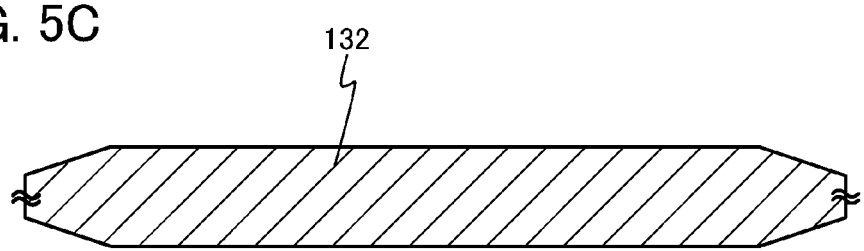

Finally, as illustrated in FIG. 5C, a second etching treatment is performed so that the semiconductor layer 125 and the embrittlement layer 127 included in the projection 126 and the separation surface 129 of the semiconductor substrate 121 after separation are selectively removed to form a reprocessed semiconductor substrate 132 (this step corresponds to Step E-2 in FIG. 6). The semiconductor layer 125, the embrittlement layer 127, and the separation surface 129 can be removed by a wet etching treatment using as an etchant a mixed solution containing a substance functioning as an oxidizer for oxidizing a semiconductor in the semiconductor substrate, a substance dissolving an oxide of the semiconductor, and a substance functioning as a decelerator of the oxidization of the semiconductor and dissolution of the oxide of the semiconductor. This wet etching treatment is preferably performed for about one minute to ten minutes, for example, about two minutes to four minutes. The solution is preferably at a temperature of about 10° C. to 30° C., for example, room temperature.

It is preferable to use nitric acid as the substance functioning as an oxidizer for oxidizing the semiconductor. It is preferable to use hydrofluoric acid as the substance dissolving the oxide of the semiconductor. It is preferable to use acetic acid as the substance functioning as a decelerator of the oxidization of the semiconductor and dissolution of the oxide of the semiconductor. Specifically, it is preferable to use as the etchant a mixed solution having a composition which is obtained by adjusting the volume of 70 wt % nitric acid to more than 0.01 times and less than one time as large as that of 97.7 wt % acetic acid and to more than 0.1 times and less than 100 times as large as that of 50 wt % hydrofluoric acid and further adjusting the volume of 50 wt % hydrofluoric acid to more than 0.01 times and less than 0.3 times as large as that of 97.7 wt % acetic acid. More preferably, the etchant preferably possesses a composition obtained by adjusting the volume of 70 wt % nitric acid to more than or equal to 0.2 times and less than or equal to 0.5 times as large as that of 97.7 wt % acetic acid and to more than or equal to one time and less than or equal to 10 times as large as that of 50 wt % hydrofluoric acid and further adjusting the volume of 50 wt % hydrofluoric acid to more than or equal to 0.1 times and less than or equal to 0.2 times as large as that of 97.7 wt % acetic acid. For example, the volume ratio between 50 wt % hydrofluoric acid, 70 wt % nitric acid, and 97.7 wt % acetic acid is preferably 1:3:10, 1:2:10, 1.5:3:10, 2:2:10, 1:10:20, or 1:1:10.

The mixed solution used as the etchant for the second etching treatment can easily penetrate into the semiconductor layer 125 and the embrittlement layer 127 included in the projection 126, because crystal defects and microvoids caused by the ion irradiation are formed in the semiconductor layer 125 and the embrittlement layer 127. Accordingly, not only the surface of the semiconductor layer 125 but also the inside of the semiconductor layer 125 and the embrittlement layer 127 can be subjected to the wet etching treatment. The wet etching treatment often proceeds in such a manner that a deep hole is formed in a direction perpendicular to the plane surface of the substrate and the hole is expanded. Thus, the wet etching treatment is performed on the semiconductor layer 125 and the embrittlement layer 127 at a higher etching rate than on the other part of the semiconductor substrate 121 after separation which does not include the projection 126.

That is, the semiconductor layer 125 and the embrittlement layer 127 can be removed by the wet etching treatment using as an etchant a mixed solution containing the substance functioning as an oxidizer for oxidizing the semiconductor of the semiconductor substrate, the substance dissolving the oxide of the semiconductor, and the substance functioning as a decelerator of the oxidization of the semiconductor and dissolution of the oxide of the semiconductor. Here, the crystal defects caused by the ion irradiation allow the semiconductor layer 125 and the embrittlement layer 127 to be readily etched. Simultaneously, the separation surface 129 is also readily etched due to the crystal defects therein. However, after removing the separation surface 129, the semiconductor layer 125, and the embrittlement layer 127, a surface of the semiconductor layer containing a few crystal defects which is located thereunder is exposed, resulting in reduction in the etching rate. As a result, the projection 126 is selectively etched, and the portion of the semiconductor substrate 121 after separation other than the projection 126 can be prevented from being reduced in thickness in the reprocessing treatment compared with the projection 126, which results in a reduction in the thickness of a removed portion of the reprocessed semiconductor substrate 132 and contributes to an increase in the number of times of reusing the semiconductor substrate.

In addition, in the wet etching treatment, a plurality of semiconductor substrates 121 after separation can be easily processed at the same time by batch treatment; therefore, the semiconductor substrate can be reprocessed effectively. Furthermore, the second etching treatment can be performed in a relatively short time, which makes the reprocessing treatment efficient.

Here, in the case where a semiconductor substrate 132 after separation is not sufficiently plane, polishing can be further performed to improve planarity (this step corresponds to Step E-3 in FIG. 6). In addition, also in the case where a separation surface 129 is not sufficiently removed through the second etching treatment, the polishing is preferably performed to remove the remaining separation surface 129.

As the polishing method of the semiconductor substrate 121 after separation, a chemical mechanical polishing (CMP) method is preferred. Here, the CMP method is a method of planarizing a surface of an object to be processed by a combination of chemical and mechanical actions using the surface as a reference. In general, the CMP method is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The polishing by the CMP method may be performed once or plural times. When the polishing is performed plural times, first polishing is preferably performed with a high polishing rate followed by final polishing with a low polishing rate. At the first polishing, a polyurethane polishing cloth is preferably used, and the grain diameter of the slurry is preferably 120 nm to 180 nm, for example, approximately 150 nm. At the final polishing, a suede polishing cloth is preferably used, and the grain diameter of the slurry is preferably 45 nm to 75 nm, for example, approximately 60 nm. By polishing in this manner, the reprocessed semiconductor substrate 132 can be planarized and made to have a mirror surface with an average surface roughness of approximately 0.2 nm to 0.5 nm. In addition, by combining polishing with different polishing rates, the planarization and formation of a mirror surface can be achieved in a short time.

Thus, by polishing by the CMP method after a semiconductor layer 125 and an embrittlement layer 127 are removed from the semiconductor substrate 121 after separation through the first etching treatment and the second etching treatment, the reprocessed semiconductor substrate 132 can have a highly planar surface.

Through the above steps, the semiconductor substrate 121 after separation is reprocessed into the reprocessed semiconductor substrate 132. The obtained reprocessed semiconductor substrate 132 is reused as the semiconductor substrate 100 in Process A.

As described in this embodiment, by repeatedly using a semiconductor substrate by a reprocessing treatment of the semiconductor substrate, cost reduction of manufacturing an SOI substrate can be achieved. In particular, after the removal of the insulating film, the semiconductor layer and the embrittlement layer remaining in the peripheral portion of the semiconductor substrate after separation can be selectively removed by the second etching treatment using a mixed solution containing a substance functioning as an oxidizer for oxidizing a semiconductor of the semiconductor substrate, a substance dissolving an oxide of the semiconductor, and a substance functioning as a decelerator of the oxidization of the semiconductor and the dissolution of the oxide of the semiconductor. Accordingly, the thickness of a removed portion of the semiconductor substrate can be reduced, and the number of times of reusing the semiconductor substrate can be increased.

Note that the structure described in this embodiment can be combined with any of the structures described in other embodiments as appropriate.

Example 1

In this example, described is a result of comparison among semiconductor substrates after separation (bond substrates) which are by-produced in manufacture of an SOI substrate and are reprocessed by removing a remaining insulating film and then performing the wet etching treatment using a variety of solutions.

In this example, rectangular single crystal silicon substrates each with a diagonal of 5 inches were used as the semiconductor substrates. First, thermal oxidation was performed on each of the semiconductor substrates in an atmosphere of HCl to form a thermal oxide film with a thickness of 100 nm. At this time, thermal oxidation was performed in an atmosphere containing HCl at 3 vol % with respect to oxygen at 950° C. for four hours.

Next, each of the semiconductor substrates was irradiated with hydrogen ions through a surface of the thermal oxide film by using an ion doping apparatus. In this example, by irradiation with ionized hydrogen, an embrittlement layer was formed in each of the semiconductor substrates. The ion doping was performed with an accelerating voltage of 40 kV at a dose of $2.0 \times 10^{16}$ ions/cm$^2$.

Then, each of the semiconductor substrates was bonded to a glass substrate with the thermal oxide film interposed therebetween. After that, a heat treatment at 200° C. for 120 minutes and then a heat treatment at 600° C. for 120 minutes were performed, so that at the embrittlement layer, a thin film single crystal silicon layer was separated from the semiconductor substrate. Thus, SOI substrates each including a single crystal silicon film over the glass substrate with the thermal oxide film interposed therebetween and semiconductor substrates each provided with a projection in the peripheral portion having the remaining insulating film (i.e., the remaining thermal oxide film), a remaining single crystal silicon layer, and a remaining embrittlement layer were manufactured.

In a manner described above, the semiconductor substrates each provided with a projection in the peripheral portion having the remaining insulating film, the remaining single crystal silicon layer, and the remaining embrittlement layer were prepared. Then, in order to remove the thermal oxide film which was formed to cover each of the semiconductor substrate and the remaining insulating film which remained in the projection, the wet etching treatment was performed on the semiconductor substrates using a mixed solution containing hydrofluoric acid, ammonium fluoride, and a surfactant (e.g. manufactured by Stella Chemifa Corporation, product name: LAL500) as an etchant. At this time, the solution temperature was room temperature and the etching time was 300 seconds.

The thus prepared semiconductor substrates from which the remaining insulating films were removed were next subjected to wet etching using solutions in Table 1 as etchants. Samples are six in total; one is for an example, and five are for comparative examples.

TABLE 1

| Sample | Etchant[1] |
|---|---|
| Example 1 | $HF:HNO_3:CH_3CO_2H$ (1:3:10) |
| Comparative Example 1A | $HF:HNO_3:CH_3CO_2H$ (1:100:100) |
| Comparative Example 1B | $HF:HNO_3:CH_3CO_2H$ (1:0.1:10) |
| Comparative Example 1C | $HF:HNO_3:CH_3CO_2H$ (1:10:10) |
| Comparative Example 1D | $HF:H_2O_2$ (1:5) |
| Comparative Example 1E | NMD3[2] |

[1]The mixture ratios are all represented in volume ratios.
[2]An aqueous solution of tetramethylammonium hydroxide (2.38 wt %)

The etchants prepared and used are the following: a mixed solution in which hydrofluoric acid, nitric acid, and acetic acid are mixed at a volume ratio of 1:3:10 for Example 1; a mixed solution in which hydrofluoric acid, nitric acid, and acetic acid are mixed at a volume ratio of 1:100:100 (hereinafter referred to a mixed solution A) for Comparative Example 1A; a mixed solution in which hydrofluoric acid, nitric acid, and acetic acid are mixed at a volume ratio of 1:0.1:10 (hereinafter referred to as a mixed solution B) for Comparative Example 1B; a mixed solution in which hydrofluoric acid, nitric acid, and acetic acid are mixed at a volume ratio of 1:10:10 (hereinafter referred to as a mixed solution C) for Comparative Example 1C; a mixed solution in which hydrofluoric acid and hydrogen peroxide water are mixed at a volume ratio of 1:5 (hereinafter referred to as a mixed solution D) for Comparative Example 1D; and an aqueous solution containing 2.38 wt % tetramethylammonium hydroxide (TMAH) (manufactured by Tokyo Ohka Kogyo Co., Ltd., product name: NMD3, hereinafter referred to as NMD3). Note that the chemical agents used for preparing the mixed solutions in this example are the following: hydrofluoric acid at a concentration of 50 wt % manufactured by Stella Chemifa Corporation; nitric acid at a concentration of 70 wt % manufactured by Wako Pure Chemical Industries, Ltd.; acetic acid at a concentration of 97.7 wt % manufactured by Kishida Chemical Co., Ltd.; and hydrogen peroxide water at a concentration of 31 wt % manufactured by Mitsubishi Gas Chemical Company, Inc. In etching steps, the etchant temperature was room temperature and the etching time was 30 sec., 1 min., 2 min., 4 min., 6 min., and 8 min.

The six solutions were used for the wet etching treatment of respective semiconductor substrate for each of the above-described time, and steps formed in the peripheral portions of each of the substrates were measured by Surfcoder ET4100 (a step measurement apparatus) manufactured by Kosaka Laboratory Ltd., and amounts of the etched semiconductor substrates in the center portion of the substrates were measured by Sorter 1000 manufactured by Lapmaster SFT Corp. For Example 1, the peripheral portion of the substrate was photographed by an optical microscope, MX61L manufactured by Olympus Corporation. Note that the optical microphotographs were taken as Nomarski images at 50-fold magnification and 500-fold magnification. Note also that in this example, the center portion of the substrate refers to a region other than the peripheral portion of the substrate where the projection is formed.

Figure 10A:
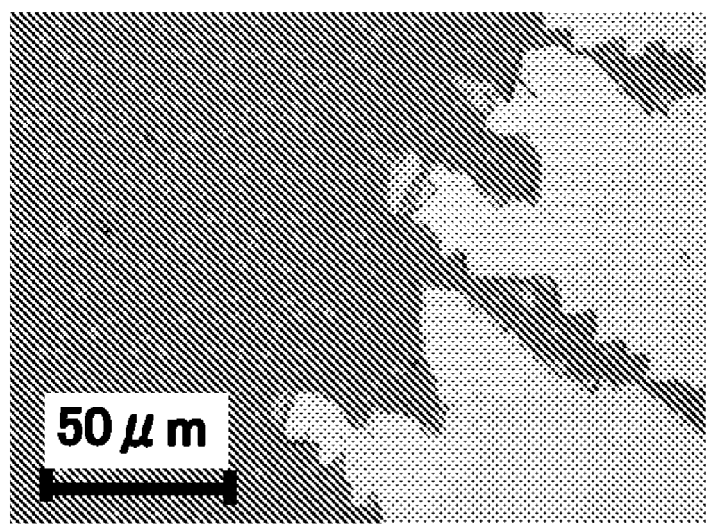
FIGS. 10A and 10B show optical micrographs of the peripheral portion of the semiconductor substrate just after the separation and that after removing the insulating film, respectively, in Example 1.
Figure 10B:
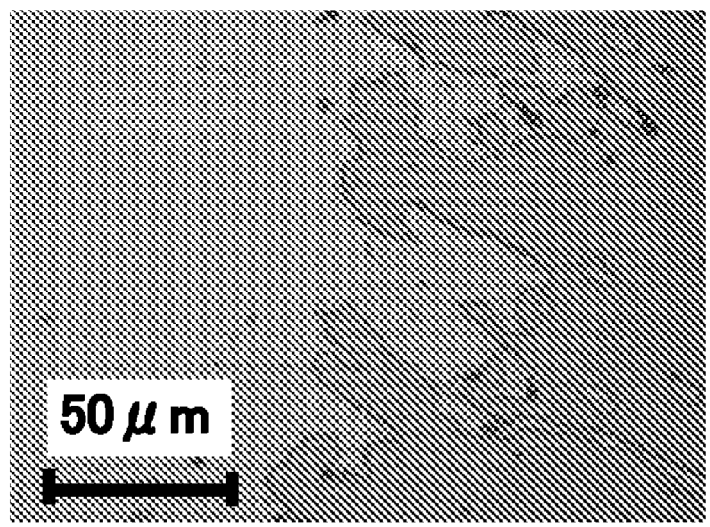
Figure 11A:
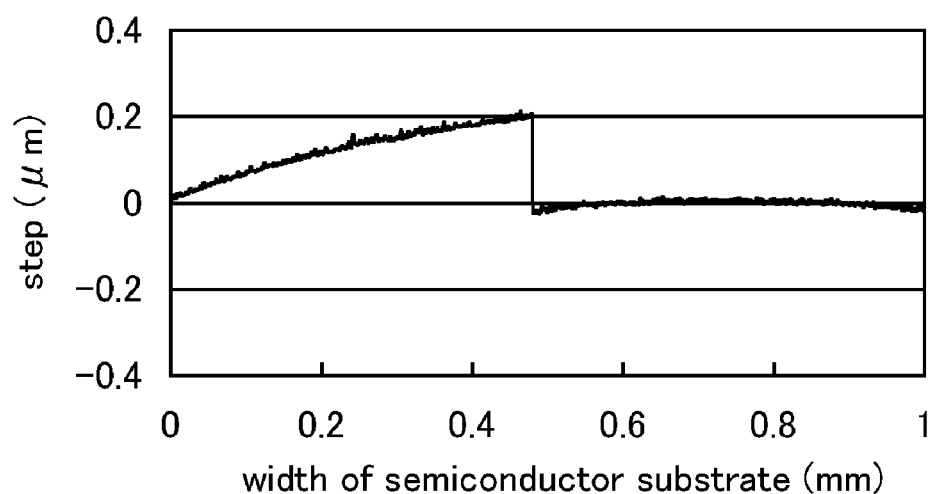
FIGS. 11A and 11B are graphs showing a relation between the width and the step of the semiconductor substrate in Example 1.
Figure 11B:
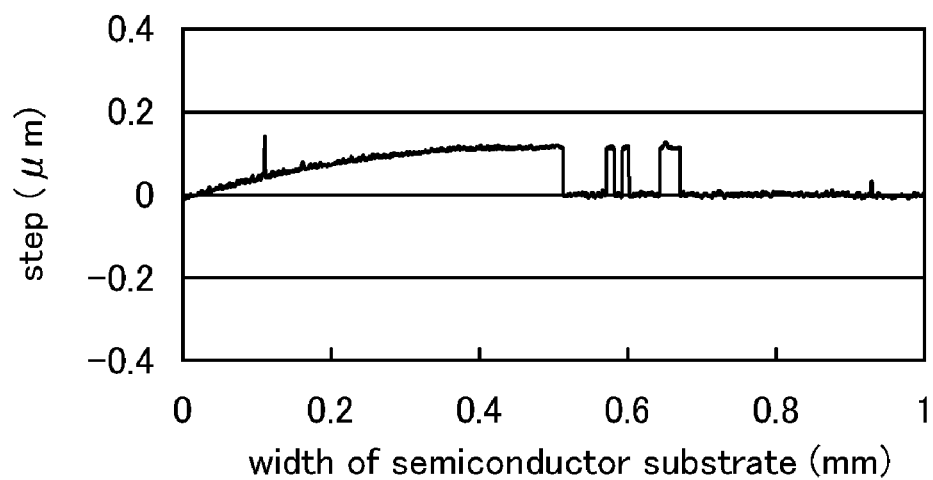
Figure 12A:
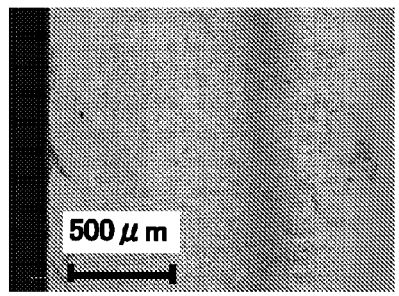
FIGS. 12A to 12C show optical micrographs of the peripheral portion of the semiconductor substrate in Example 1.
Figure 12A:
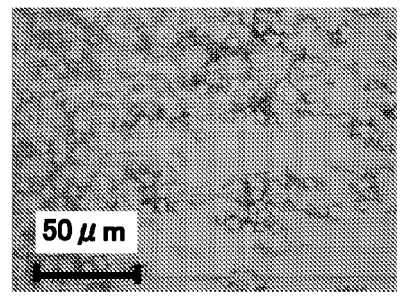
Figure 12B:
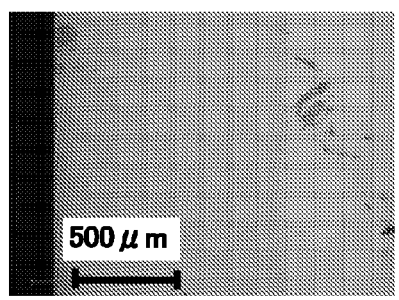
Figure 12B:
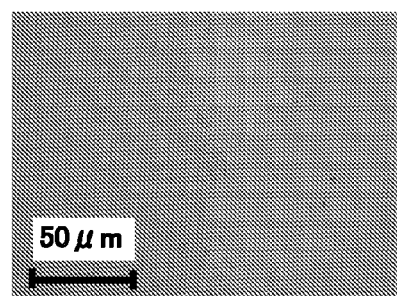
Figure 12C:
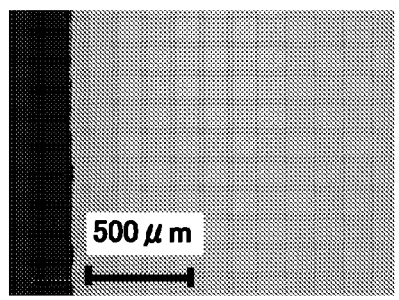
Figure 12C:
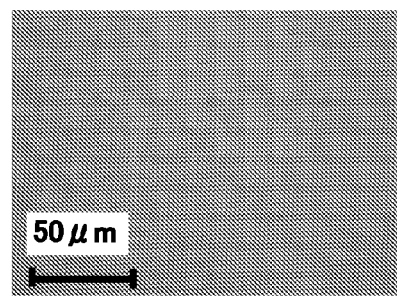

FIGS. 10A and 10B respectively show an optical micrograph of the peripheral portion which was taken immediately after separation of the semiconductor substrate and an optical micrograph of the same portion which was taken after removal of the insulating film. FIGS. 11A and 11B show step measurement results of the peripheral portions of the substrates, which are respectively corresponding to FIGS. 10A and 10B. In the graphs showing the step measurement results, the vertical axis represents a step (μm) where the center portion of the substrate is a reference (0) and the horizontal axis represents the width (mm) of the semiconductor substrate. This can be applied to the other graphs showing step measurement results below.

In FIGS. 10A and 10B, the left side is the projection in the peripheral portion of the substrate. In FIG. 10A, the remaining insulating film can be seen on the left, whereas in FIG. 10B, the remaining insulating film on the left is removed and the remaining single crystal silicon layer can be seen. On the right, a crystal silicon layer in the center portion of the substrate can be seen. The same results can be obtained from the graphs showing step measurement results in FIGS. 11A and 11B; in FIG. 11A, the step between the peripheral portion of the substrate and the center portion of the substrate is approximately 0.2 μm, whereas in FIG. 11B, the step between the peripheral portion of the substrate and the center portion of the substrate is lowered to approximately 0.1 μm because the remaining insulating film was removed. In the peripheral portion of the substrate, which is the left side in FIGS. 10A and 10B, it can be assumed that its planarity is low because crystal defects or microvoids formed by hydrogen doping leads to the unevenness.

FIGS. 12A1 and 12A2, FIGS. 12B1 and 12B2, FIGS. 12C1 and 12C2, FIGS. 13A1 and 13A2, FIGS. 13B1 and 13B2, and FIGS. 13C1 and 13C2 show optical micrographs of the peripheral portion of the semiconductor substrate of Example 1 which was etched for 30 sec., 1 min., 2 min., 4 min., 6 min., and 8 min, respectively. FIGS. 12A1, 12B1, and 12C1, and FIGS. 13A1, 13B1, and 13C1 are optical micrographs at 50-fold magnification, and FIGS. 12A2, 12B2, and 13C2, and FIGS. 13A2, 13B2, and 13C2 are optical micrographs at 500-fold magnification. FIGS. 14A to 14C and FIGS. 15A to 15C show step measurement results of the peripheral portion of the substrate of Example 1, corresponding to FIGS. 12A1 and 12A2, FIGS. 12B1 and 12B2, and FIGS. 12C1 and 12C2, FIGS. 13A1 and 13A2, FIGS. 13B1 and 13B2, and FIGS. 13C1 and 13C2, respectively. FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, FIGS. 23A to 23C, FIGS. 24A to 24C, and FIG. 25A to FIG. 25C show step measurement results of peripheral portions of substrates which were obtained by etching semiconductor substrates of Comparative Example 1A (see FIGS. 16A to 16C and FIGS. 17A to 17C), Comparative Example 1B (see FIGS. 18A to 18C and FIGS. 19A to 19C), Comparative Example 1C (see FIGS. 20A to 20C and FIGS. 21A to 21C), Comparative Example 1D (see FIGS. 22A to 22C and FIGS. 23A to 23C), and Comparative Example 1E (see FIGS. 24A to 24C and FIGS. 25A to 25C), for 30 sec., 1 min., 2 min., 4 min., 6 min., and 8 min.

Figure 26:
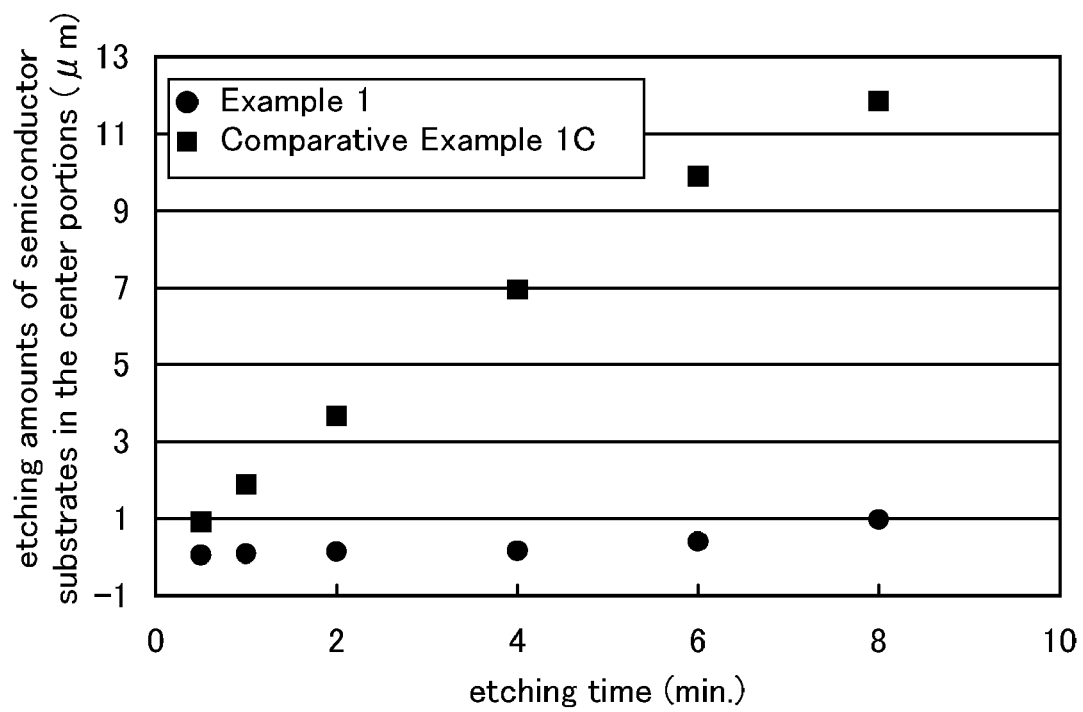
FIG. 26 shows a relation between time for etching treatment and an amount etched in Example 1 and Comparative Example 1C.

FIG. 26 shows measurement results of etching amounts of semiconductor substrates in the center portions of the substrates which were removed by the wet etching treatment in Example 1 and Comparative Example 1C. In FIG. 26, circular data markers represent Example 1, and quadrangular data markers represent Comparative Example 1C. The vertical axis in FIG. 26 represents an etching amount (μm) of the semiconductor substrate in the center portion of the semiconductor substrate and the horizontal axis represents etching time (min)) thereof. For the measurement of the etching amount of the semiconductor substrates in the center portions of the substrates, calculation was performed using changes in thickness of the semiconductor substrates in the center portions of the substrates before and after the etching. The thickness of the semiconductor substrates was calculated by differences of displacements, which were measured by a laser displacement sensor provided above and under a measurement stage of Sorter 1000 manufactured by Lapmaster SFT Corp. Here, the measurement was performed on 10 points×10 points in a region of 107 mm square which is centered on the substrate, and the etching amount of the center portion of the semiconductor substrate was obtained using the average values of the measurement results. The repetition accuracy of the laser displacement sensor is ±0.05 μm, and the repetition accuracy of the thickness of the semiconductor substrate is ±0.5 μm which is a value guaranteed by the maker. LK-G30 manufactured by Keyence Corporation was used as the laser displacement sensor.

Figure 13A:
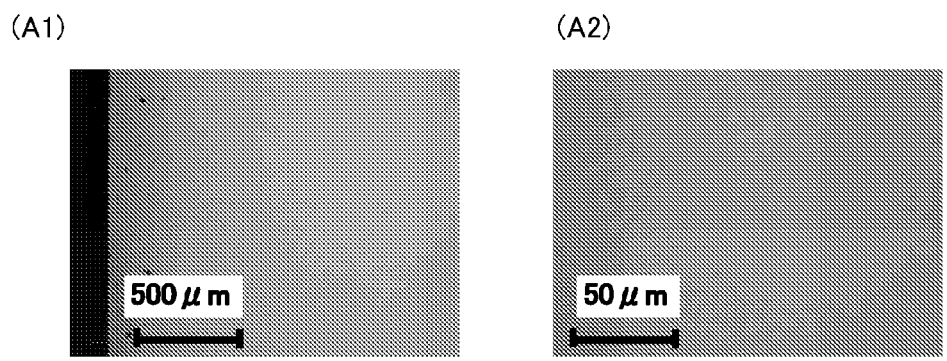
FIGS. 13A to 13C show optical micrographs of the peripheral portion of the semiconductor substrate in Example 1.
Figure 13B:
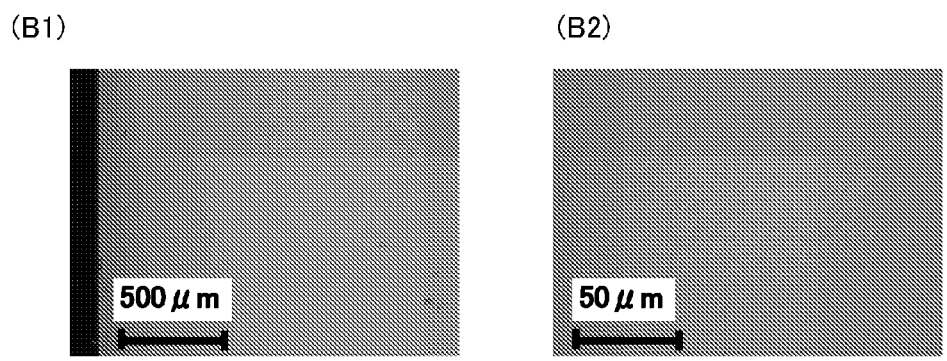
Figure 13C:
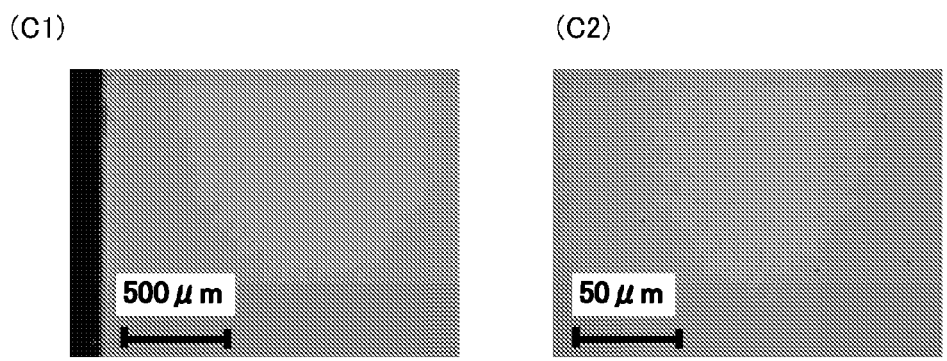
Figure 14A:
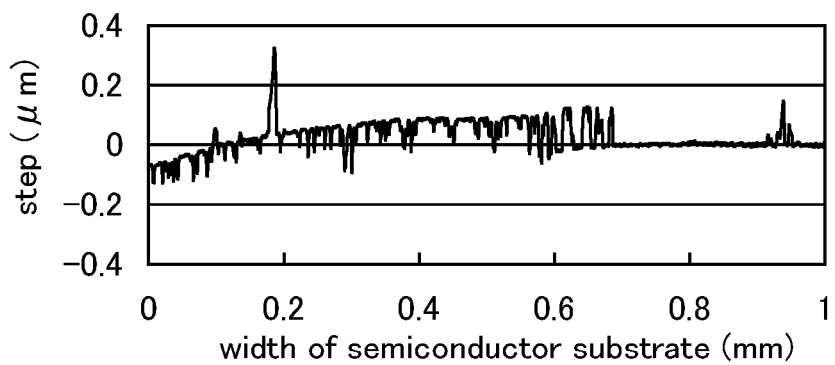
FIGS. 14A to 14C are graphs showing a relation between the width and the step of the semiconductor substrate in Example 1.
Figure 14B:
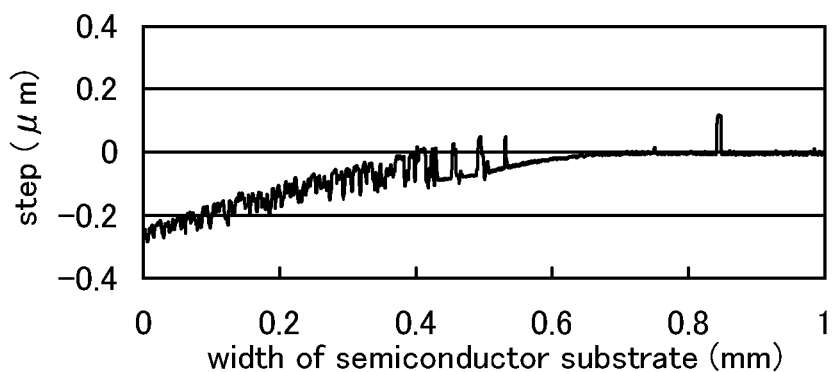
Figure 14C:
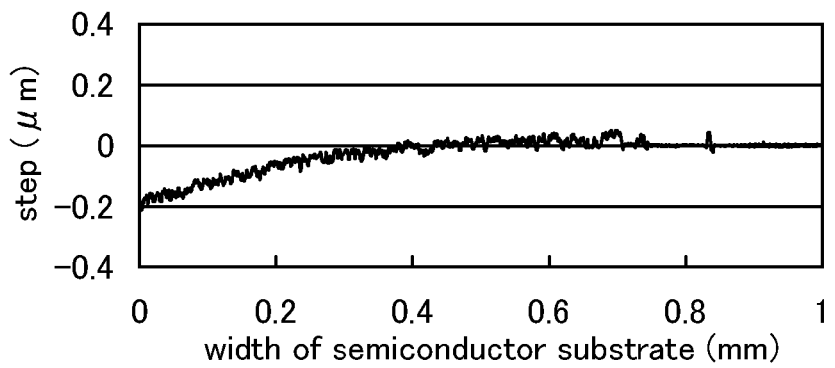

First, as seen in the optical micrographs in FIGS. 12A1 to 12C2 and FIGS. 13A1 to 13C2 of Example 1, steps in the left side of the photographs resulted from a remaining single crystal silicon layer having defects or the like were reduced as etching time increased. In FIGS. 13A1 and 13A2, which are photographs at the etching time of 4 min., the steps were almost removed. The same conclusion can be obtained from FIGS. 14A to 14C and FIGS. 15A to 15C showing graphs of the step measurement. In addition, FIGS. 14A to 14C and FIGS. 15A to 15C indicate that the etching first proceeds to form a deep hole in the projection in the peripheral portion of the substrate in a direction perpendicular to a planar surface of the substrate and then the hole is expanded to result in reduction in the step caused by the projection. This indicates that the remaining single crystal silicon layer forming the projection has defects or microvoids which are formed by hydrogen doping and that the mixed solution containing hydrofluoric acid, nitric acid, and acetic acid at a volume ratio of 1:3:10, which was used in Example 1, penetrates and etches the remaining single crystal silicon layer from the inside thereof. This tendency of the wet etching treatment using the mixed solution of hydrofluoric acid, nitric acid, and acetic acid at a volume ratio of 1:3:10 differs from a tendency of the wet etching using other etchants described below.

From the graph in FIG. 26 showing etching amounts of the semiconductor substrate in the center portion of the substrate of Example 1, the etching amounts of the semiconductor substrate in the center portion are within the range of errors of the thickness measurement of the semiconductor substrates until the etching time is 6 min., whereas it is slightly increased when the etching time is more than 6 min

TABLE 2

| Etching time (min) | Etching amount in center portion (μm) | Etching amount in peripheral portion (μm) | Selectivity 1 | Selectivity 2 |
|---|---|---|---|---|
| 1 | 0.096 | 0.101 | 1.054 | 2.818 |
| 2 | 0.14 | 0.225 | 1.611 | |
| 4 | 0.163 | 0.285 | 1.750 | 2.609 |

Here, Table 2 shows the etching amounts of the semiconductor substrate in the center portion (μm), the etching amounts of the semiconductor substrate in the peripheral portion (μm), selectivity of the etching amounts of the semiconductor substrate in the peripheral portion with respect to the center portion of the substrate at etching times of 1 min., 2 min., and 4 min (Selectivity 1), and selectivity of differences of the etching amounts of the semiconductor substrate in the peripheral portion with respect to differences of etching amounts of the semiconductor substrate in the center portion at etching times of 1 min. to 2 min., and 2 min to 4 min (Selectivity 2). From calculation of the etching selectivities between the peripheral portion of the semiconductor substrate and the center portion thereof at etching times of 2 min and 4 min., it was revealed that high selectivities were obtained, which were 1.611 and 1.750. In addition, the selectivities between differences of the etching amounts of the semiconductor substrate in the peripheral portion and the center portion at etching times of 1 min to 2 min and 2 min to 4 min were also high, which were 2.818 and 2.609. Note that each etching selectivity between the peripheral portion of the substrate and the center portion thereof was obtained by dividing average values of the etching amounts of the semiconductor substrate in a region of 0.1 mm width in the projection in the peripheral portion of the substrate by average values of the etching amounts of the semiconductor substrate in a region of 0.1 mm width in the center portion thereof. Thus, by using the mixed solution of Example 1 containing hydrofluoric acid, nitric acid, and acetic acid at a volume ratio of 1:3:10 as an etchant, the projection in the peripheral portion of a semiconductor substrate was selectively etched in a short time.

As to the semiconductor substrate of Comparative Example 1A which was subjected to the reprocessing treatment using the mixed solution A, the graphs of step measurement in FIGS. 16A to 16C and FIGS. 17A to 17C indicate that etching proceeds slowly and the projection is not completely removed even when the etching time was 8 min. Different from Example 1, the step in the peripheral portion of the substrate is gradually reduced from the surface thereof, and a deep hole was not formed unlike the case of using the mixed solution of Example 1 containing hydrofluoric acid, nitric acid, and acetic acid at a volume ratio of 1:3:10. Thus, the projection in the peripheral portion of the substrate was not removed when etching was performed using the mixed solution A. Alternatively, it takes much time to completely remove the projection.

With respect to the semiconductor substrate of Comparative Example 1B which was subjected to the reprocessing treatment using the mixed solution B, the projection in the peripheral portion of the substrate was not removed as shown in FIGS. 18A to 18C and FIGS. 19A to 19C. Thus, etching hardly proceeded on the semiconductor substrate when the mixed solution B was used as an etchant.

For the semiconductor substrate of Comparative Example 1C which was subjected to the reprocessing treatment using the mixed solution C, as shown in FIG. 26, etching amounts of the semiconductor substrate in the center portion were increased in proportion to etching time, yet the shape of the projection in the peripheral portion of the substrate was almost maintained as shown in FIGS. 20A to 20C and FIGS. 21A to 21C. Thus, by using the mixed solution C as an etchant, the entire semiconductor substrate was evenly etched and the projection in the peripheral portion of the substrate was not able to be selectively removed.

As to the semiconductor substrate of Comparative Example 1D which was subjected to the reprocessing treatment using the mixed solution D, as in the case of using the mixed solution B, the projection in the peripheral portion of the substrate was not removed as shown in FIGS. 22A to 22C and 23A to 23C. Thus, etching hardly proceeded on the semiconductor substrate when the mixed solution D was used as an etchant.

Figure 25A:
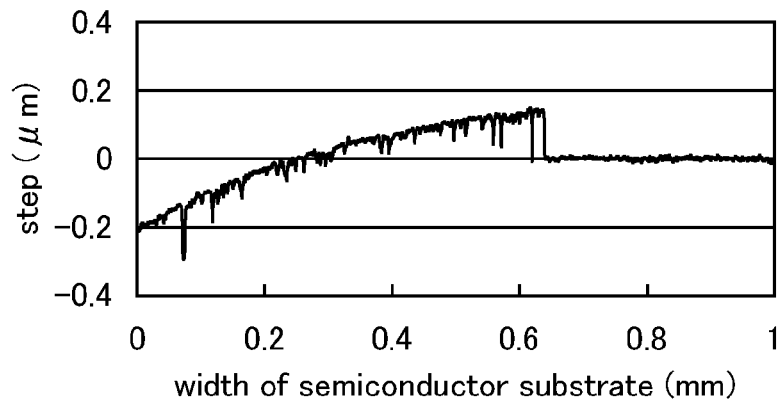
FIGS. 25A to 25C are the graphs showing a relation between the width and the step of the semiconductor substrate in Comparative Example 1E.
Figure 25B:
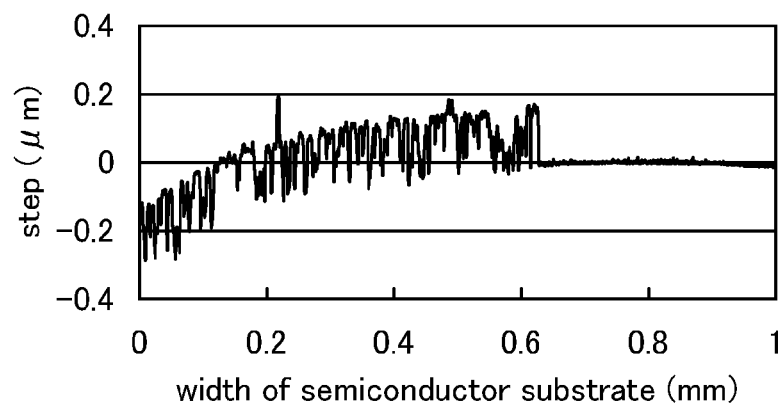
Figure 25C:
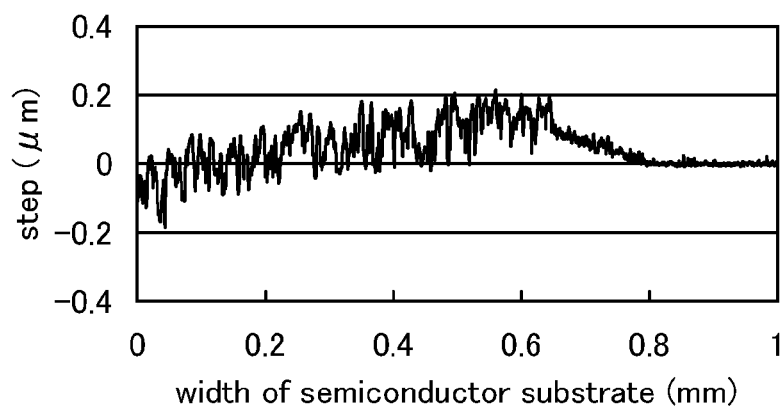

For the semiconductor substrate of Comparative Example 1E which was subjected to the reprocessing treatment using the mixed solution E, as shown in FIGS. 24A to 24C and FIGS. 25A to 25C, a step was not efficiently reduced even when the etching time was 8 min as shown in FIG. 25C. Thus, the projection in the peripheral portion of the semiconductor substrate was not removed when the mixed solution E was used as an etchant. Alternatively, it takes much time to remove the projection.

Here, the mixed solution in Example 1, the mixed solution A, the mixed solution B, and the mixed solution C are ternary mixed solutions of hydrofluoric acid, nitric acid, and acetic acid. Each of the elements serves as follows. Nitric acid oxidizes silicon, and this chemical reaction can be represented as the following formula (1).

$$3Si + 4HNO_3 \rightarrow 3SiO_2 + 2H_2O + 4NO \quad (1)$$

Hydrofluoric acid etches silicon oxide which is formed by oxidizing silicon with nitric acid, and this chemical reaction can be represented as the following formula (2).

$$SiO_2 + 6HF \rightarrow 2H^+ + [SiF_6]^{2-} + 2H_2O \quad (2)$$

Acetic acid stabilizes the mixed solution, functions as a decelerator of the reaction, and reduces etching rate. That is, the ternary mixed solutions of hydrofluoric acid, nitric acid, and acetic acid repeat oxidation of silicon by nitric acid as in the formula (1) and dissolution of the silicon oxide by hydrofluoric acid as in the formula (2), so that the wet etching treatment is performed on single crystal silicon.

Therefore, in the case where the amount of nitric acid is small in a ternary solution of hydrofluoric acid, nitric acid, and acetic acid, oxidation of silicon by nitric acid as in the formula (1) is a rate-controlling step of the wet etching, whereas in the case where the amount of hydrogen acid is small, dissolution of silicon oxide by hydrofluoric acid as in the formula (2) is a rate-controlling step of the wet etching.

Thus, in the case of using the mixed solution B in which hydrofluoric acid, nitric acid, and acetic acid were contained at a volume ratio of 1:0.1:10, since the amount of nitric acid was extremely small, it is assumed that the oxidation of silicon was a rate-controlling step, and the wet etching hardly proceeded on single crystal silicon. The same assumption can be applied to the case using the mixed solution D which contains hydrogen peroxide as an oxidation agent. It is assumed that oxidizing ability of hydrogen peroxide in the mixed solution D was low so that the oxidation of silicon hardly proceeded and the dissolution of silicon oxide by hydrofluoric acid hardly proceeded; as a result, by using the mixed solution D, the wet etching hardly proceeded on single crystal silicon.

In contrast, in the case of using the mixed solution C in which hydrofluoric acid, nitric acid, and acetic acid were contained at a volume ratio of 1:10:10, since the amount of nitric acid is extremely large and the proportion of acetic acid which functions as a decelerator of the reaction was extremely small, it is assumed that the reactions in the formula (1) and formula (2) proceeded extremely fast. As a result, in the remaining single crystal silicon layer in the peripheral portion of the substrate and in the bulk silicon layer in the center portion thereof, reactions proceeded at a similar rate, so that it is assumed that the entire substrate was evenly etched.

Figure 15A:
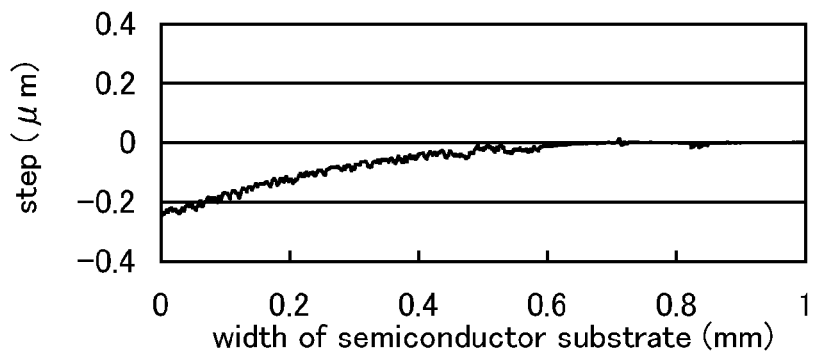
FIGS. 15A to 15C are the graphs showing a relation between the width and the step of the semiconductor substrate in Example 1.
Figure 15B:
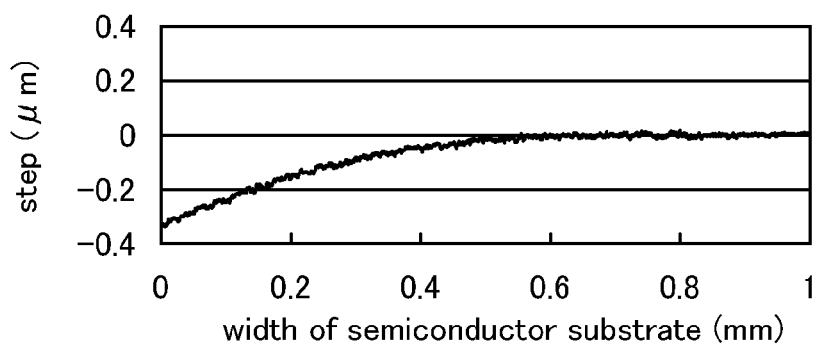
Figure 15C:
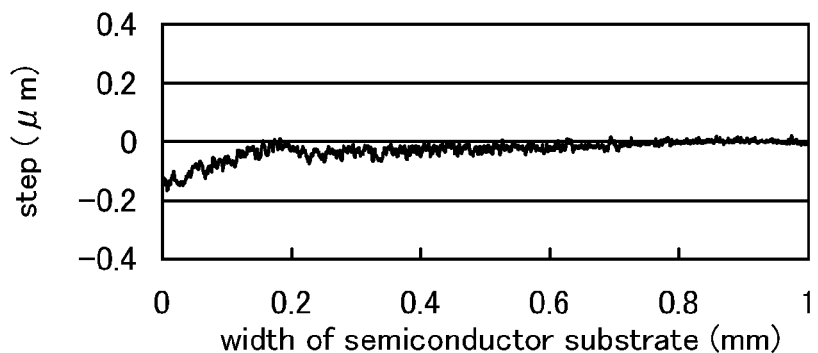
Figure 16A:
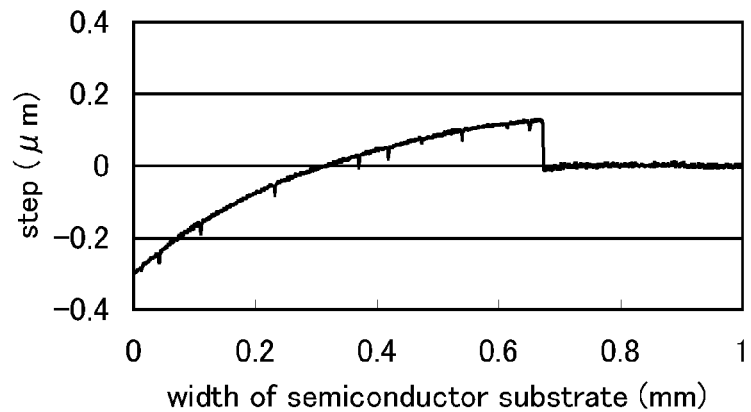
FIGS. 16A to 16C are graphs showing a relation between the width and the step of the semiconductor substrate in Comparative Example 1A.
Figure 16B:
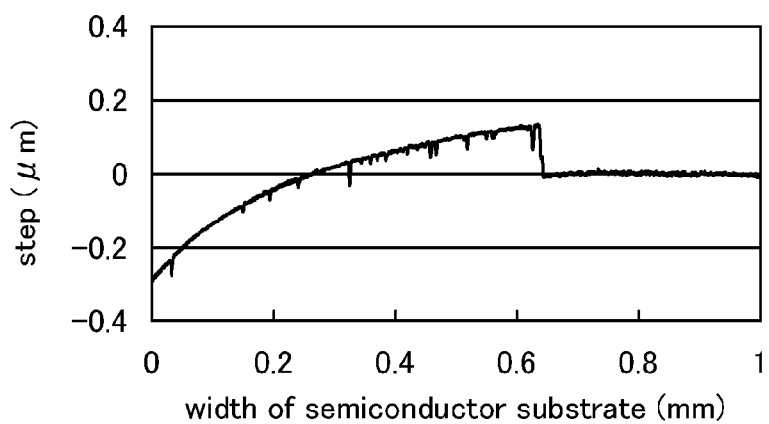
Figure 16C:
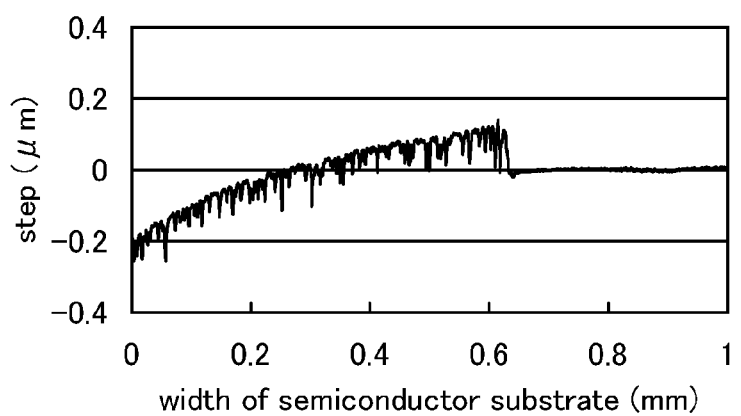
Figure 17A:
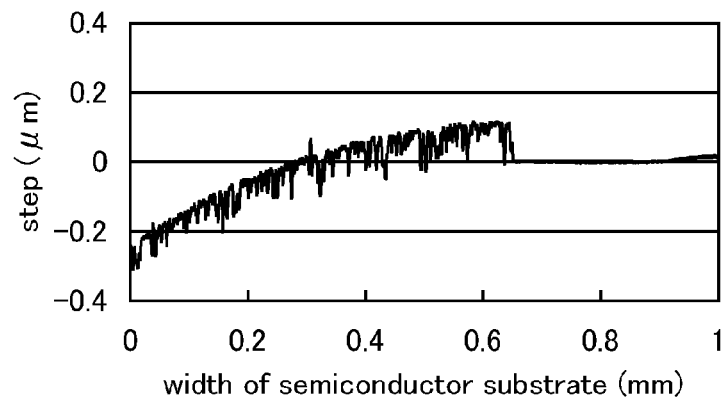
FIGS. 17A to 17C are the graphs showing a relation between the width and the step of the semiconductor substrate in Comparative Example 1A.
Figure 17B:
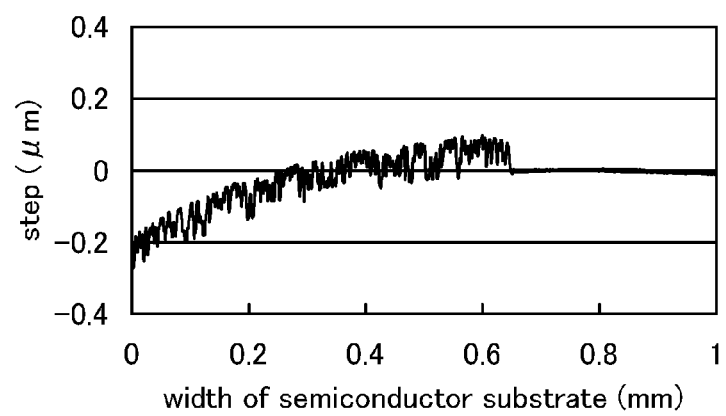
Figure 17C:
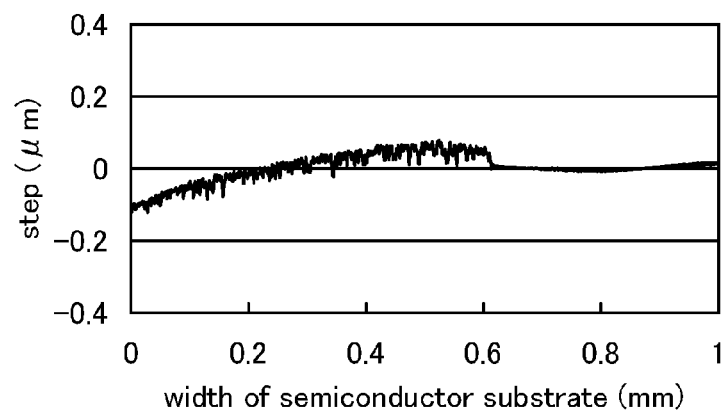
Figure 18A:
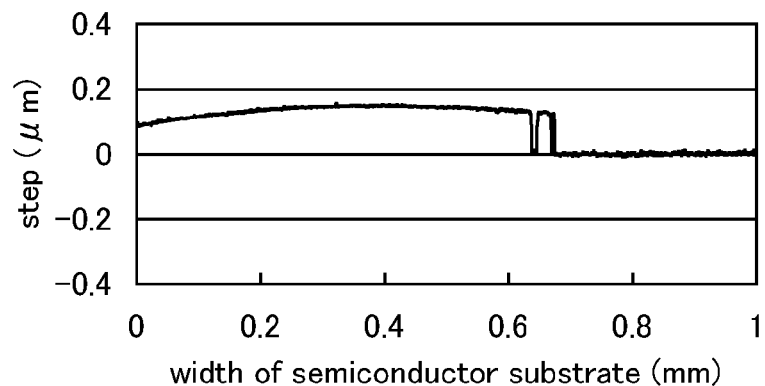
FIGS. 18A to 18C are graphs showing a relation between the width and the step of the semiconductor substrate in Comparative Example 1B.
Figure 18B:
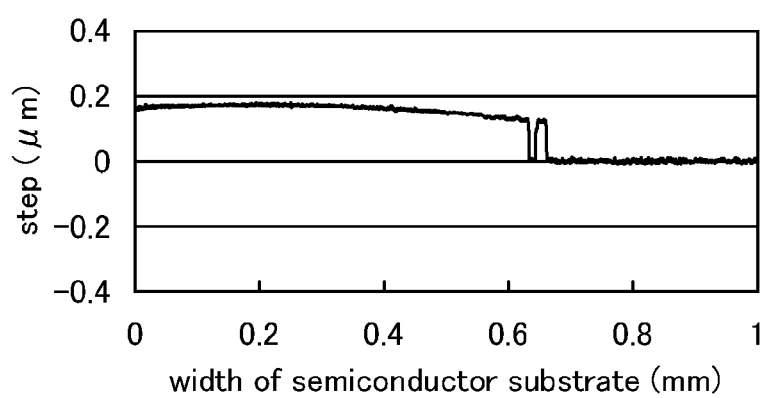
Figure 18C:
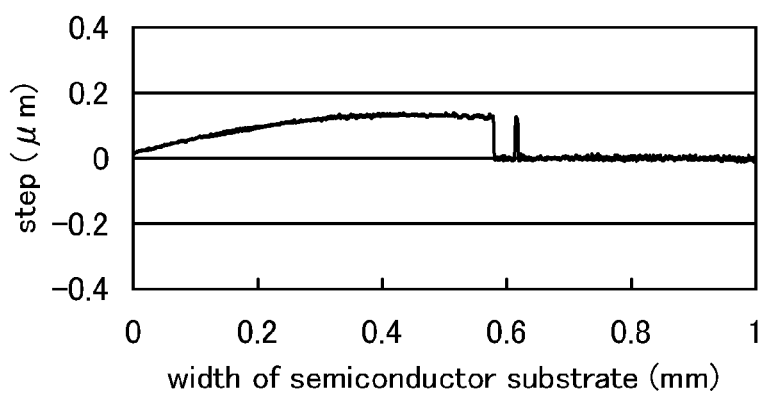
Figure 19A:
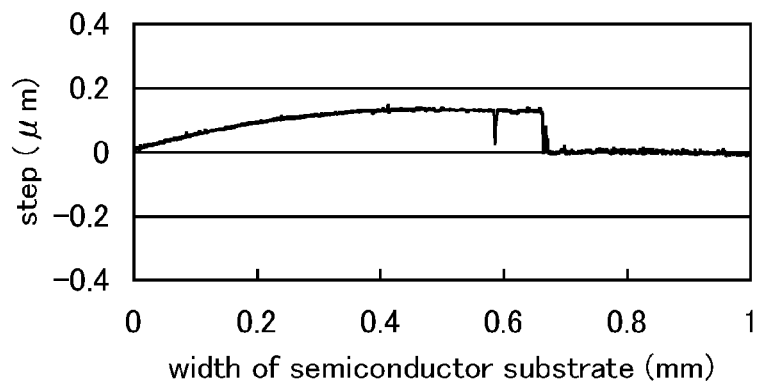
FIGS. 19A to 19C are the graphs showing a relation between the width and the step of the semiconductor substrate in Comparative Example 1B.
Figure 19B:
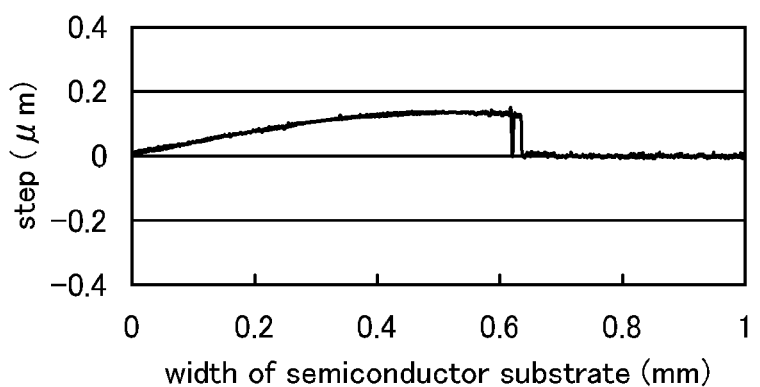
Figure 19C:
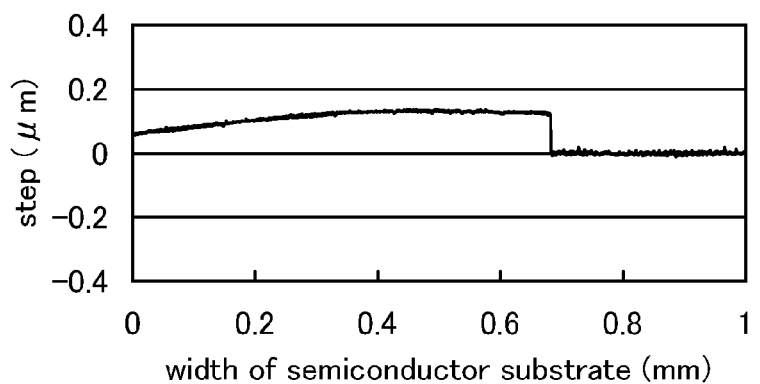
Figure 20A:
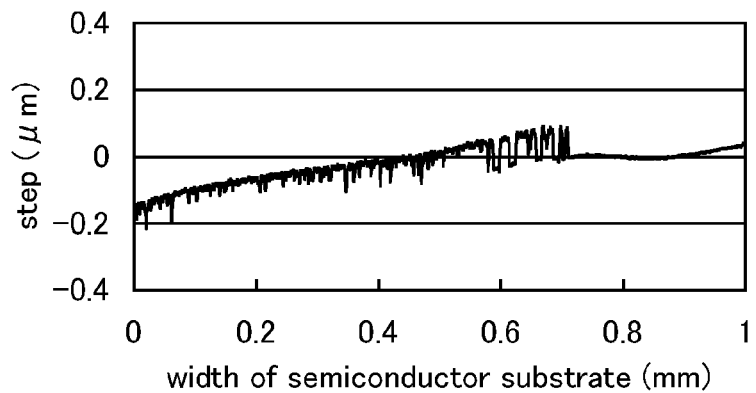
FIGS. 20A to 20C are graphs showing a relation between the width and the step of the semiconductor substrate in Comparative Example 1C.
Figure 20B:
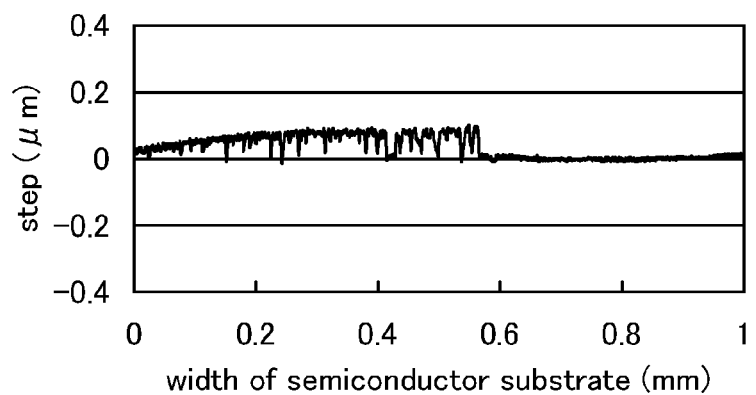
Figure 20C:
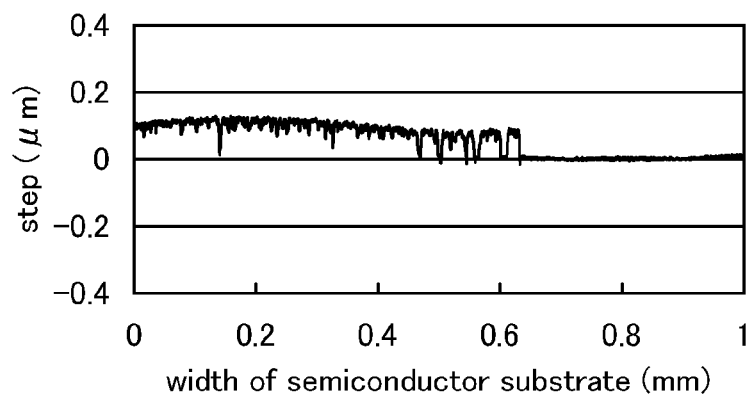
Figure 21A:
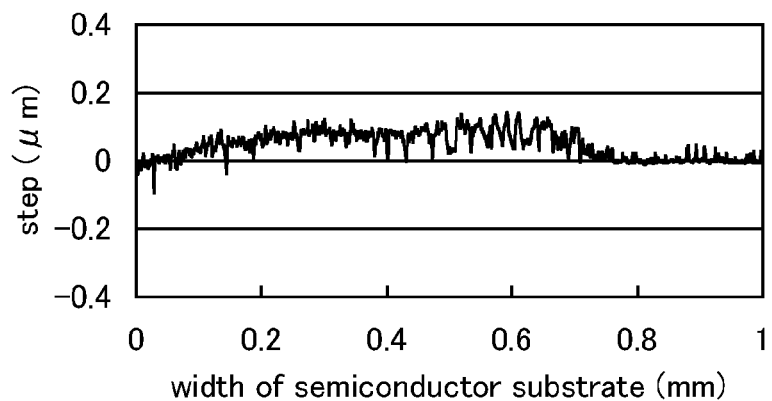
FIGS. 21A to 21C are the graphs showing a relation between the width and the step of the substrate in Comparative Example 1C.
Figure 21B:
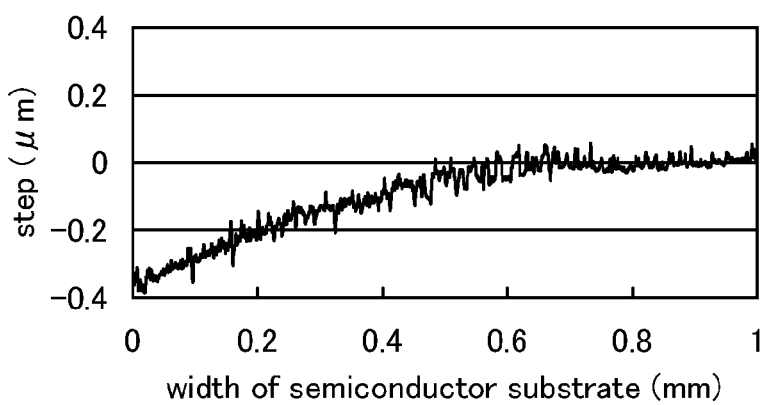
Figure 21C:
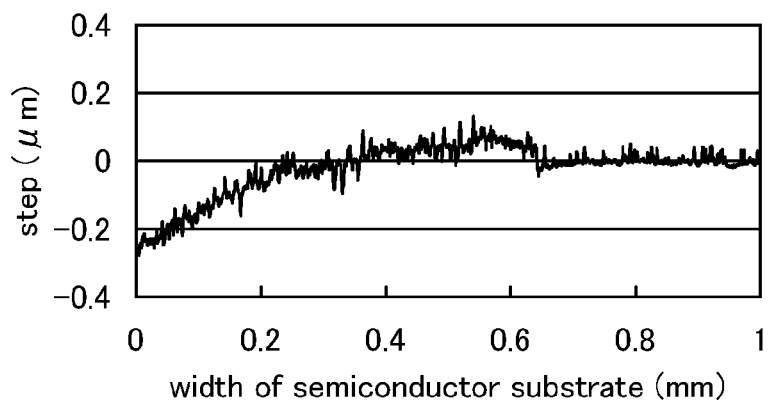
Figure 22A:
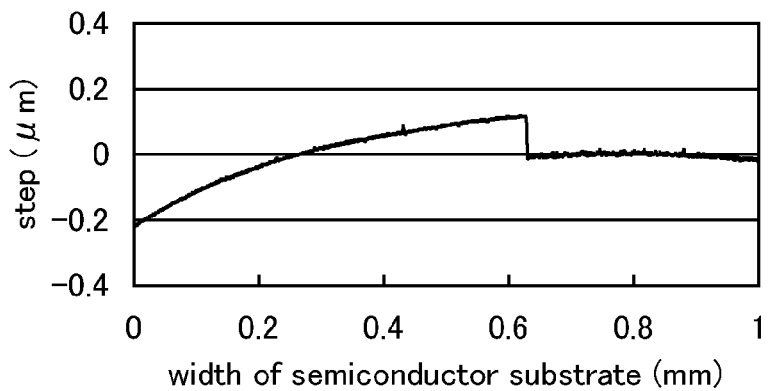
FIGS. 22A to 22C are graphs showing a relation between the width and the step of the semiconductor substrate in Comparative Example 1D.
Figure 22B:
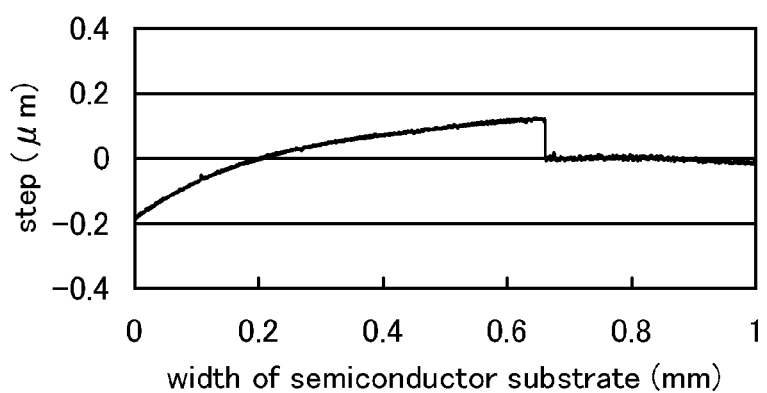
Figure 22C:
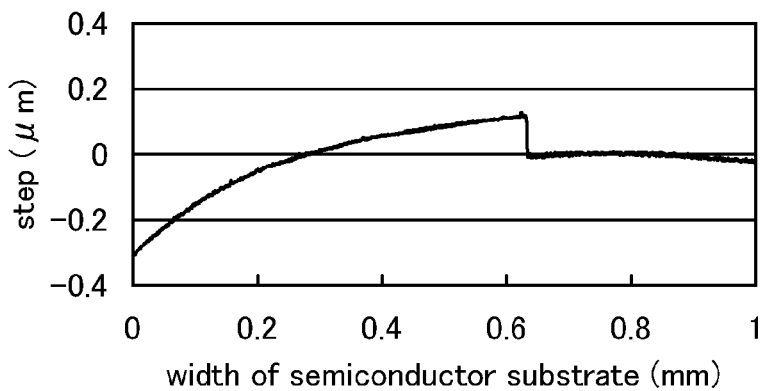
Figure 23A:
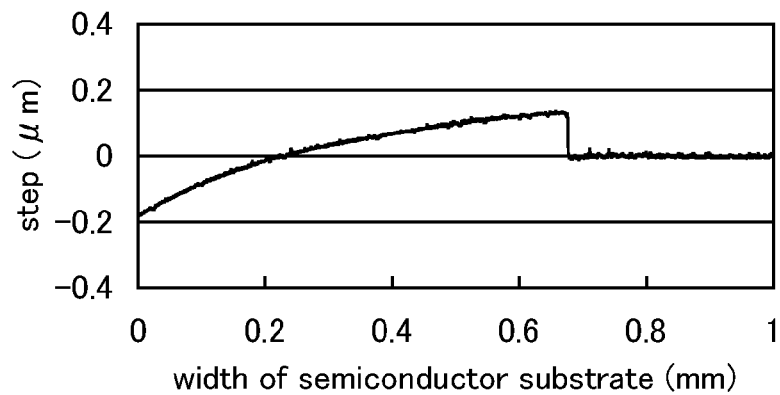
FIGS. 23A to 23C are the graphs showing a relation between the width and the step of the semiconductor substrate in Comparative Example 1D.
Figure 23B:
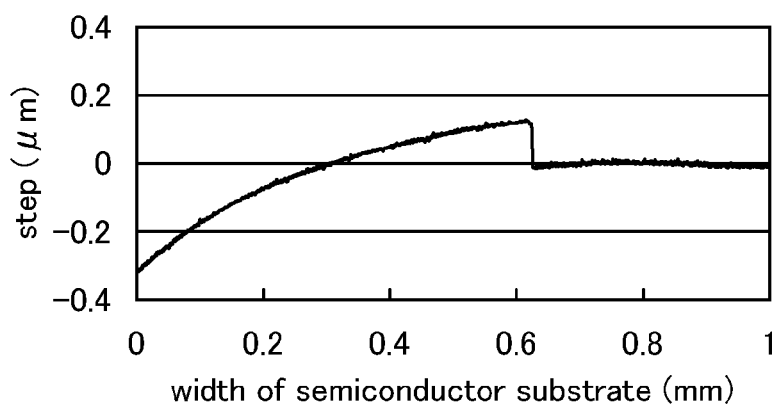
Figure 23C:
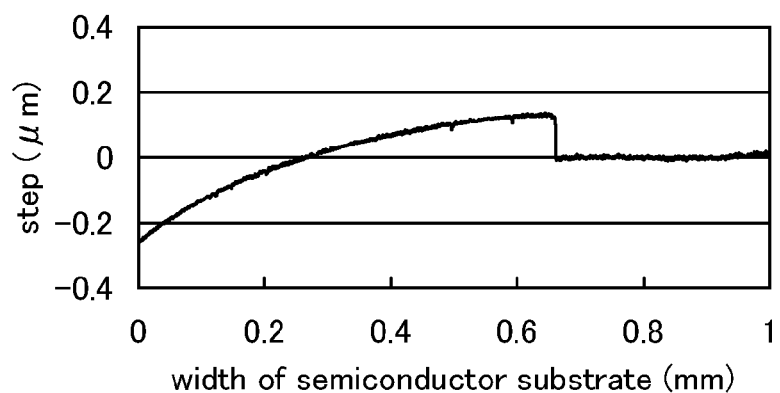
Figure 24A:
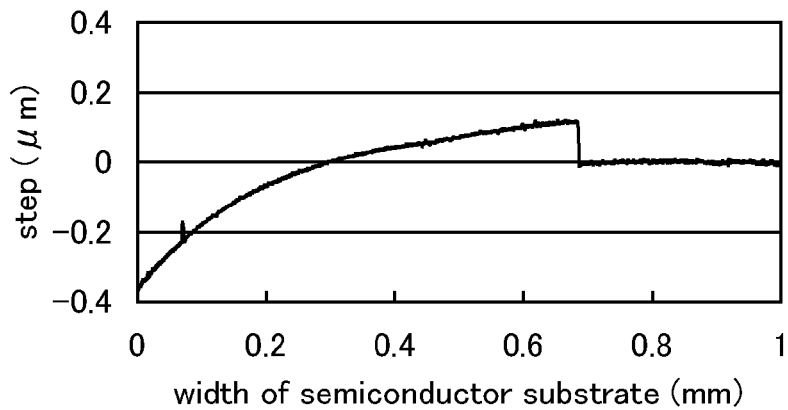
FIGS. 24A to 24C are graphs showing a relation between the width and the step of the semiconductor substrate p in Comparative Example 1E.
Figure 24B:
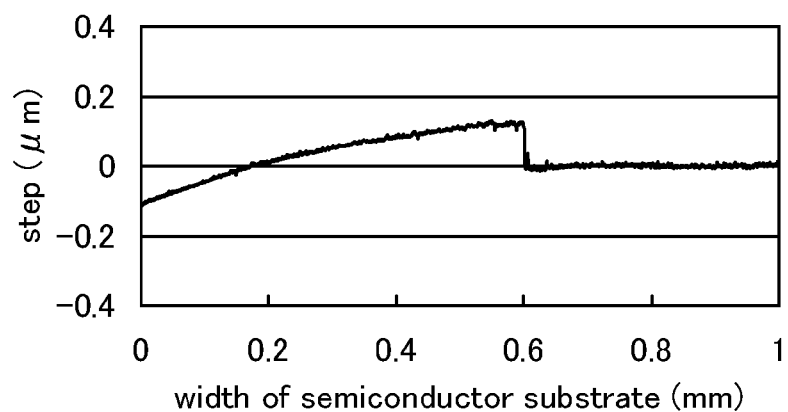
Figure 24C:
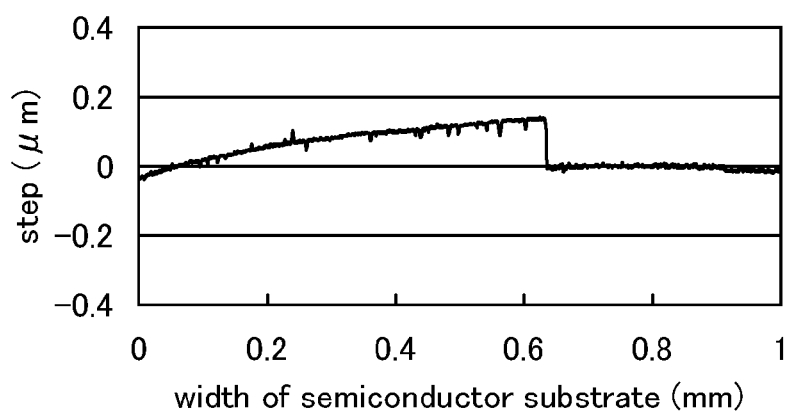

In addition, in the case of using the mixed solution A in which hydrofluoric acid, nitric acid, and acetic acid were contained at a volume ratio of 1:100:100, since the amount of hydrofluoric acid was extremely small, dissolution of silicon oxide by hydrofluoric acid as in the formula (2) is assumed to be a rate-controlling step. Here, because crystal defects or microvoids formed by hydrogen doping in the remaining single crystal silicon layer in the peripheral portion of the substrate are too small to conduct the reaction, it is assumed that the reaction in the formula (2) by hydrofluoric acid with an extremely low concentration does not easily occur in the remaining single crystal silicon layer in the peripheral portion of the substrate. Thus, in the case where the mixed solution A was used, it is assumed that etching did not smoothly proceed in the remaining single crystal silicon layer in the peripheral portion of the substrate, and that the etching proceeded very fast on the surface of the remaining single crystal silicon layer because a space for the reaction was wide. From the above reasons, it is considered that in the case where the mixed solution A is used as an etchant, as shown in FIGS. 15A to 15C, a deep hole is not formed unlike in the case of using the mixed solution of Example 1 containing hydrofluoric acid, nitric acid, and acetic acid at a volume ratio of 1:3:10, and reduction of a step in the peripheral portion gradually proceeds from the surface.

Lastly, in the mixed solution of Example 1 containing hydrofluoric acid, nitric acid, and acetic acid at a volume ratio of 1:3:10, the balance of hydrofluoric acid, nitric acid, and acetic acid is proper unlike in the mixed solution A, the mixed solution B, and the mixed solution C. Therefore, it is not considered that either reaction in the formula (1) or reaction in the formula (2) proceeds extremely slowly, or that the entire substrate is evenly etched because an effect of acetic acid as a decelerator cannot be obtained. In particular, since the ratio of hydrofluoric acid is sufficiently high in the mixed solution of Example 1 as compared to the mixed solution A, etching proceeds easily in crystal defects or microvoids formed by hydrogen doping included in the remaining single crystal silicon layer. Thus, when etching is performed using the mixed solution of Example 1, in addition to etching which proceeds from the surface of the remaining single crystal silicon layer, etching also proceeds in the crystal defects or microvoids formed by hydrogen doping. That is, when etching is performed using the mixed solution of Example 1 containing hydrofluoric acid, nitric acid, and acetic acid at a volume ratio of 1:3:10, etching proceeds first so as to form a deep hole in the projection in the peripheral portion of the substrate in a direction perpendicular to a planar surface of the substrate, and then the step of the projection is reduced and the hole is expanded.

Thus, by etching using the mixed solution of Example 1 containing hydrofluoric acid, nitric acid, and acetic acid at a volume ratio of 1:3:10, a reprocessing treatment of the semiconductor substrate can be performed in such a manner that the projection having the remaining insulating film, the remaining single crystal silicon layer, and the remaining embrittlement layer in the peripheral portion of the substrate can be reduced in a short time with a sufficient selectivity between the peripheral portion of the substrate and the center portion thereof.

Example 2

In this example, an SOI substrate is manufactured using a semiconductor substrate (a bond substrate) of single crystal silicon, and a semiconductor substrate after separation which is by-produced is subjected to a reprocessing treatment. Described is a result of comparison between two cases of reprocessing treatments: the case where a semiconductor substrate is reprocessed by wet etching using a solution containing hydrofluoric acid, nitric acid, and acetic acid, polishing by a CMP method with a high polishing rate, and then finishing polishing by a CMP method with a low polishing rate; and the case where a semiconductor substrate is reprocessed, without wet etching using a solution containing hydrofluoric acid, nitric acid, and acetic acid, by polishing by a CMP method with a high polishing rate and then finishing polishing by a CMP method with a low polishing rate.

In this example, a rectangular single crystal silicon substrates with a diagonal of 5 inches was used as the semiconductor substrate. First, thermal oxidation was performed on the semiconductor substrate in an oxidizing atmosphere containing HCl to form a thermal oxide film with a thickness of 100 nm. At this time, thermal oxidation was performed in an atmosphere containing HCl at 3 vol % with respect to oxygen at 950° C. for four hours.

Next, the semiconductor substrate was irradiated with hydrogen ions from the surface of the thermal oxide film by using an ion doping apparatus. In this example, by irradiation with ionized hydrogen, an embrittlement layer was formed in the semiconductor substrate. The ion doping was performed at an accelerating voltage of 40 kV and a dose of $2.0 \times 10^{16}$ ions/cm$^2$.

Then, the semiconductor substrate was bonded to a glass substrate with the thermal oxide film interposed therebetween. After that, a heat treatment at 200° C. for 120 minutes and then a heat treatment at 600° C. for 120 minutes were performed, so that at the embrittlement layer, the semiconductor substrate was separated into a thin single crystal silicon layer and a semiconductor substrate which was a remaining portion. Thus, an SOI substrate including a single crystal silicon film over the glass substrate with the thermal oxide film interposed therebetween and the semiconductor substrate which included a projection having the remaining insulating film (i.e., the remaining thermal oxide film), the remaining single crystal silicon layer, and the remaining embrittlement layer in the peripheral portion were manufactured.

Then, the semiconductor substrate is subjected to a reprocessing treatment so that a reprocessed semiconductor substrate is manufactured. First, in order to remove the thermal oxide film which was formed to cover the semiconductor substrate and the remaining insulating film which remained in the projection, the semiconductor substrate was subjected to a wet etching treatment using a mixed solution containing hydrofluoric acid, ammonium fluoride, and a surfactant (e.g. manufactured by Stella Chemifa Corporation, product name: LAL500) as an etchant. At this time, the solution temperature was room temperature and the etching time was 300 seconds.

Next, the semiconductor substrate was subjected to a wet etching treatment using a mixed solution containing hydrofluoric acid at a concentration of 50 wt %, nitric acid at a concentration of 70 wt %, and acetic acid at a concentration of 97.7 wt % at a volume ratio of 1:3:10 as an etchant. At this time, the solution temperature was room temperature and the etching time was 120 seconds.

Next, the semiconductor substrate was polished by a CMP method with a high polishing rate. At this time, a polyurethane polishing cloth was used, and silica slurry (manufactured by Nitta Haas Incorporated, ILD1300, a grain size of 150 nm, and twenty-fold dilution) was used as a chemical solution for supplying slurry. Other CMP conditions were as follows. The slurry flow rate was 200 mL/min, the polishing pressure was 0.02 MPa, the spindle rotation speed was 30 rpm, the table rotation speed was 30 rpm, and processing time was 3 min.

Further, the semiconductor substrate was polished by a CMP method with a low polishing rate. At this time, a suede polishing cloth was used (manufactured by Nitta Haas Incorporated, Supreme), and silica slurry (manufactured by Nitta Haas Incorporated, NP8020, a grain size of 60 nm, and twenty-fold dilution) was used as a chemical solution for supplying slurry. Other CMP conditions were as follows. The slurry flow rate was 200 mL/min, the polishing pressure was 0.01 MPa, the spindle rotation speed was 30 rpm, the table rotation speed was 30 rpm, and processing time was 3 min. In the above manner, a reprocessed semiconductor substrate was prepared on which a finishing polishing with a low polishing rate had been performed after having been polished by a CMP method with a high polishing rate.

In the above manner, a reprocessed semiconductor substrate was prepared as Example 2 which was reprocessed by wet etching using a solution containing hydrofluoric acid, nitric acid, and acetic acid and finishing polishing by a CMP method with a short polishing time.

Next, as Comparative Example 2, a semiconductor substrate which was polished by a CMP method for a long time was prepared.

First, a semiconductor substrate was prepared in a manner similar to the above up to the step of wet etching of the semiconductor substrate using the mixed solution containing hydrofluoric acid, ammonium fluoride, and a surfactant as an etchant.

Next, the semiconductor substrate was polished by a CMP method with a high polishing rate. At this time, a polyurethane polishing cloth was used, and silica slurry (manufactured by Nitta Haas Incorporated, ILD1300, a grain size of 150 nm, and twenty-fold dilution) was used as a chemical solution for supplying slurry. Other CMP conditions were as follows. The slurry flow rate was 200 mL/min, the polishing pressure was 0.02 MPa, the spindle rotation speed was 30 rpm, the table rotation speed was 30 rpm, and processing time was 12 min.

Further, the semiconductor substrate was polished by a CMP method with a low polishing rate. At this time, a suede polishing cloth was used (manufactured by Nitta Haas Incorporated, Supreme), and silica slurry (manufactured by Nitta Haas Incorporated, NP8020, a grain size of 60 nm, and twenty-fold dilution) was used as a chemical solution for supplying slurry. Other CMP conditions were as follows. The slurry flow rate was 200 mL/min, the polishing pressure was 0.01 MPa, the spindle rotation speed was 30 rpm, the table rotation speed was 30 rpm, and processing time was 10 min. In the above manner, a reprocessed semiconductor substrate on which a finishing polishing with a low polishing rate was performed after polishing by a CMP method with a high polishing rate was prepared.

Then, the two kinds of reprocessed semiconductor substrates prepared were observed with an optical microscope and subjected to measurement with a step measurement apparatus, evaluation with a scanning probe microscope (SPM), and measurement of the decrease in the thickness (amount of the removed portion) of the semiconductor substrates at the reprocessing treatment by Sorter 1000 manufactured by Lapmaster SFT Corp.

Figure 8A:
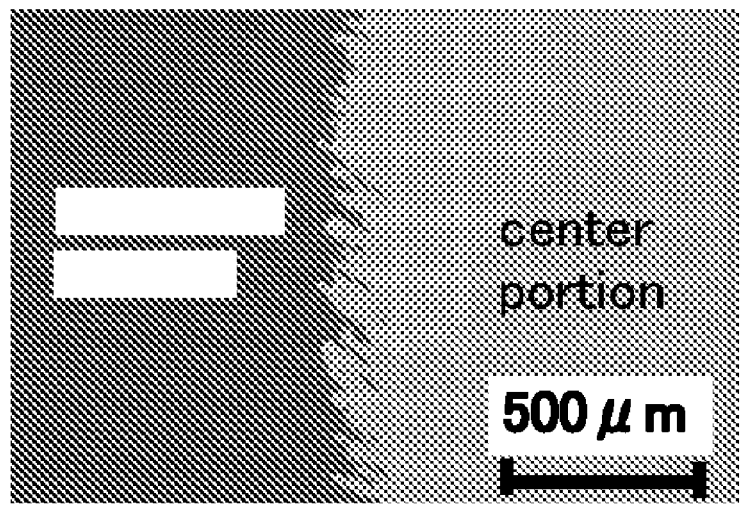
FIGS. 8A and 8B show optical micrographs of the semiconductor substrates prior to the reprocessing treatment and after the reprocessing treatment, respectively, in Example 2.
Figure 8B:
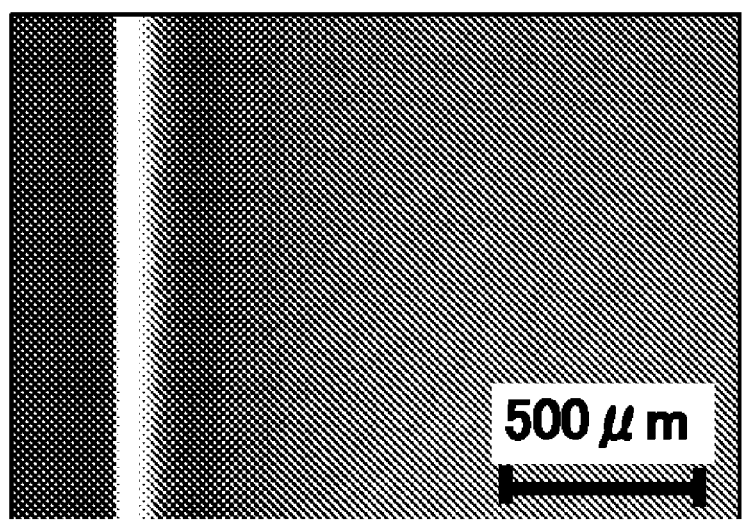
Figure 9A:
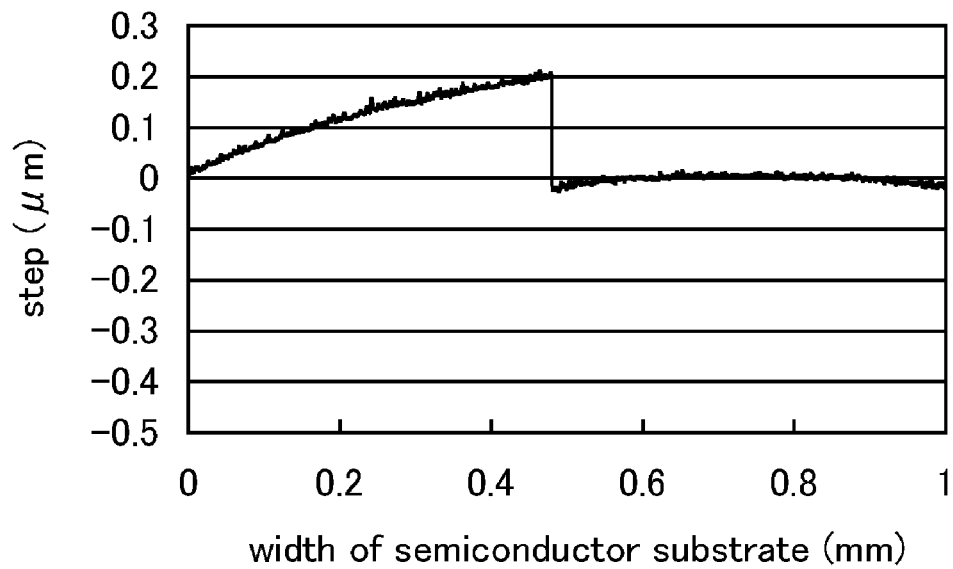
FIGS. 9A and 9B are graphs showing a relation between the width and the step of the semiconductor substrate in Example 2.

FIGS. 8A and 8B show optical microphotographs of a peripheral portion of the semiconductor substrate before the reprocessing treatment and a peripheral portion of the reprocessed semiconductor substrate of Example 2 after wet etching. Note that the optical microphotographs in FIGS. 8A and 8B were taken as Nomarski images at 50-fold magnification. In addition, FIGS. 9A and 9B show measurement results of the peripheral portions of the two kinds of substrates with Surfcoder ET4100 (a step measurement apparatus) manufactured by Kosaka Laboratory Ltd.

As in FIG. 8A, the semiconductor substrate before the reprocessing treatment had a step in the peripheral portion; crystal silicon was seen in the center portion but an insulating layer was seen in the peripheral portion. The step can also be found from the results of step measurement shown in FIG. 9A; a step of approximately 0.2 µm was formed in the peripheral portion of the semiconductor substrate before the reprocessing treatment.

However, in the semiconductor substrate of Example 2, on which a reprocessing treatment was performed by a wet etching treatment using the mixed solution containing hydrofluoric acid at a concentration of 50 wt %, nitric acid at a concentration of 70 wt %, and acetic acid at a concentration of 97.7 wt % at a volume ratio of 1:3:10 and by a polishing treatment by a CMP method in a short time, as shown in FIG. 8B, the projection formed in the peripheral portion was removed and single crystal silicon layer was seen similarly in the peripheral portion and in the center portion. Note that a vertical white line on the left side of FIG. 8B is an edge of the substrate.

Figure 9B:
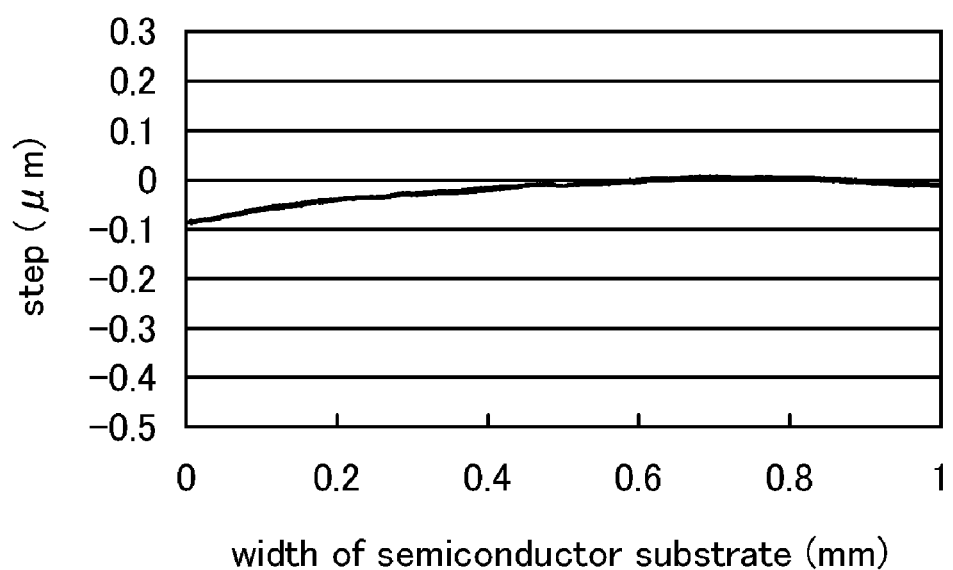

The removal of the projection can also be found from step measurement results by the step measurement apparatus shown in FIG. 9B. As seen in the step measurement results in FIG. 9B, the projection which is shown in FIG. 9A was removed.

Next, shown are results of planarity evaluation in the center portions and the peripheral portions of the two kinds of reprocessed semiconductor substrates of Example 2 and Comparative Example 2 by using SPM. The SPM used was SPA-500 manufactured by SII Nano Technology Inc., and a probe station for controlling the SPM was SPI3800N manufactured by SII Nano Technology Inc. Conditions of the measurement by the SPM were as follows: the scan rate was 1.0 Hz, the measurement area was 1 µm×1 µm, and the measurement points were 2.

The measurement by the SPM was conducted using dynamic force mode (DFM). Note that DFM refers to a method for measurement by the SPM in which the surface shape of a sample is measured in a state where a cantilever is resonated while the distance between a probe and the sample is controlled so that the vibration amplitude of the cantilever is maintained constant. In DFM, the cantilever does not touch the surface of the sample; thus, measurement is possible without changing the original shape of the surface of the sample and without damaging the surface.

The planarity of each reprocessed semiconductor substrate was evaluated by measuring the average roughness (Ra) and the maximum peak-to-valley height (P-V). In this example, the average roughness (Ra) was obtained by expanding center line average roughness (Ra) which is defined by JISB0601:2001 (ISO 4287:1997) into three dimensions so that Ra can be applied to a measurement surface. That is, the average roughness (Ra) can be expressed as an average value of the absolute values of deviations from a reference surface to a specific surface. The maximum peak-to-valley height (P-V) is a difference between the height of the highest peak and the height of the lowest valley in the specific surface. The peak and the valley refer to a peak and a valley obtained by three-dimensional expansion of the "peak" and the "valley" defined by JISB0601:2001 (ISO4287:1997). The peak refers to the highest part of the peaks in the specified surface. The valley refers to the lowest part of the valleys in the specified surface.

TABLE 3

| Average Roughness | Example 2 | | Comparative Example 2 | |
|---|---|---|---|---|
| | Peripheral Portion | Center | Peripheral Portion | Center |
| Ra (nm) | 0.050 | 0.046 | 0.060 | 0.072 |
| P-V (nm) | 0.393 | 0.475 | 0.470 | 0.520 |

Results of planarity evaluation of the reprocessed substrates by SPM are shown in Table 3. Steps are hardly seen in the center portions and the peripheral portions of the reprocessed semiconductor substrates of Example 2 and Comparative Example 2, and the planarity in the center portions and the peripheral portions is substantially the same. In the case of the reprocessed semiconductor substrate of Example 2, on which a reprocessing treatment was performed by a wet etching treatment using the mixed solution containing hydrofluoric acid at a concentration of 50 wt %, nitric acid at a concentration of 70 wt %, and acetic acid at a concentration of 97.7 wt % at a volume ratio of 1:3:10 and by a polishing treatment by a CMP method, Ra in the peripheral portion is 0.050 nm and P-V is 0.393 nm, and in the case of the reprocessed semiconductor substrate of Comparative Example 2 on which only a polishing treatment was performed, Ra in the peripheral portion is 0.060 nm and P-V is 0.470 nm. Therefore, the planarity of the reprocess semiconductor substrate of Example 2 is superior to the latter.

Lastly, reduced thicknesses (removed portions) of the semiconductor substrates in the reprocessing treatment step of Example 2 and Comparative Example 2 were measured. The reduced thicknesses (removed portions) of the semiconductor substrates were measured by Sorter 1000 manufactured by Lapmaster SFT Corp, and etching amounts of the semiconductor substrates in the center portion were measured using variations in the thicknesses of the semiconductor substrates before and after the reprocessing treatment.

TABLE 4

| | Example 2 | | Comparative Example 2 |
|---|---|---|---|
| | After Etching Treatment | After Polishing Treatment | After Polishing Treatment |
| Thickness of Removed Portion in a Step (µm) | 0.41 | 0.97 | 6.96 |
| Total Thickness of Removed Portion (µm) | 1.38 | | 6.96 |

Measurement results of the removed portions of the reprocessed semiconductor substrates of Example 2 and Comparative Example 2 in the reprocessing treatment step are shown in Table 4. In a method for the reprocessing treatment of Example 2, in which a wet etching treatment was performed using the mixed solution containing hydrofluoric acid at a concentration of 50 wt %, nitric acid at a concentration of 70 wt %, and acetic acid at a concentration of 97.7 wt % at a volume ratio of 1:3:10 and a polishing treatment was performed by a CMP method, the removed portion was 1.38 μm. In contrast, in a method for the reprocessing treatment of Comparative Example 2, in which only the polishing treatment was performed, the removed portion was 6.96 μm. The removed portion of the semiconductor substrate in the method for the reprocessing treatment of Example 2 was approximately a quarter of that of Comparative Example 2. In particular, the removed portion of the semiconductor substrate in the etching of Example 2 was only 0.41 μm.

Thus, by the reprocessing treatment of a semiconductor substrate by wet etching using the mixed solution containing hydrofluoric acid, nitric acid, and acetic acid at a volume ratio of 1:3:10 and the polishing treatment by a CMP method in a short time, a removed portion of the semiconductor substrate in the reprocessing treatment can be reduced as compared to the reprocessing treatment of a semiconductor substrate by only a polishing treatment for a long time. Furthermore, the planarity of the reprocessed semiconductor substrates can be substantially the same.

Example 3

In this example, described are observation results of a cross section of a semiconductor substrate after formation of a thermal oxide film over the semiconductor substrate and hydrogen ion irradiation.

In this example, a rectangular single crystal silicon substrate with a diagonal of 5 inches was used as the semiconductor substrate. First, thermal oxidation was performed on the semiconductor substrate in an atmosphere containing HCl to form a thermal oxide film with a thickness of 100 nm. At this time, thermal oxidation was performed in an atmosphere containing HCl at 3 vol % with respect to oxygen at 950° C. for four hours.

Next, the semiconductor substrate was irradiated with hydrogen ions from the surface of the thermal oxide film by using an ion doping apparatus. In this example, by irradiation with ionized hydrogen, an embrittlement layer was formed in the semiconductor substrate. The ion doping was performed with an accelerating voltage of 50 kV at a dose of $2.0 \times 10^{16}$ ions/cm$^2$. Thus, an embrittlement layer was formed at a depth of approximately 250 nm from the surface of the thermal oxide film.

Figure 27A:
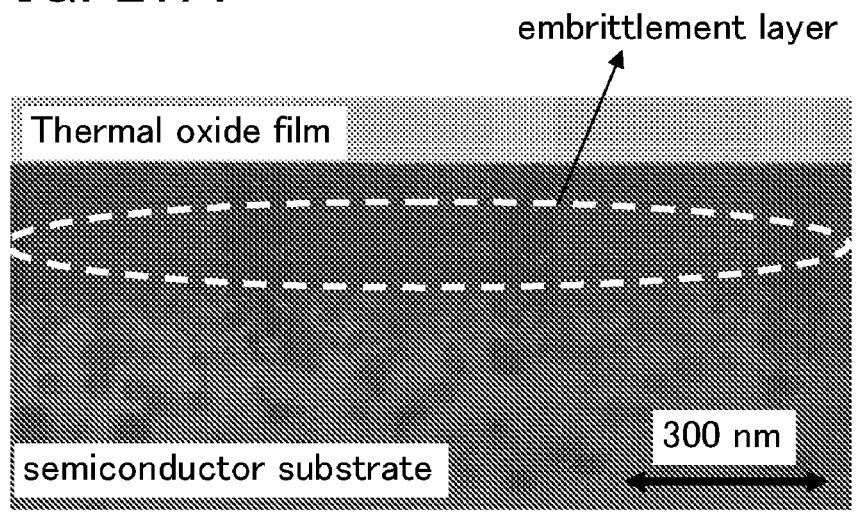
FIGS. 27A and 27B show TEM images at a cross section of the semiconductor substrate of Example 3.
Figure 27B:
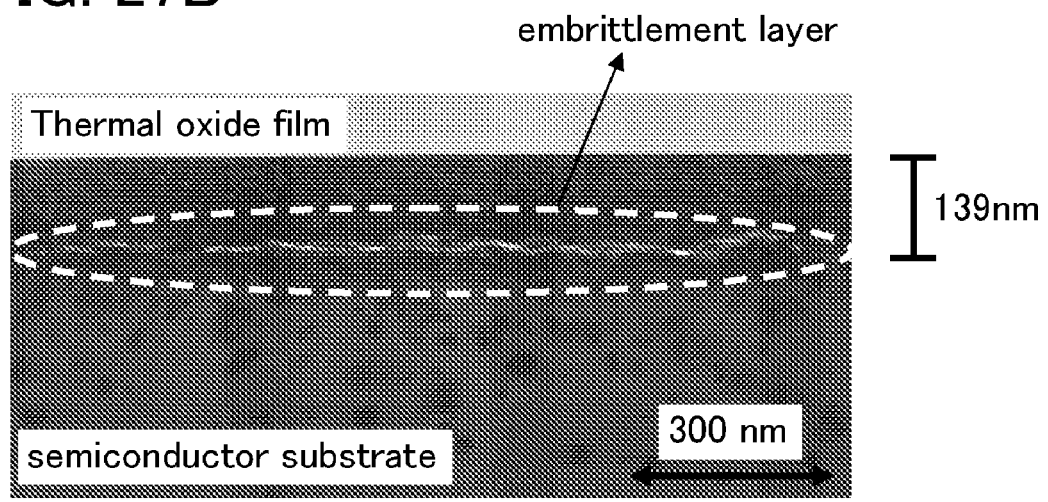

FIG. 27A shows a TEM image of a semiconductor substrate at a cross section on which the above treatment was performed. FIG. 27B shows a TEM image of the semiconductor substrate at a cross section on which only a heat treatment was performed without performing the separation at the embrittlement layer.

As shown in FIGS. 27A and 27B, crystal defects were formed in the vicinity of a surface of the silicon substrate. As shown in FIG. 27B, the embrittlement layer was formed in a depth of 139 nm from the surface of the single crystal silicon.

Note that in manufacture of an SOI substrate, a semiconductor substrate after separation was by-produced, and a projection was formed in the peripheral portion thereof because it was not bonded to a base substrate. The remaining single crystal silicon layer which forms the projection is a portion over the embrittlement layer as shown in FIG. 27B. Therefore, since the crystal defects or microvoids formed by hydrogen doping were included in the remaining single crystal silicon layer in the peripheral portion of the semiconductor substrate after separation, by the etching using the mixed solution containing hydrofluoric acid, nitric acid, and acetic acid as described in Example 1 and Example 2 which penetrated into the crystal defects or microvoids, the projection formed in the peripheral portion of the semiconductor substrate after separation can be selectively reduced in thickness.

Example 4

In this example, described is a result of comparison among semiconductor substrates after separation (bond substrates) which are by-produced in manufacture of an SOI substrate and are reprocessed by removing a remaining insulating film and then performing the wet etching treatment using solutions which are different from those in the above examples.

In this example, a specific example is described in which, similarly to Example 1, a semiconductor substrate from which a remaining insulating film is removed by a first etching treatment is subjected to a second etching treatment using a mixed solution containing a substance functioning as an oxidizer for oxidizing a semiconductor in the semiconductor substrate, a substance for dissolving an oxide of the semiconductor, and a substance functioning as a decelerator of the oxidation of the semiconductor and dissolution of the oxide of the semiconductor. In this example, in particular, a structure is described in which buffered hydrofluoric acid is used instead of hydrofluoric acid which is described as a material for dissolving the oxide of the semiconductor in Example 1. Specifically, in the second etching treatment, a mixed solution containing buffered hydrofluoric acid, nitric acid, and acetic acid at a volume ratio of 1:7:10 was used as an etchant so that the wet etching treatment was performed.

Note that buffered hydrofluoric acid, which was a chemical agent for the dissolution of the oxide of the semiconductor and which was used for formation of the mixed solution in this example, was a mixed solution containing hydrofluoric acid, ammonium fluoride, and a surfactant (e.g. manufactured by Stella Chemifa Corporation, product name: LAL500). Note also that nitric acid and acetic acid were the same as the chemical agents used in Example 1. Note also that the etchant temperature in the etching step was 23° C.±0.5° C., the etching time was 4 min., 8 min., and 16 min., and a step in the peripheral portion of a semiconductor substrate after separation was measured.

Figure 28A:
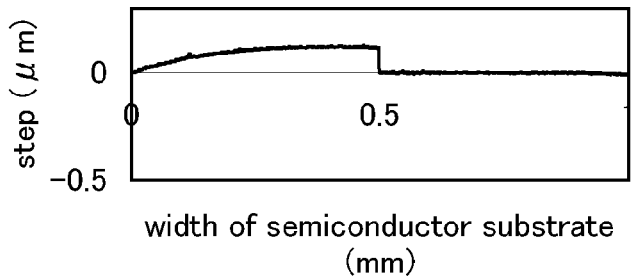
FIGS. 28A to 28D are graphs showing a relation between the width and the step of the semiconductor substrate in Example 4.
Figure 28B:
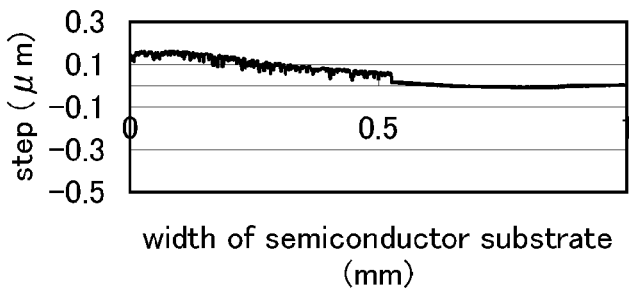
Figure 28C:
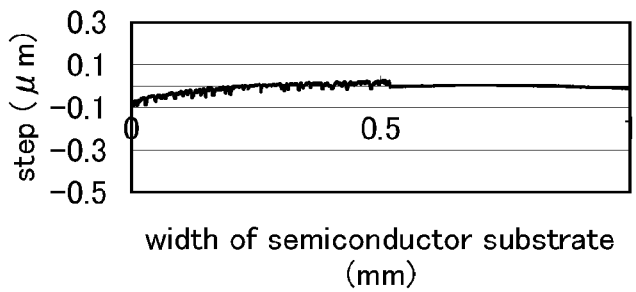
Figure 28D:
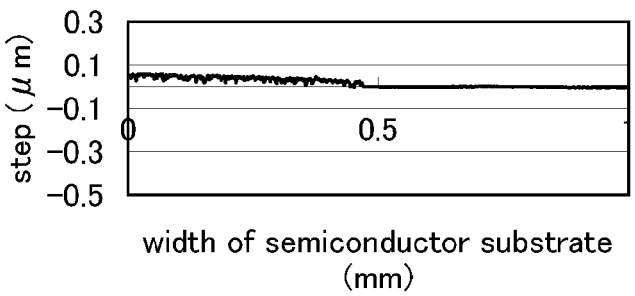
Figure 29A:
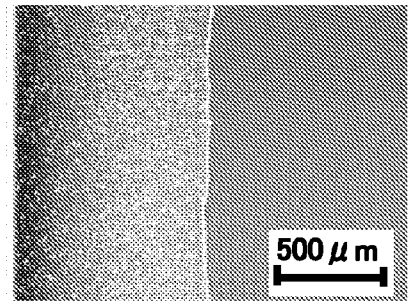
FIGS. 29A to 29C show optical micrographs of the peripheral portion of the semiconductor substrate in Example 5A.
Figure 29A:
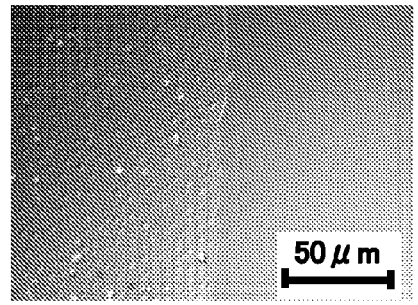
Figure 29B:
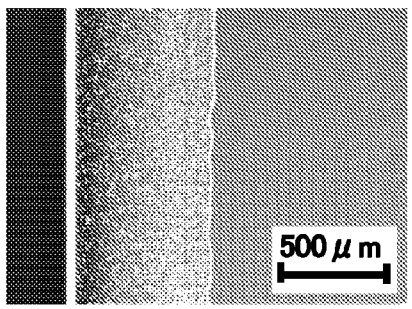
Figure 29B:
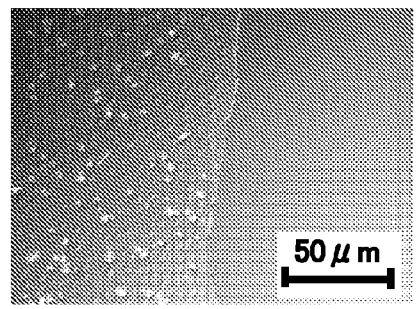
Figure 29C:
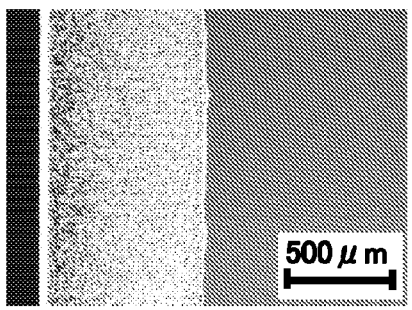
Figure 29C:
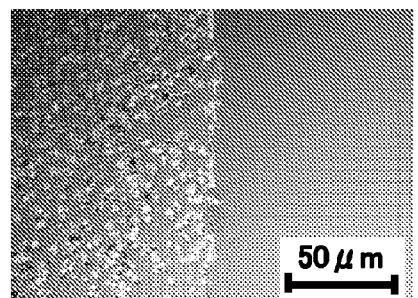
Figure 30A:
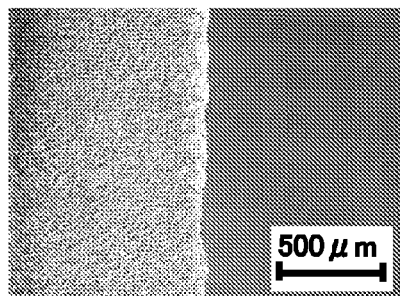
FIGS. 30A to 30C show the optical micrographs of the peripheral portion of the semiconductor substrate in Example 5A.
Figure 30A:
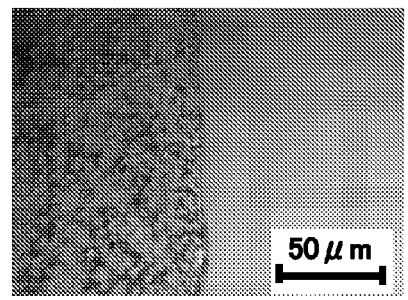
Figure 30B:
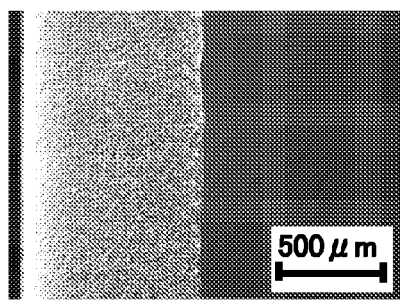
Figure 30B:
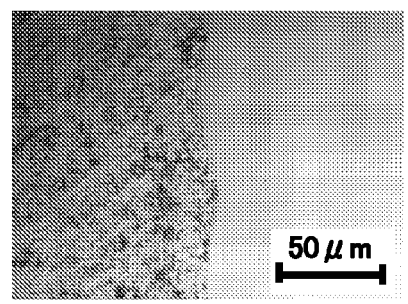
Figure 30C:
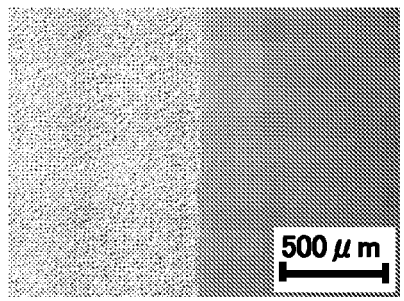
Figure 30C:
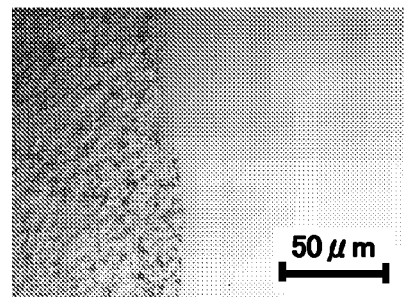
Figure 31A:
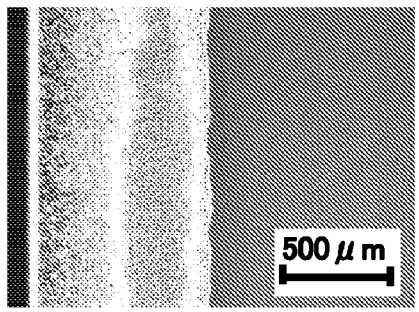
FIGS. 31A to 31C show optical micrographs of the peripheral portion of the semiconductor substrate in Example 5B.
Figure 31A:
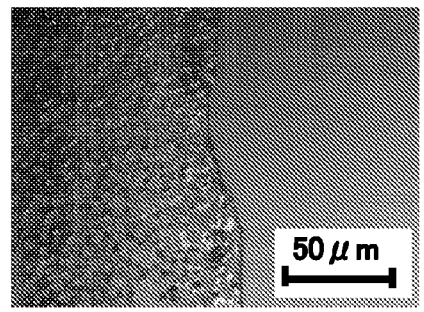
Figure 31B:
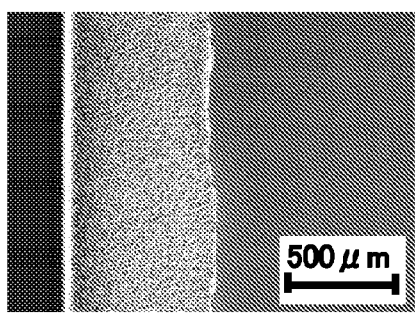
Figure 31B:
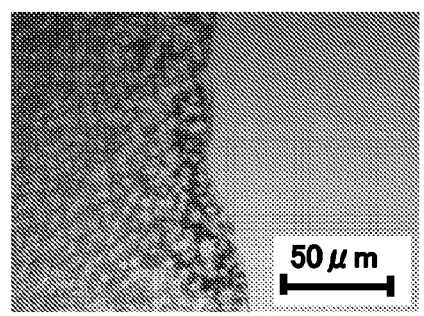
Figure 31C:
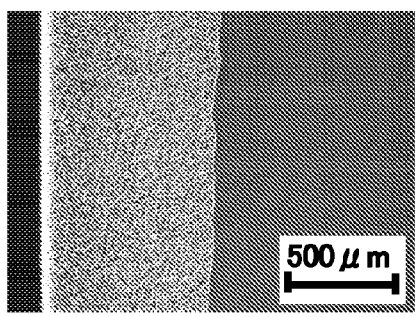
Figure 31C:
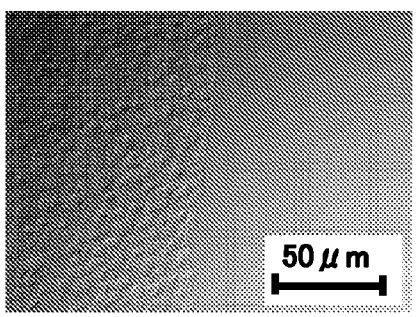
Figure 32A:
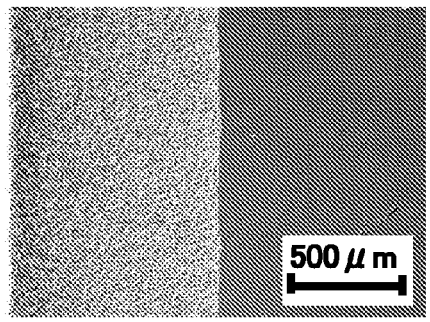
FIGS. 32A to 32C show the optical micrographs of the peripheral portion of the semiconductor substrate in Example 5B.
Figure 32A:
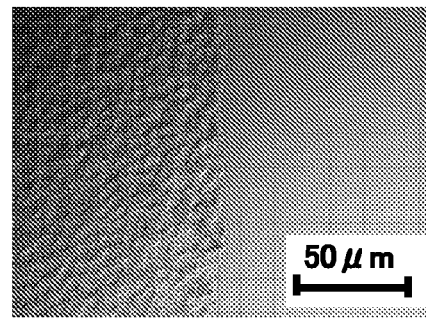
Figure 32B:
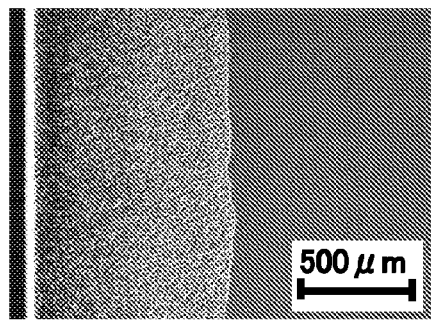
Figure 32B:
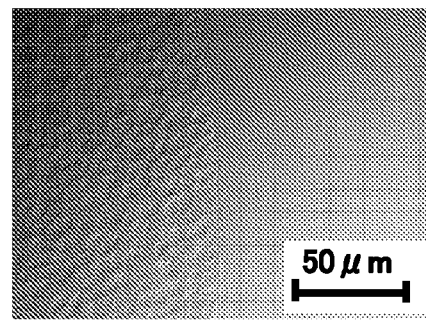
Figure 32C:
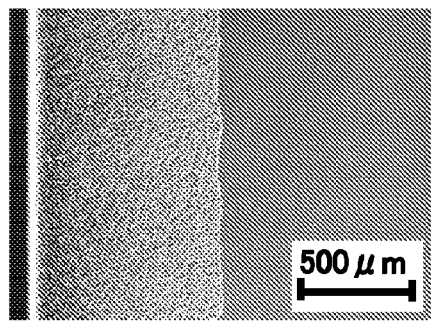
Figure 32C:
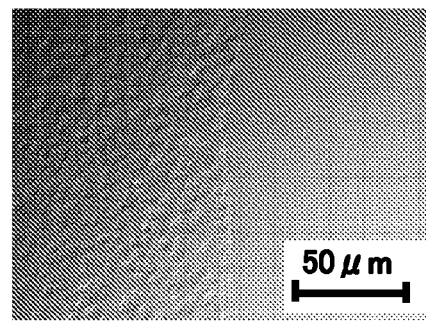
Figure 33A:
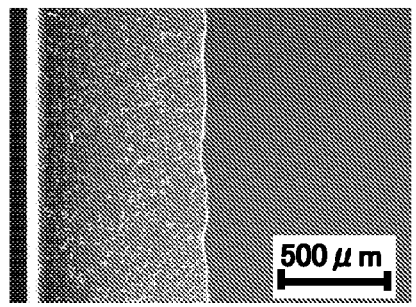
FIGS. 33A to 33C show optical micrographs of the peripheral portion of the semiconductor substrate in Example 5C.
Figure 33A:
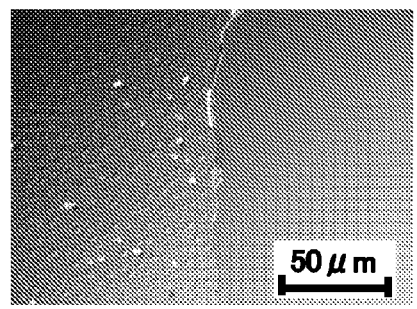
Figure 33B:
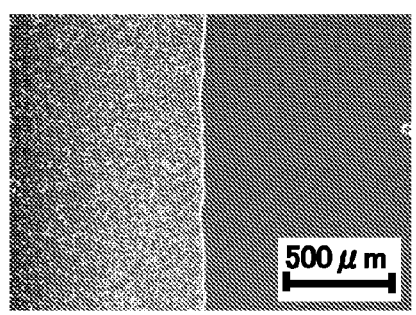
Figure 33B:
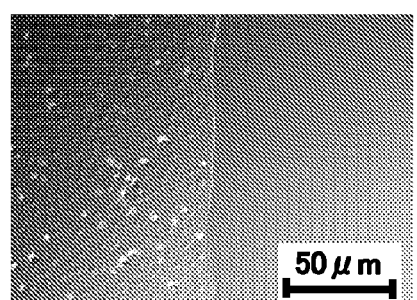
Figure 33C:
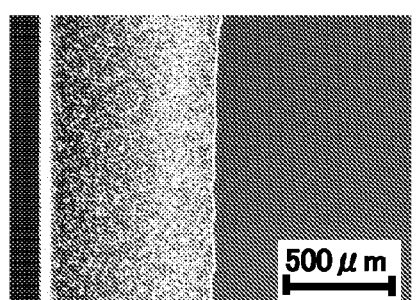
Figure 33C:
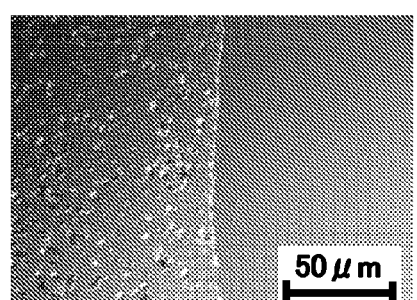
Figure 34A:
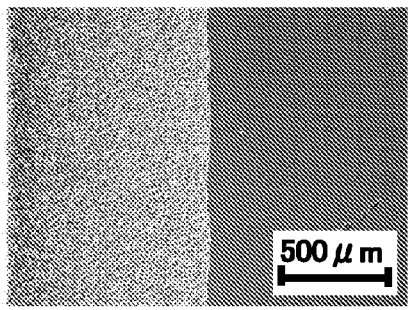
FIGS. 34A to 34C show the optical micrographs of the peripheral portion of the semiconductor substrate in Example 5C.
Figure 34A:
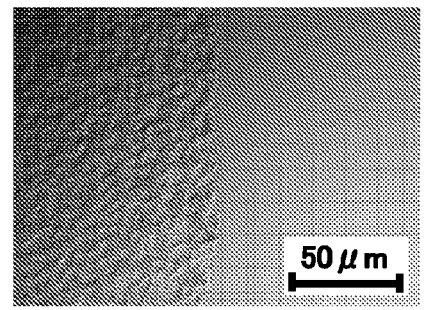
Figure 34B:
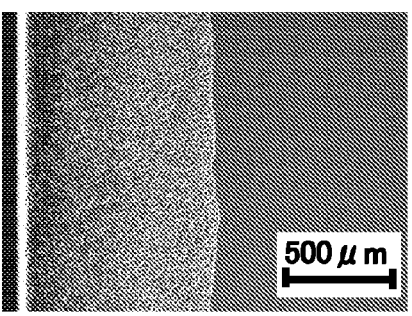
Figure 34B:
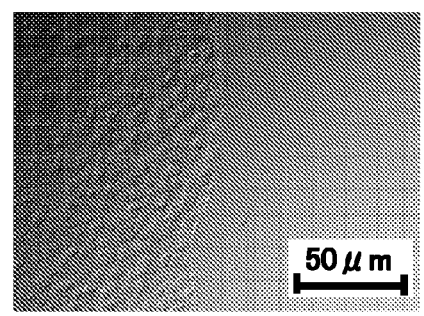
Figure 34C:
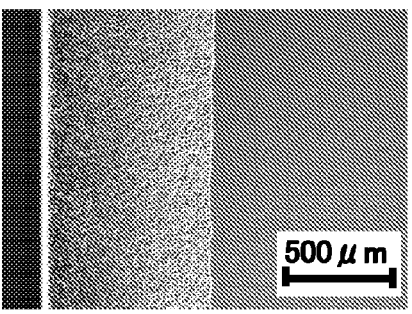
Figure 34C:
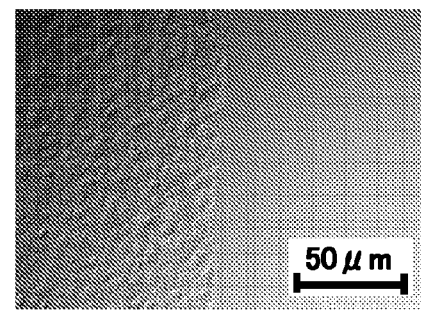
Figure 35A:
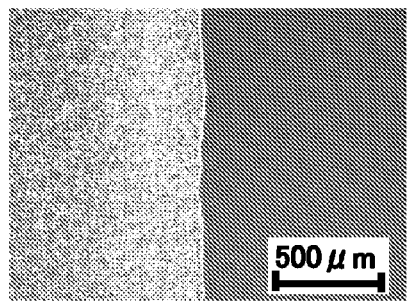
FIGS. 35A to 35C show optical micrographs of the peripheral portion of the semiconductor substrate in Example 5D.
Figure 35A:
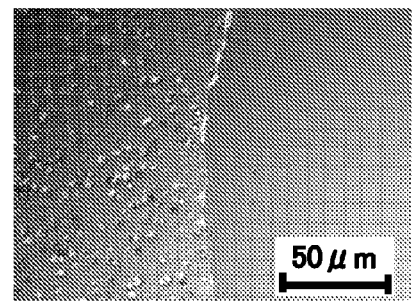
Figure 35B:
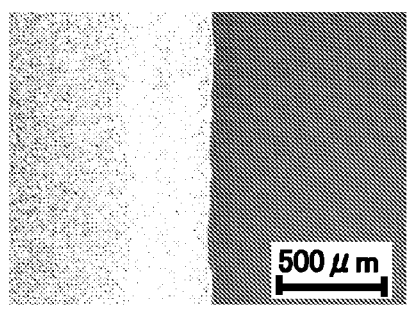
Figure 35B:
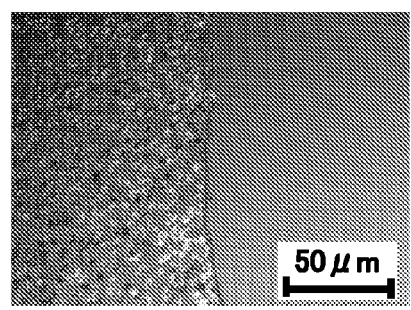
Figure 35C:
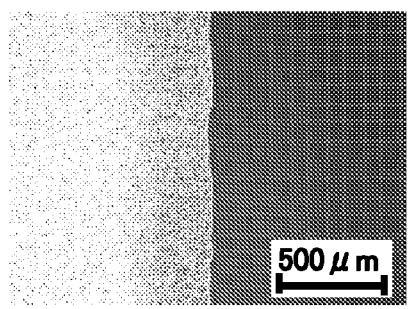
Figure 35C:
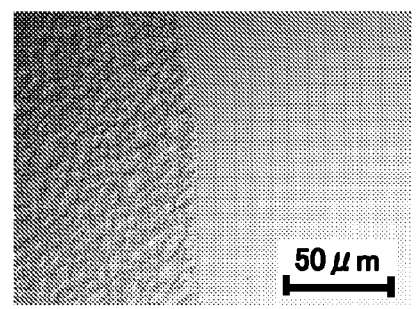
Figure 36A:
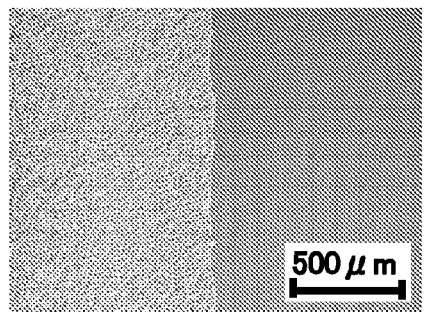
FIGS. 36A to 36C show the optical micrographs of the peripheral portion of the semiconductor substrate in Example 5D.
Figure 36A:
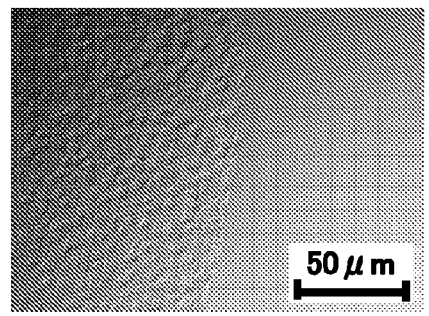
Figure 36B:
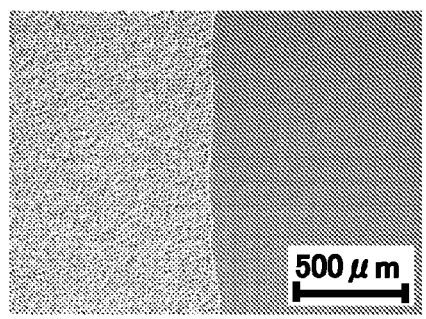
Figure 36B:
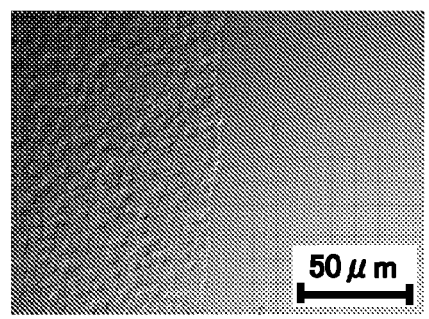
Figure 36C:
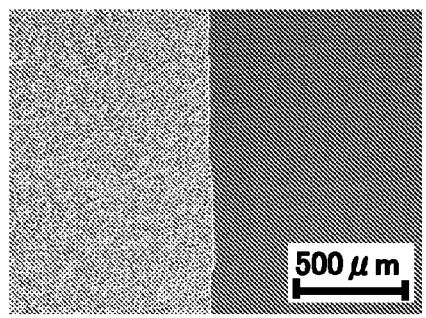
Figure 36C:
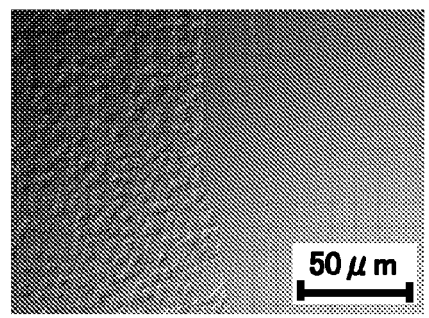
Figure 37A:
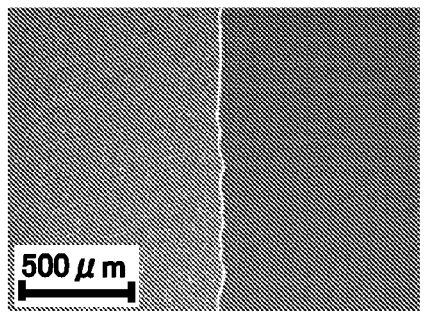
FIGS. 37A to 37C show optical micrographs of the peripheral portion of the semiconductor substrate in Example 5E.
Figure 37A:
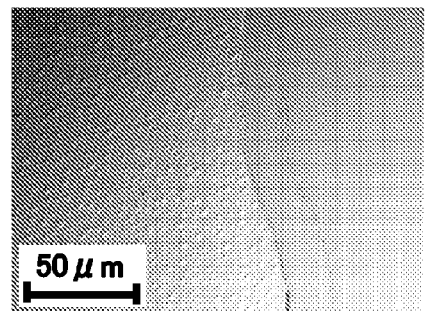
Figure 37B:
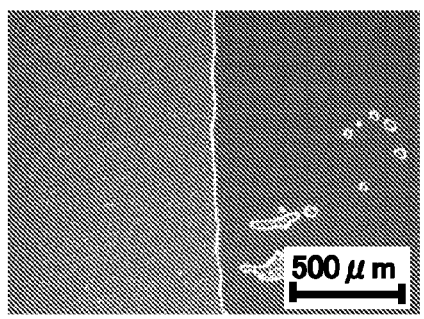
Figure 37B:
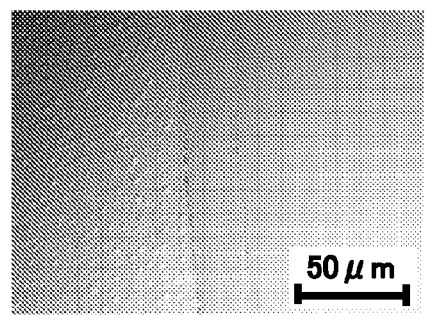
Figure 37C:
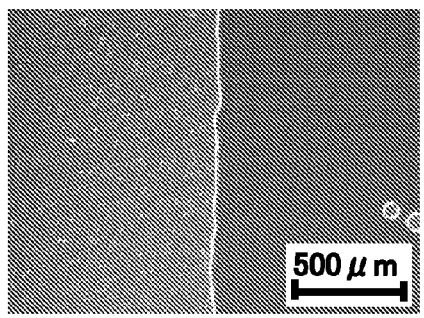
Figure 37C:
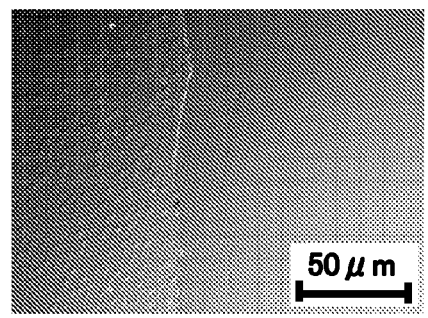
Figure 38A:
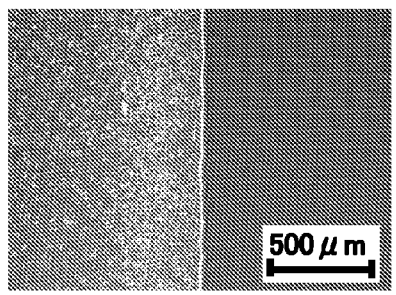
FIGS. 38A to 38C show the optical micrographs of the peripheral portion of the semiconductor substrate in Example 5E.
Figure 38A:
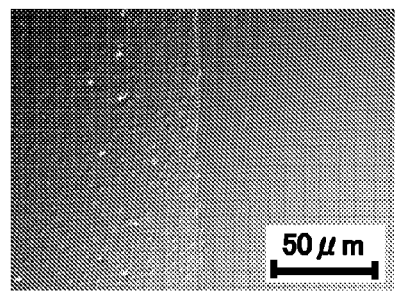
Figure 38B:
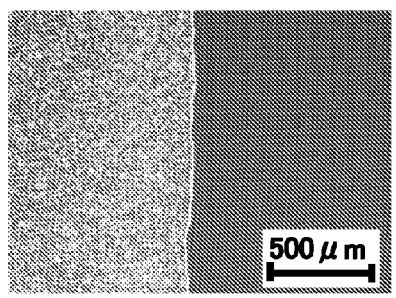
Figure 38B:
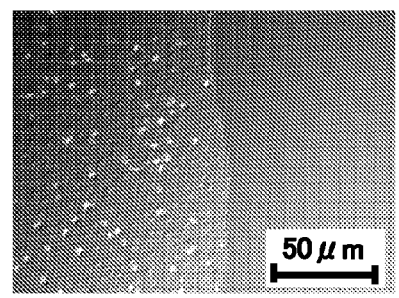
Figure 38C:
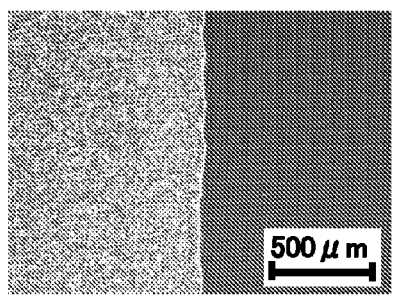
Figure 38C:
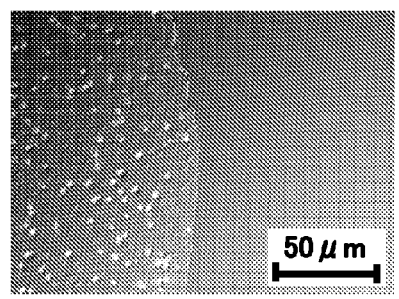

FIGS. 28A to 28D are graphs showing a relation between the width of a semiconductor substrate and a step at an etching time of 0 min (before the etching), 4 min., 8 min., and 16 min., respectively. In FIG. 28A, the single crystal silicon layer remains. As shown in FIG. 28B, FIGS. 28C, and 28D, the etching proceeded to a lower layer as time passed. For example, in FIGS. 28A and 28B, the step between the peripheral portion of the substrate and the center portion thereof was 0.1 μm or more; in FIGS. 28C and 28D, the step between the peripheral portion of the substrate and the center portion thereof was 0.1 μm or less since the remaining insulating film was removed more as in Example 1.

The graphs in FIGS. 28A to 28D showing a relation between the width of a semiconductor substrate and a step indicate that etching first proceeds so as to form a deep hole in the projection in the peripheral portion of the substrate in a direction perpendicular to a planar surface of the substrate during the change from FIG. 28A to FIG. 28B. Then, as shown in FIGS. 28C and 28D, the step in the peripheral portion of the substrate is reduced and the hole is expanded. This indicates that the mixed solution containing buffered hydrofluoric acid, nitric acid, and acetic acid at a volume ratio of 1:7:10 penetrates crystal defects or microvoids which are formed by hydrogen doping in the remaining single crystal silicon layer, and etches the projection from the inside thereof. With this tendency of the wet etching treatment using the mixed solution containing buffered hydrofluoric acid, nitric acid, and acetic acid at a volume ratio of 1:7:10, the projection in the peripheral portion of a semiconductor substrate can be etched in a short time as in the case of using a mixed solution of Example 1 containing hydrofluoric acid, nitric acid, and acetic acid at a volume ratio of 1:3:10.

That is, when a ternary mixed solution of buffered hydrofluoric acid, nitric acid, and acetic acid is used, etching proceeds in a manner similar to that when the ternary mixed solution of Example 1 containing hydrofluoric acid, nitric acid, and acetic acid is used.

As described above, by etching the projection in the peripheral portion of the substrate using the mixed solution containing buffered hydrofluoric acid, nitric acid, and acetic acid at a volume ratio of 1:7:10, as in Example 1, a reprocessing treatment of the semiconductor substrate can be performed in such a manner that the projection having the remaining insulating film, the remaining single crystal silicon layer, and the remaining embrittlement layer in the peripheral portion of the substrate can be reduced in thickness in a short time with a sufficient selectivity between the peripheral portion of the substrate and the center portion thereof.

Example 5

In this example, described is a result of comparison among semiconductor substrates after separation (bond substrates) which are by-produced in manufacture of an SOI substrate and are reprocessed by removing a remaining insulating film and then performing the wet etching treatment using a variety of solutions.

In this example, rectangular single crystal silicon substrates each with a diagonal of 5 inches were used as the semiconductor substrates, and thermal oxide films each with a thickness of 100 nm were formed in a manner similar to that in Example 1.

Next, each of the semiconductor substrates was irradiated with hydrogen ions from a surface of the thermal oxide film by using an ion doping apparatus. Also in this example, by irradiation with ionized hydrogen, an embrittlement layer was formed in each of the semiconductor substrates. The ion doping was performed under conditions similar to those in Example 1.

Then, each of the semiconductor substrates was bonded to a glass substrate with the thermal oxide film interposed therebetween. After that, a heat treatment was performed under conditions similar to those in Example 1, so that at the embrittlement layer, a thin film of a single crystal silicon layer was separated from the semiconductor substrate. Thus, SOI substrates each including the single crystal silicon film over the glass substrate with the thermal oxide film interposed therebetween and semiconductor substrates each provided with a projection in the peripheral portion having the remaining insulating film (i.e., the thermal oxide film), a remaining single crystal silicon layer, and a remaining embrittlement layer were manufactured.

In a manner described above, the semiconductor substrates were prepared each provided with the projection in the peripheral portion having the remaining insulating film (i.e., the thermal oxide film), the remaining single crystal silicon layer, and the remaining embrittlement layer. Then, in a manner similar to that in Example 1, an insulating film (i.e., the thermal oxide film) which was formed to cover each of the semiconductor substrate and the remaining insulating film were removed.

The thus prepared semiconductor substrates from which the remaining insulating films were removed were subjected to the wet etching treatment using solutions in Table 5 as etchants. Samples are ten in total; five samples are for examples, and the other five samples are for comparative examples.

TABLE 5

| Sample | Etchant[1]<br>$HF:HNO_3:CH_3CO_2H$ |
|---|---|
| Example 5A | 1:2:10 |
| Example 5B | 1.5:3:10 |
| Example 5C | 2:2:10 |
| Example 5D | 1:10:20 |
| Example 5E | 1:1:10 |
| Comparative Example 5-1 | 1:1:3 |
| Comparative Example 5-2 | 1:3:1 |
| Comparative Example 5-3 | 3:1:10 |
| Comparative Example 5-4 | 10:1:10 |
| Comparative Example 5-5 | 100:1:100 |

[1]The mixture ratios are all represented in volume ratios.

The etchants prepared and used are the following: a mixed solution containing hydrofluoric acid, nitric acid, and acetic acid at a volume ratio of 1:2:10 (hereinafter referred to as a mixed solution 5A) for Example 5A; a mixed solution containing hydrofluoric acid, nitric acid, and acetic acid at a volume ratio of 1.5:3:10 (hereinafter referred to a mixed solution 5B) for Example 5B; a mixed solution containing hydrofluoric acid, nitric acid, and acetic acid at a volume ratio of 2:2:10 (hereinafter referred to as a mixed solution 5C) for Example 5C; a mixed solution containing hydrofluoric acid, nitric acid, and acetic acid at a volume ratio of 1:10:20 (hereinafter referred to as a mixed solution 5D) for Example 5D; and a mixed solution containing hydrofluoric acid, nitric acid, and acetic acid at a volume ratio of 1:1:10 (hereinafter referred to as a mixed solution 5E) for Example 5E. The following etchants were further prepared and used: a mixed solution containing hydrofluoric acid, nitric acid, and acetic acid at a volume ratio of 1:1:3 (hereinafter referred to as a mixed solution 5-1) for Comparative Example 5-1; a mixed solution containing hydrofluoric acid, nitric acid, and acetic acid at a volume ratio of 1:3:1 (hereinafter referred to a mixed solution 5-2) for Comparative Example 5-2; a mixed solution containing hydrofluoric acid, nitric acid, and acetic acid at a volume ratio of 3:1:10 (hereinafter referred to as a mixed solution 5-3) for Comparative Example 5-3; a mixed solution containing hydrofluoric acid, nitric acid, and acetic acid at a volume ratio of 10:1:10 (hereinafter referred to as a mixed solution 5-4) for Comparative Example 5-4; and a mixed solution containing hydrofluoric acid, nitric acid, and acetic acid at a volume ratio of 100:1:100 (hereinafter referred to as a mixed solution 5-5) for Comparative Example 5-5. Note that the chemical agents used for preparing the mixed solutions in this example are the same as those in Example 1. In etching steps, the etchant temperature was room temperature and the etching time was 30 sec., 1 min., 2 min., 4 min., 6 min., and 8 min.

The ten solutions were used for the wet etching treatment of respective semiconductor substrates for each of the above-described time, and steps formed in the peripheral portions of each of the substrates and amounts of the etched semiconductor substrates in the center portion of the substrates were measured in a manner similar to that in Example 1. For Examples 5A to 5E, the peripheral portions of the substrates were photographed in a manner similar to that in Example 1. Note that in this example, the center portion of the substrate refers to a region other than the peripheral portion of the substrate where the projection is formed.

FIGS. 29A1 and 29A2, FIGS. 29B1 and 29B2, FIGS. 29C1 and 29C2, FIGS. 30A1 and 30A2, FIGS. 30B1 and 30B2, and FIGS. 30C1 and 30C2 show optical micrographs of the peripheral portion of the semiconductor substrate of Example 5A which was etched for 30 sec., 1 min., 2 min., 4 min., 6 min., and 8 min FIGS. 31A1 and 31A2, FIGS. 31B1 and 31B2, FIGS. 31C1 and 31C2, FIGS. 32A1 and 32A2, FIGS. 32B1 and 32B2, and FIGS. 32C1 and 32C2 show optical micrographs of the peripheral portion of the semiconductor substrate of Example 5B which was etched for 30 sec., 1 min., 2 min., 4 min., 6 min., and 8 min FIGS. 33A1 and 33A2, FIGS. 33B1 and 33B2, FIGS. 33C1 and 33C2, FIGS. 34A1 and 34A2, FIGS. 34B1 and 34B2, and FIGS. 34C1 and 34C2 show optical micrographs of the peripheral portion of the semiconductor substrate of Example 5C which was etched for 30 sec., 1 min., 2 min., 4 min., 6 min., and 8 min. FIGS. 35A1 and 35A2, FIGS. 35B1 and 35B2, FIGS. 35C1 and 35C2, FIGS. 36A1 and 36A2, FIGS. 36B1 and 36B2, and FIGS. 36C1 and 36C2 show optical micrographs of the peripheral portion of the semiconductor substrate of Example 5D which was etched for 30 sec., 1 min., 2 min., 4 min., 6 min., and 8 min FIGS. 37A1 and 37A2, FIGS. 37B1 and 37B2, FIGS. 37C1 and 37C2, FIGS. 38A1 and 38A2, FIGS. 38B1 and 38B2, and FIGS. 38C1 and 38C2 show optical micrographs of the peripheral portion of the semiconductor substrate of Example 5E which was etched for 30 sec., 1 min., 2 min., 4 min., 6 min., and 8 min FIGS. 29A1, 29B1, and 29C1, FIGS. 30A1, 30B1, and 30C1, FIGS. 31A1, 31B1, and 31C1, FIGS. 32A1, 32B1, and 32C1, FIGS. 33A1, 33B1, and 33C1, FIGS. 34A1, 34B1, and 34C1, FIGS. 35A1, 35B1, and 35C1, FIGS. 36A1, 36B1, and 36C1, FIGS. 37A1, 37B1, and 37C1, and FIGS. 38A1, 38B1, and 38C1 are optical micrographs at 50-fold magnification, and FIGS. 29A2, 29B2, and 29C2, FIGS. 30A2, 30B2, and 30C2, FIGS. 31A2, 31B2, and 31C2, FIGS. 32A2, 32B2, and 32C2, FIGS. 33A2, 33B2, and 33C2, FIGS. 34A2, 34B2, and 34C2, FIGS. 35A2, 35B2, and 35C2, FIGS. 36A2, 36B2, and 36C2, FIGS. 37A2, 37B2, and 37C2, and FIGS. 38A2, 38B2, and 38C2 are optical micrographs at 500-fold magnification.

Figure 39A:
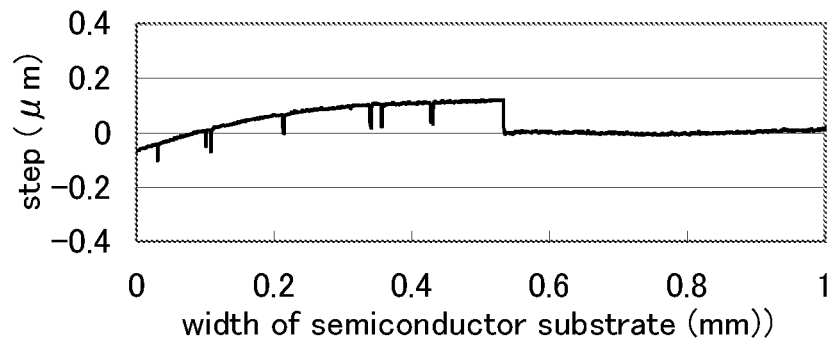
FIGS. 39A to 39C are graphs showing a relation between the width and the step of the semiconductor substrate in Example 5A.
Figure 39B:
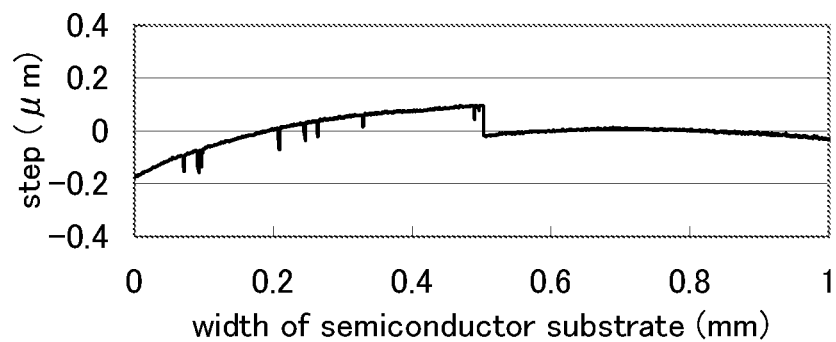
Figure 39C:
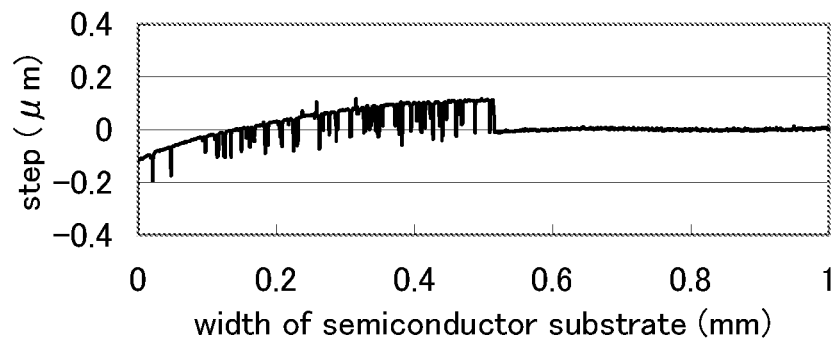
Figure 40A:
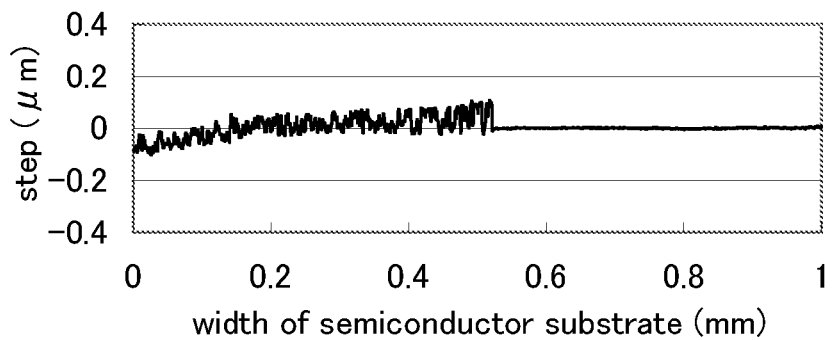
FIGS. 40A to 40C are the graphs showing a relation between the width and the step of the semiconductor substrate in Example 5A.
Figure 40B:
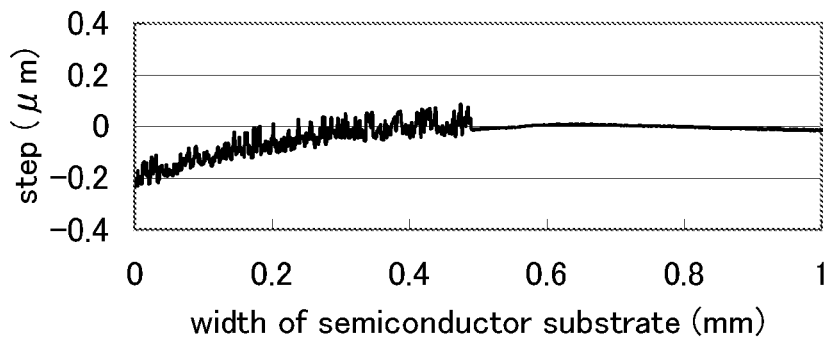
Figure 40C:
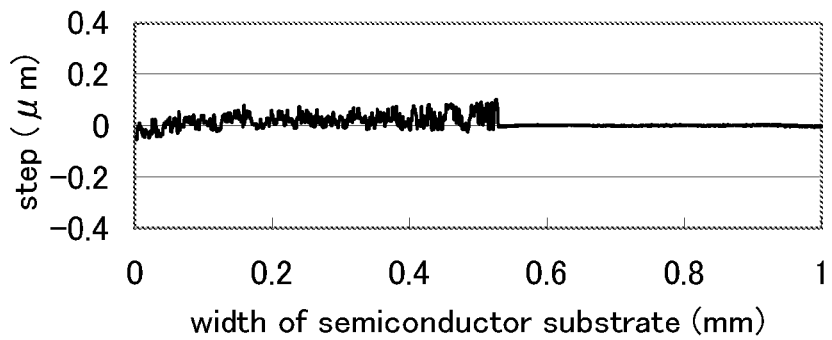
Figure 41A:
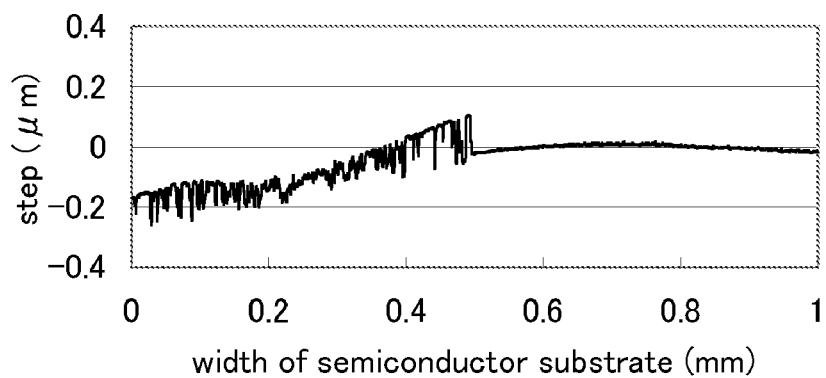
FIGS. 41A to 41C are graphs showing a relation between the width and the step of the semiconductor substrate in Example 5B.
Figure 41B:
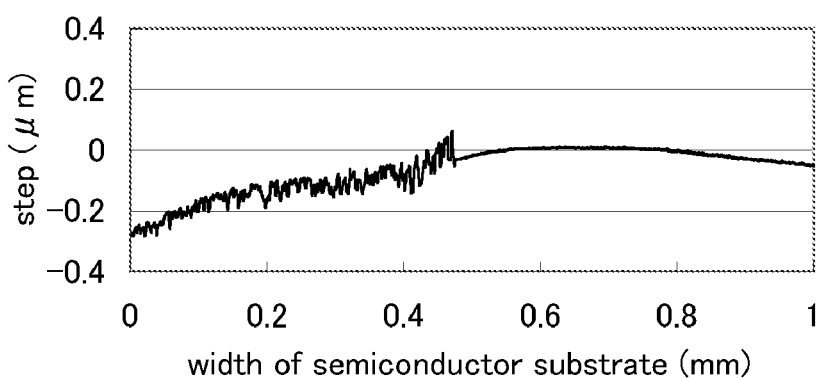
Figure 41C:
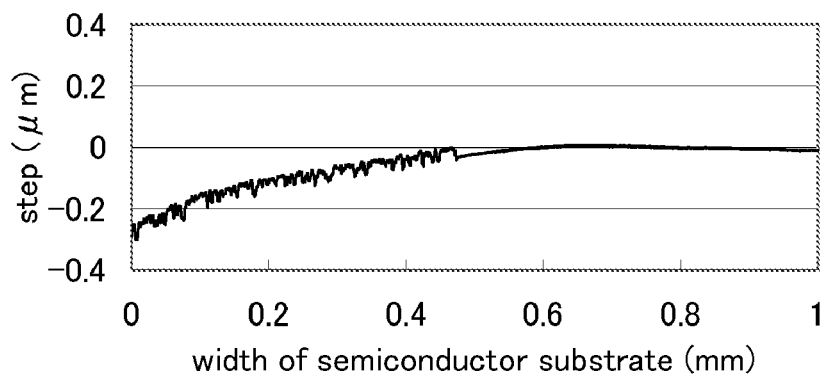
Figure 42A:
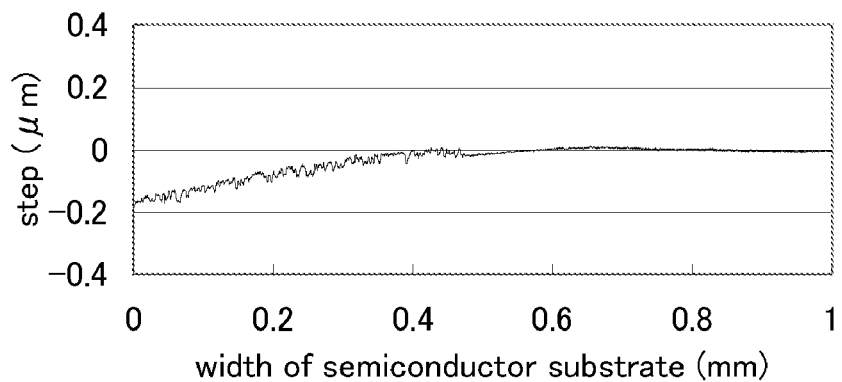
FIGS. 42A to 42C are the graphs showing a relation between the width and the step of the semiconductor substrate in Example 5B.
Figure 42B:
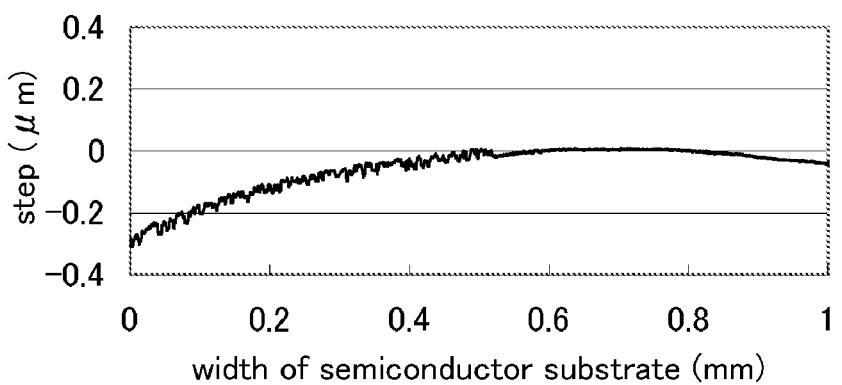
Figure 42C:
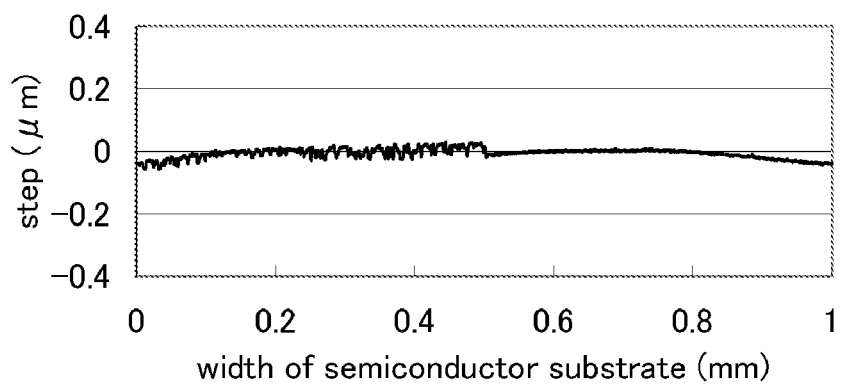
Figure 43A:
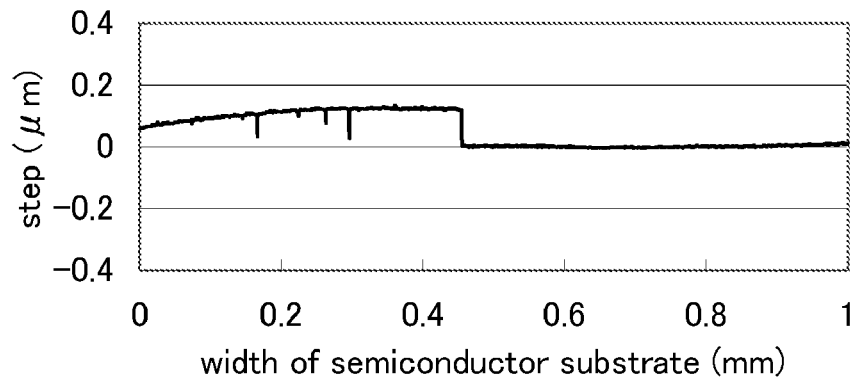
FIGS. 43A to 43C are graphs showing a relation between the width and the step of the semiconductor substrate in Example 5C.
Figure 43B:
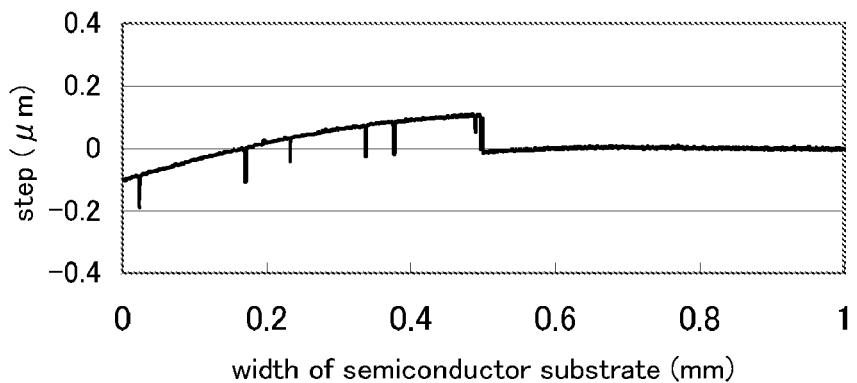
Figure 43C:
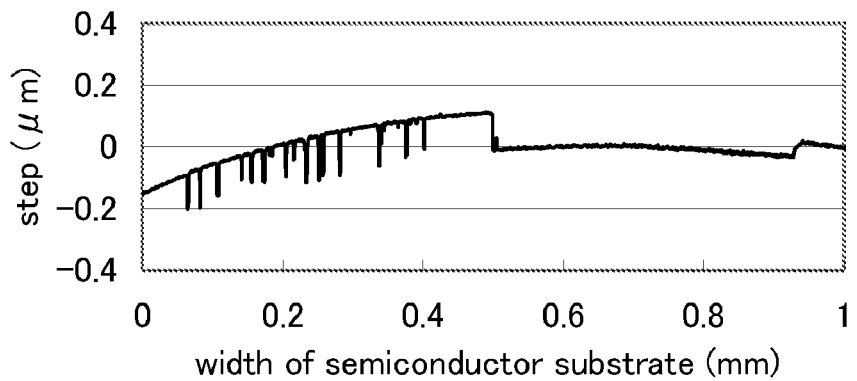
Figure 44A:
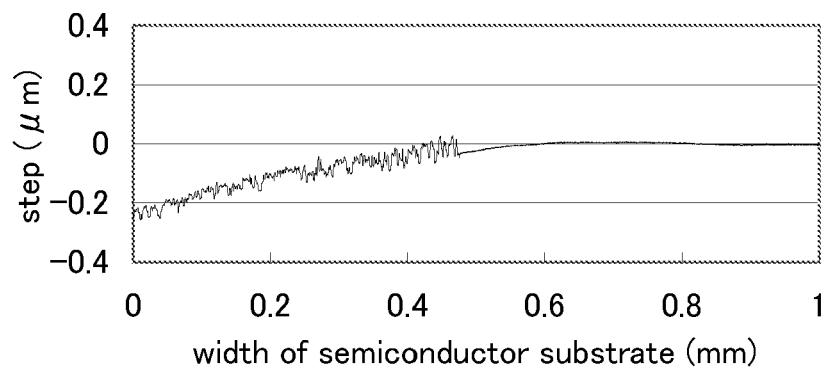
FIGS. 44A to 44C are the graphs showing a relation between the width and the step of the semiconductor substrate in Example 5C.
Figure 44B:
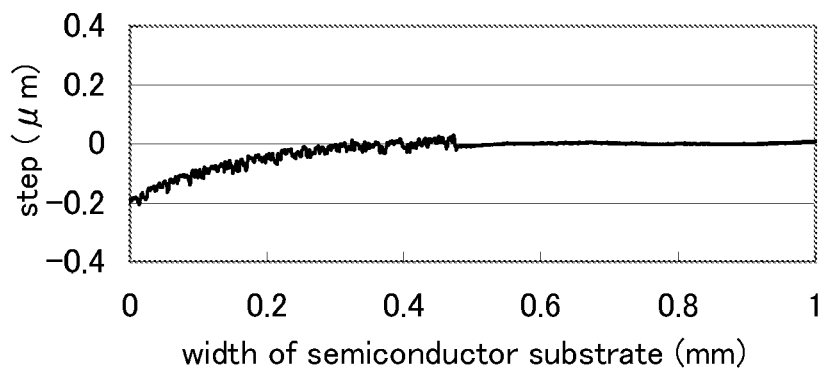
Figure 44C:
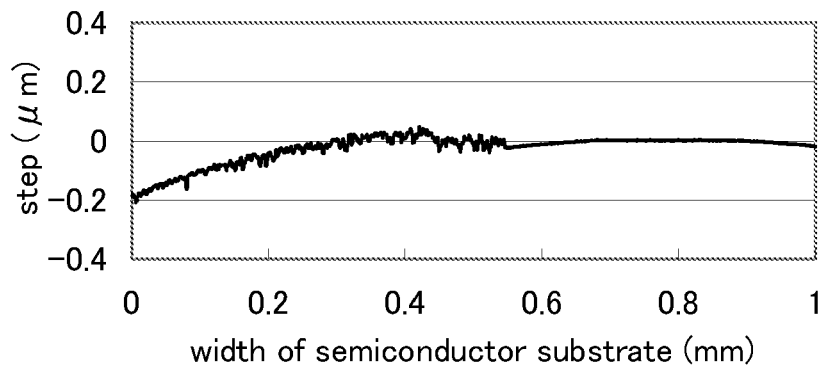
Figure 45A:
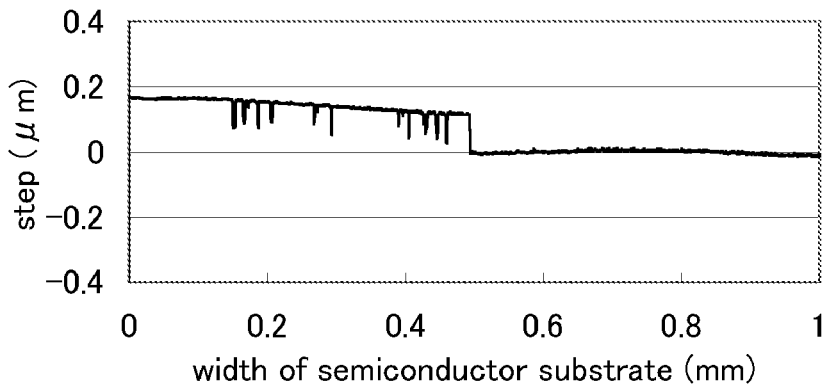
FIGS. 45A to 45C are graphs showing a relation between the width and the step of the semiconductor substrate in Example 5D.
Figure 45B:
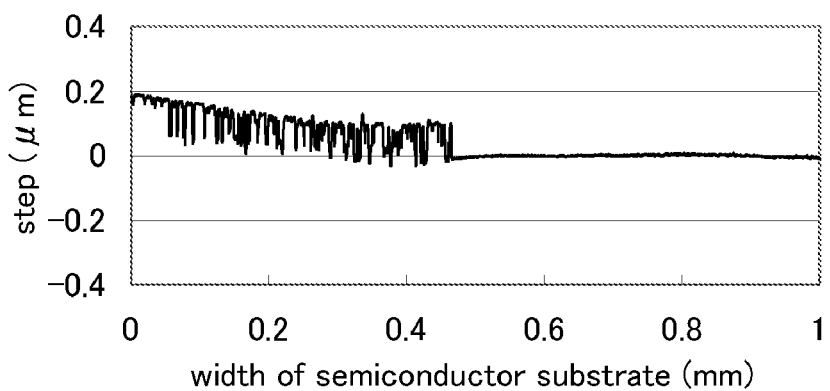
Figure 45C:
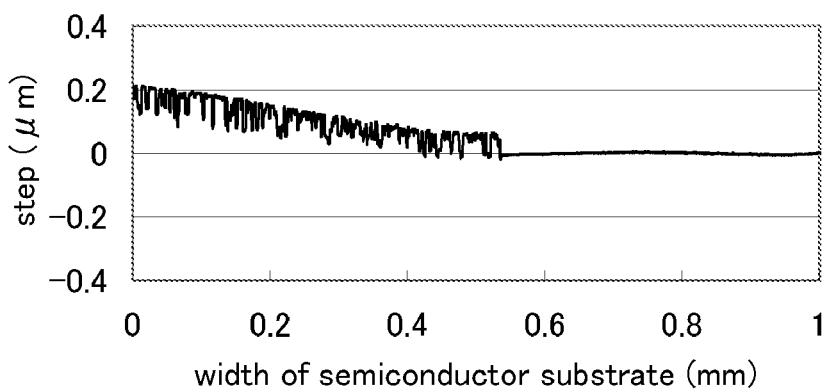
Figure 46A:
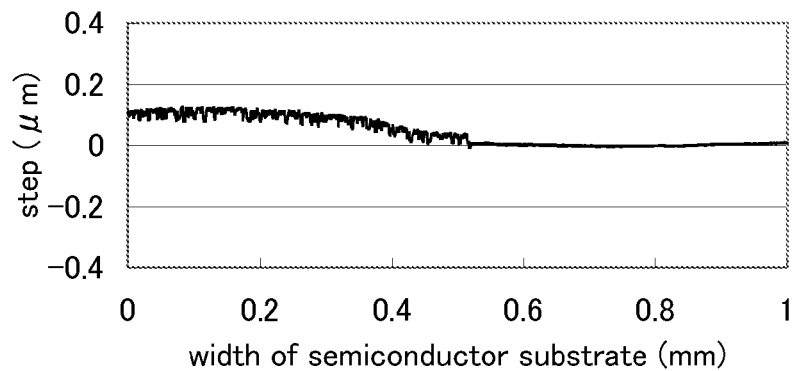
FIGS. 46A to 46C are the graphs showing a relation between the width and the step of the semiconductor substrate in Example 5D.
Figure 46B:
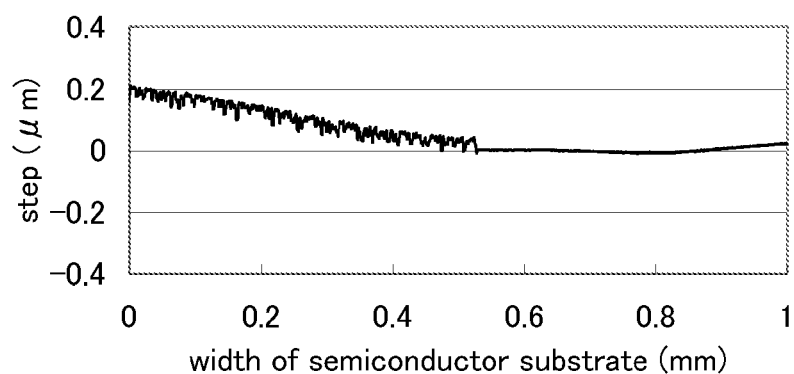
Figure 46C:
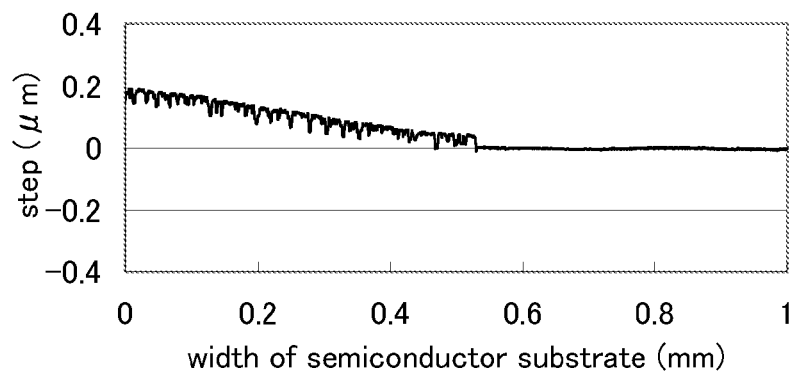
Figure 47A:
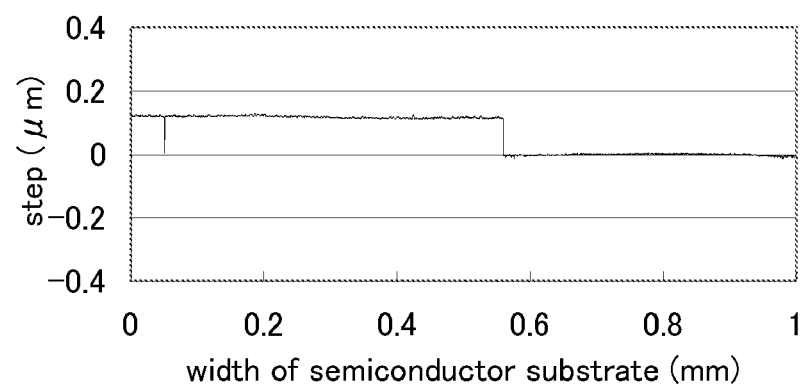
FIGS. 47A to 47C are graphs showing a relation between the width and the step of the semiconductor substrate in Example 5E.
Figure 47B:
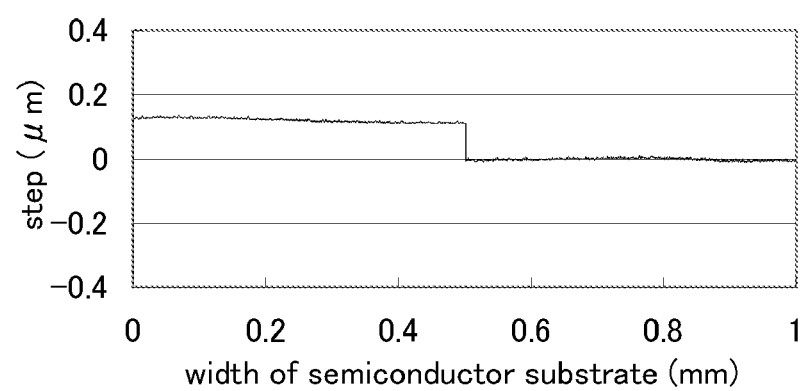
Figure 47C:
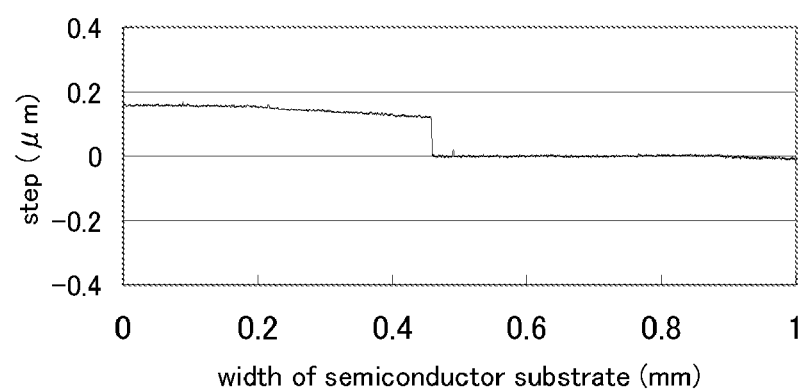
Figure 48A:
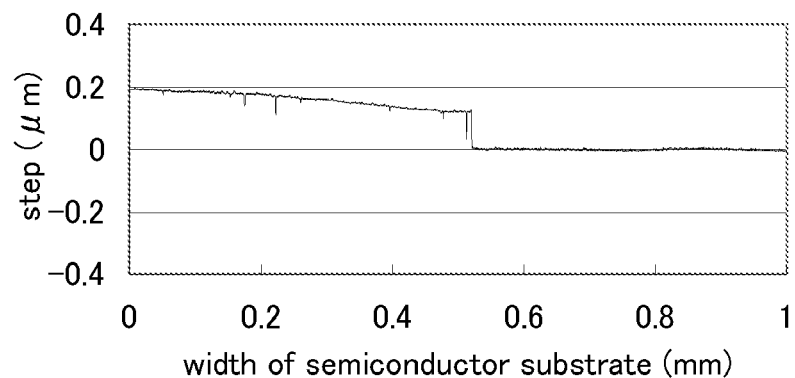
FIGS. 48A to 48C are the graphs showing a relation between the width and the step of the semiconductor substrate in Example 5E.
Figure 48B:
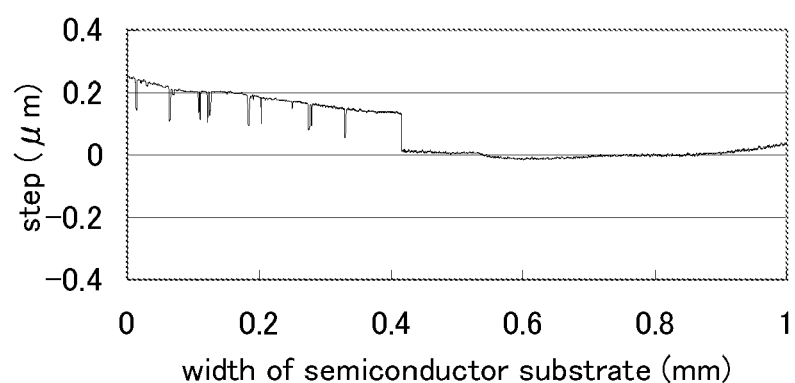
Figure 48C:
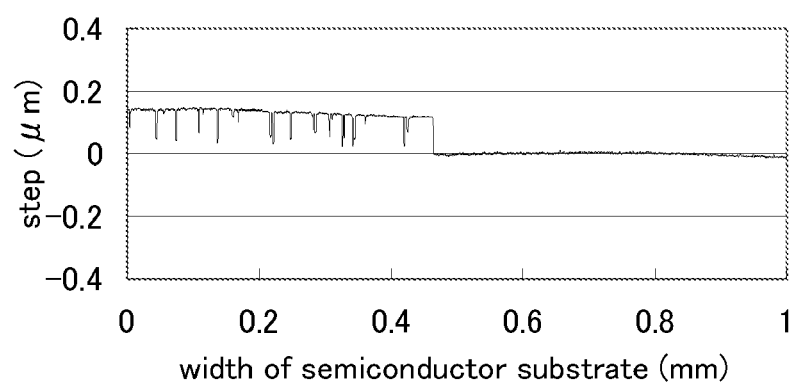

FIGS. 39A to 39C show step measurement results of the peripheral portion of the substrate, corresponding to FIGS. 29A1 and 29A2, 29B1 and 29B2, and 29C1 and 29C2, respectively; and FIGS. 40A to 40C show step measurement results of the peripheral portion of the substrate, corresponding to FIGS. 30A1 and 30A2, 30B1 and 30B2, and 30C1 and 30C2, respectively. That is, FIGS. 39A to 39C and FIGS. 40A to 40C show step measurement results of peripheral portion of the substrates, respectively corresponding to the optical micrographs of the peripheral portion of the substrate of Example 5A which was etched for 30 sec., 1 min., 2 min., 4 min., 6 min., and 8 min. Similarly, FIGS. 41A to 41C and FIGS. 42A to 42C show step measurement results of peripheral portions of the substrates, respectively corresponding to the optical micrographs of the peripheral portion of the substrate of Example 5B which was etched for 30 sec., 1 min., 2 min., 4 min., 6 min., and 8 min FIGS. 43A to 43C and FIGS. 44A to 44C show step measurement results of peripheral portions of the substrates, respectively corresponding to the optical micrographs of the peripheral portion of the substrate of Example 5C which was etched for 30 sec., 1 min., 2 min., 4 min., 6 min., and 8 min FIGS. 45A to 45C and FIGS. 46A to 46C show step measurement results of peripheral portions of the substrates, respectively corresponding to the optical micrographs of the peripheral portion of the substrate of Example 5D which was etched for 30 sec., 1 min., 2 min., 4 min., 6 min., and 8 min FIGS. 47A to 47C and FIGS. 48A to 48C show step measurement results of peripheral portions of the substrates, respectively corresponding to the optical micrographs of the peripheral portion of the substrate of Example 5E which was etched for 30 sec., 1 min., 2 min., 4 min., 6 min., and 8 min.

FIGS. 49A to 49E show measurement results of etching amounts of semiconductor substrates in the center portions of the substrates which were removed by the wet etching treatment in Examples 5A to 5E. FIGS. 49A, 49B, 49C, 49D, and 49E respectively show measurement results of Example 5A, Example 5B, Example 5C, Example 5D, and Example 5E. The vertical axis in FIGS. 49A to 49E represents an etching amount (µm) of the semiconductor substrate in the center portion of the semiconductor substrate and the horizontal axis represents etching time (min.) thereof. For the measurement of the etching amount of the semiconductor substrates in the center portions of the substrates, calculation was performed similarly to Example 1. The thickness of the semiconductor substrates was estimated also similarly to Example 1. The measurement region and measurement points were also similar to those in Example 1, and the etching amount of the semiconductor substrate in the center portion of the substrate was obtained using the average values.

As seen in the optical micrographs in FIGS. 29A1, 29A2, 29B1, 29B2, 29C1, and 29C2 and FIGS. 30A1, 30A2, 30B1, 30B2, 30C1, and 30C2, steps in the left side of the photographs which were formed of the remaining single crystal silicon layer having defects or the like were reduced as etching time increased. From the optical micrographs in FIGS. 29A1, 29A2, 29B1, 29B2, 29C1, and 29C2 and FIGS. 30A1, 30A2, 30B1, 30B2, 30C1, and 30C2 and graphs showing the step measurement in FIGS. 39A to 39C and FIGS. 40A to 40C, the steps were almost removed at the etching time of 6 min. In addition, the etching first proceeded to form a deep hole in the projection in the peripheral portion of the substrate in a direction perpendicular to a planar surface of the substrate and then the step was reduced and the hole was expanded. This indicates that the mixed solution 5A penetrates crystal defects or microvoids which are formed by hydrogen doping in a remaining single crystal silicon layer, and it etches the projection from the inside thereof. This wet etching treatment in Example 5A has a tendency similar to that of the wet etching treatment in Example 1.

Figure 49A:
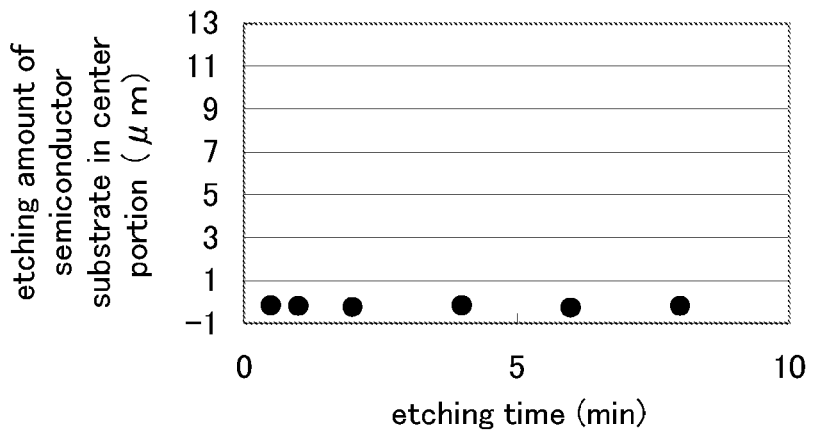
FIGS. 49A to 49E show a relation between time for etching treatment and an amount etched in Examples 5A to 5E, respectively.

From the graph in FIG. 49A showing etching amounts of the semiconductor substrate in the center portion of the substrate in Example 5A, it can be concluded that the etching amounts of the semiconductor substrate in the etching time of this example are within the range of errors of measurement of the thickness of the semiconductor substrate, and therefore the etching hardly proceeds. Thus, by using the mixed solution 5A as an etchant, the projection in the peripheral portion of a semiconductor substrate was selectively etched in a short time.

As seen in the optical micrographs in FIGS. 31A1, 31A2, 31B1, 31B2, 31C1, and 31C2 and FIGS. 32A1, 32A2, 32B1, 32B2, 32C1, and 32C2 of Example 5B, steps in the left side of the photographs which were formed of the remaining single crystal silicon layer having defects or the like were reduced as etching time increased. From the optical micrographs in FIGS. 31A1, 31A2, 31B1, 31B2, 31C1, and 31C2 and FIGS. 32A1, 32A2, 32B1, 32B2, 32C1, and 32C2 and graphs showing the step measurement in FIGS. 41A to 41C and FIGS. 42A to 42C, it can be concluded that the steps were almost removed at the etching time of 2 min. Further, this wet etching using the mixed solution 5B has a tendency similar to that of wet etching using the mixed solution 5A.

Figure 49B:
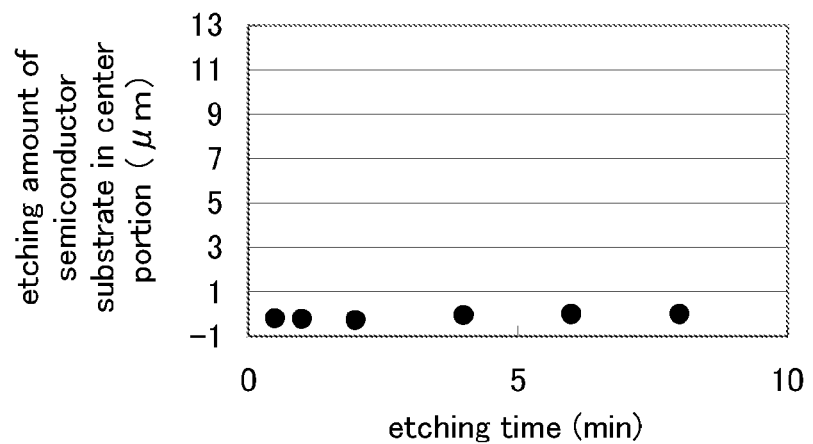

From the graph in FIG. 49B showing etching amounts of a semiconductor substrate in the center portion of the substrate in Example 5B, it is revealed that the etching amounts of the semiconductor substrate in the etching time of this example are within the range of errors of measurement of the thickness of the semiconductor substrate, and therefore the etching hardly proceeds. Thus, by using the mixed solution 5B as an etchant, the projection in the peripheral portion of a semiconductor substrate was selectively etched in a short time.

As seen in the optical micrographs in FIGS. 33A1, 33A2, 33B1, 33B2, 33C1, and 33C2 and FIGS. 34A1, 34A2, 34B1, 34B2, 34C1, and 34C2, steps in the left side of the photographs which were formed of the remaining single crystal silicon layer having defects or the like were reduced as etching time increased. From the optical micrographs in FIGS. 33A1, 33A2, 33B1, 33B2, 33C1, and 33C2 and FIGS. 34A1, 34A2, 34B1, 34B2, 34C1, and 34C2 and graphs showing the step measurement in FIGS. 43A to 43C and FIGS. 44A to 44C, it was found that the steps were almost removed at the etching time of 4 min. Further, this wet etching using the mixed solution 5C has a tendency similar to that of wet etching using the mixed solutions 5A and 5B.

Figure 49C:
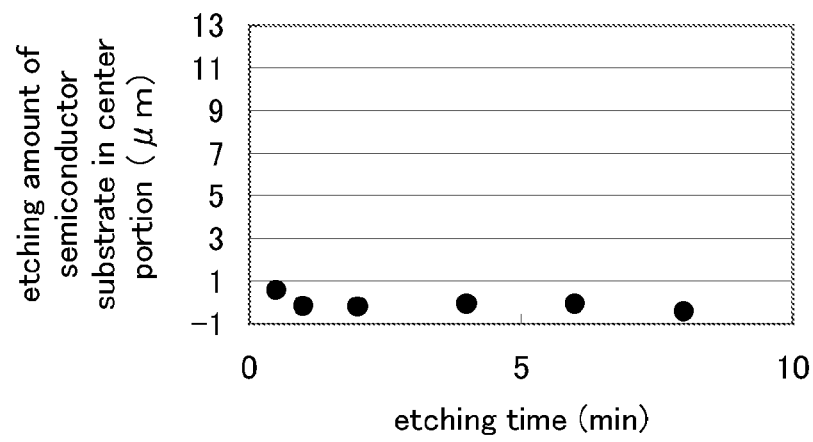

From the graph in FIG. 49C showing etching amounts of a semiconductor substrate in the center portion of the substrate in Example 5C, it can be concluded that the etching amounts of the semiconductor substrate in the etching time of this example are within the range of errors of measurement of the thickness of the semiconductor substrate, and therefore the etching hardly proceeds. Thus, by using the mixed solution 5C as an etchant, the projection in the peripheral portion of a semiconductor substrate was selectively etched in a short time.

As seen in the optical micrographs in FIGS. 35A1, 35A2, 35B1, 35B2, 35C1, and 35C2 and FIGS. 36A1, 36A2, 36B1, 36B2, 36C1, and 36C2, steps in the left side of the photographs which were formed of the remaining single crystal silicon layer having defects or the like were reduced as etching time increased. From the optical micrographs in FIGS. 35A1, 35A2, 35B1, 35B2, 35C1, and 35C2 and FIGS. 36A1, 36A2, 36B1, 36B2, 36C1, and 36C2 and graphs showing the step measurement in FIGS. 45A to 45C and FIGS. 46A to 46C, it was found that the steps were almost removed at the etching time of 4 min. Further, this wet etching using the mixed solution 5C has a tendency similar to that of wet etching using the mixed solutions 5A and 5B.

Figure 49D:
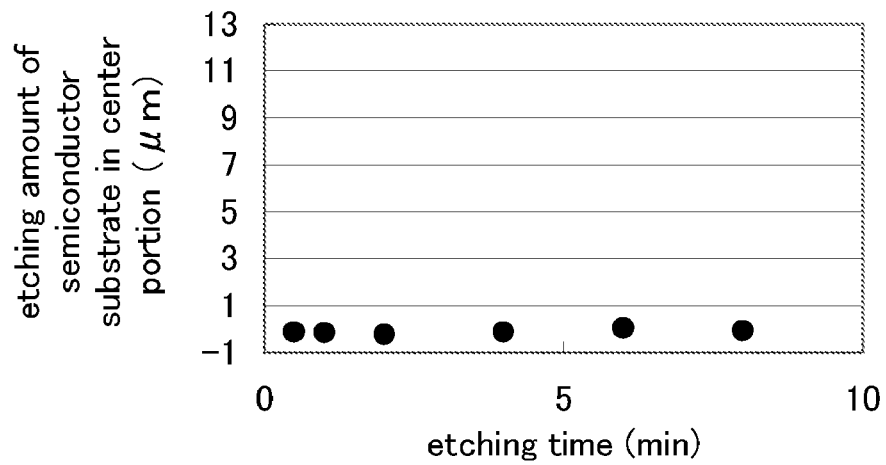

From the graph in FIG. 49D showing etching amounts of a semiconductor substrate in the center portion of the substrate in Example 5D, it can be concluded that the etching amounts of the semiconductor substrate in the etching time of this example are within the range of errors of measurement of the thickness of the semiconductor substrate, and therefore the etching hardly proceeds. Thus, by using the mixed solution 5D as an etchant, the projection in the peripheral portion of a semiconductor substrate was selectively etched in a short time.

As seen in the optical micrographs in FIGS. 37A1, 37A2, 37B1, 37B2, 37C1, 37C2 and FIGS. 38A1, 38A2, 38B1, 38B2, 38C1, and 38C2, and the graphs showing step measurements in FIGS. 47A to 47C and FIGS. 48A to 48C, it was found that steps in the peripheral portion of the substrate began to be etched when the etching time reached 6 min similarly to Example 5A. Thus, when the etching time is increased more than that in this example, the steps in the peripheral portion of the substrate can be reduced. Although the etching requires longer time, the wet etching using the mixed solution 5E has a tendency similar to those of wet etching using the mixed solutions 5A to 5D.

Figure 49E:
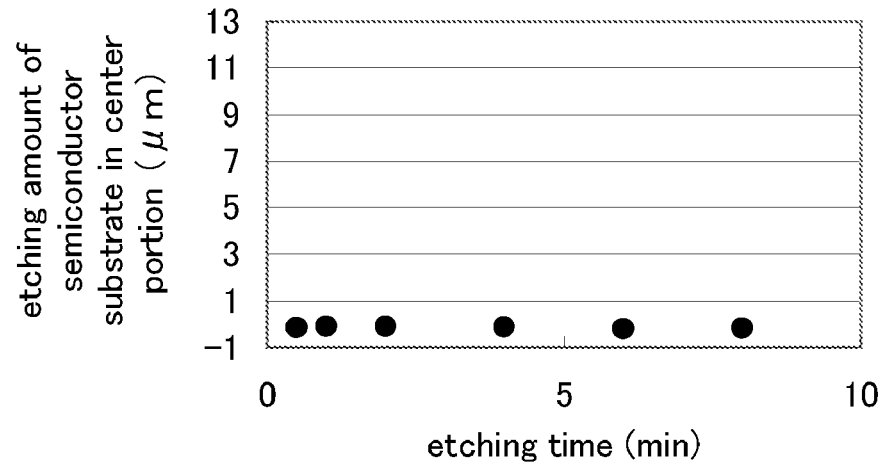

From the graph in FIG. 49E showing etching amounts of a semiconductor substrate in the center portion of the substrate in Example 5E, it can be concluded that the etching amounts of the semiconductor substrate in the etching time of this example are within the range of errors of measurement of the thickness of the semiconductor substrates, and therefore the etching hardly proceeds. Thus, by using the mixed solution 5E as an etchant, the projection in the peripheral portion of a semiconductor substrate was selectively etched in a short time.

In addition, in Comparative Example 5-1, Comparative Example 5-2, Comparative Example 5-3, and Comparative Example 5-4, etching proceeded in both the projection in the peripheral portion of the substrate and the center portion thereof, and selective etching was not performed. In Comparative Example 5-5, etching hardly proceeded in both the projection in the peripheral portion of the substrate and the center portion thereof.

Note that each of the mixed solutions 5A to 5E and the mixed solutions 5-1 to 5-5 in this example is a ternary mixed solution containing hydrofluoric acid, nitric acid, and acetic acid, and each of the elements serves as described in Example 1. Results of differences between the ratios of these elements are similar to those described in Example 1. That is, in the case where the amount of nitric acid is small, oxidation of silicon by nitric acid is a rate-controlling step of the wet etching. In the case where the amount of hydrofluoric acid is small, dissolution of silicon oxide by hydrofluoric acid is a rate-controlling step of the wet etching. In the case where the amount of acetic acid is small, an effect of acetic acid as a decelerator cannot be obtained, so that the entire substrate is evenly etched.

Table 6 shows results of Example 1, Comparative Examples 1A to 1C, Examples 5A to 5E, and Comparative Examples 5-1 to 5-5 described above. A circle in cells of Table 1 means that the projection in the peripheral portion of the substrate can be etched in a short time with a sufficient selectivity between the peripheral portion of the substrate and the center portion thereof. A triangle means that the projection in the peripheral portion of the substrate can be selectively etched in a longer time. A cross means that the projection in the peripheral portion of the substrate cannot be selectively etched, or that neither the projection in the peripheral portion of the substrate nor the center portion thereof is etched.

TABLE 6

| Sample | Etchant[1] | | | Result |
| --- | --- | --- | --- | --- |
| | HF | $HNO_3$ | $CH_3CO_2H$ | |
| Example 1 | 1 | 3 | 10 | ○ |
| Example 5A | 1 | 2 | 10 | ○ |
| Example 5B | 1.5 | 3 | 10 | ○ |
| Example 5C | 2 | 2 | 10 | ○ |
| Example 5D | 1 | 10 | 20 | ○ |
| Example 5E | 1 | 1 | 10 | △ |
| Comparative Example 1A | 1 | 100 | 100 | x |
| Comparative Example 1B | 1 | 0.1 | 10 | x |
| Comparative Example 1C | 1 | 10 | 10 | x |
| Comparative Example 5-1 | 1 | 1 | 3 | x |
| Comparative Example 5-2 | 1 | 3 | 1 | x |
| Comparative Example 5-3 | 3 | 1 | 10 | x |
| Comparative Example 5-4 | 10 | 1 | 10 | x |
| Comparative Example 5-5 | 100 | 1 | 100 | x |

[1]The mixture ratios are all represented in volume ratios.

As will be noted from Table 6, it is preferable to use as the etchant a mixed solution having a composition which is obtained by adjusting the volume of 70 wt % nitric acid to more than or equal to 0.01 and less than 1 times as large as that of 97.7 wt % acetic acid and more than or equal to 0.1 and less than 100 times as large as that of 50 wt % hydrofluoric acid and further adjusting the volume of 50 wt % hydrofluoric acid to more than or equal to 0.01 and less than 0.3 times as large as that of 97.7 wt % acetic acid. It is more preferable that the etchant possesses a composition obtained by adjusting the volume of 70 wt % nitric acid to more than or equal to 0.2 and less than or equal to 0.5 times as large as that of 97.7 wt % acetic acid and to more than or equal to 1 and less than or equal to 10 times as large as that of 50 wt % hydrofluoric acid and further adjusting the volume of 50 wt % hydrofluoric acid to more than or equal to 0.1 and less than or equal to 0.3 times as large as that of 97.7 wt % acetic acid. For example, a preferable volume ratio between 50 wt % hydrofluoric acid, 70 wt % nitric acid, and 97.7 wt % acetic acid is 1:3:10, 1:2:10, 1.5:3:10, 2:2:10, 1:10:20, or 1:1:10.

Thus, by conducting the etching having high selectivity between the peripheral portion of the substrate and the center portion thereof as shown in Example 1 and Examples 5A to 5E, a reprocessing treatment of the semiconductor substrate can be performed in such a manner that a projection having the remaining insulating film, the remaining single crystal silicon layer, and the remaining embrittlement layer in the peripheral portion of the substrate can be removed in a short time with a sufficient selectivity between the peripheral portion of the substrate and the center portion thereof.

This application is based on Japanese Patent Application serial no. 2009-149409 filed with Japan Patent Office on Jun. 24, 2009, the entire contents of which are hereby incorporated by reference.

What is claimed is:

1. A method for manufacturing a single crystal semiconductor film, the method comprising:
   oxidizing a surface of a single crystal semiconductor substrate to form an insulating film over the single crystal semiconductor substrate;
   irradiating the single crystal semiconductor substrate with ion beam through the insulating film;
   bonding the single crystal semiconductor substrate with a base substrate having an insulating surface;
   separating the single crystal semiconductor substrate from the base substrate to allow a thin film of the single crystal semiconductor substrate and the insulating film to be left on the base substrate;
   performing a first etching treatment on a remaining single crystal semiconductor substrate, which is separated from the base substrate in the separation step, with a first etchant containing hydrofluoric acid, ammonium fluoride, and a surfactant; and then
   performing a second etching treatment on the remaining single crystal semiconductor substrate with a second etchant containing hydrofluoric acid, nitric acid, and acetic acid.

2. The method according to claim 1,
   wherein the second etchant has a composition which is obtained by adjusting a volume of 70 wt % nitric acid to more than or equal to 0.2 times and less than or equal to 0.5 times as large as a volume of 97.7 wt % acetic acid and to more than or equal to one time and less than or equal to 10 times as large as a volume of 50 wt % hydrofluoric acid and further adjusting the volume of 50 wt % hydrofluoric acid to more than or equal to 0.1 times and less than or equal to 0.2 times as large as the volume of 97.7 wt % acetic acid.

3. The method according to claim 1,
   wherein the insulating film contains a halogen element.

4. The method according to claim 1,
   wherein the insulating film contains chlorine.

5. The method according to claim 1,
   wherein the bonding of the single crystal semiconductor substrate with the base substrate is performed at a pressure lower than an atmospheric pressure.

6. The method according to claim 1, further comprising a step of polishing the remaining single crystal semiconductor substrate after the second etching treatment.

7. The method according to claim 1, wherein the base substrate is a glass substrate.

8. A method for manufacturing a single crystal semiconductor film, the method comprising:
   oxidizing a surface of a single crystal semiconductor substrate to form an insulating film over the single crystal semiconductor substrate;
   irradiating the single crystal semiconductor substrate with ion beam through the insulating film;
   bonding the single crystal semiconductor substrate with a base substrate having an insulating surface;
   separating the single crystal semiconductor substrate from the base substrate to allow a thin film of the single crystal semiconductor substrate and the insulating film to be left on the base substrate;
   performing a first etching treatment on a remaining single crystal semiconductor substrate, which is separated from the base substrate in the separation step, with a first etchant containing hydrofluoric acid, ammonium fluoride, and a surfactant; and then
   performing a second etching treatment on the remaining single crystal semiconductor substrate with a second etchant which is prepared by mixing the first etchant, nitric acid, and acetic acid.

9. The method according to claim 8,
   wherein the second etchant has a composition which is obtained by adjusting a volume of 70 wt % nitric acid to more than or equal to 0.2 times and less than or equal to 0.5 times as large as a volume of 97.7 wt % acetic acid and to more than or equal to one time and less than or equal to 10 times as large as a volume of 50 wt % hydrofluoric acid and further adjusting the volume of 50 wt % hydrofluoric acid to more than or equal to 0.1 times and less than or equal to 0.2 times as large as the volume of 97.7 wt % acetic acid.

10. The method according to claim 8,
    wherein the insulating film contains a halogen element.

11. The method according to claim 8,
    wherein the insulating film contains chlorine.

12. The method according to claim 8,
    wherein the bonding of the single crystal semiconductor substrate with the base substrate is performed at a pressure lower than an atmospheric pressure.

13. The method according to claim 8, further comprising a step of polishing the remaining single crystal semiconductor substrate after the second etching treatment.

14. The method according to claim 8, wherein the base substrate is a glass substrate.

* * * * *